US009847805B2

(12) United States Patent
Sirichai

(10) Patent No.: US 9,847,805 B2
(45) Date of Patent: Dec. 19, 2017

(54) CRADLE-CASE COMBINATION WITH MAGNETIC FASTENER FEATURE

(71) Applicant: Saharut Sirichai, Bangkok (TH)

(72) Inventor: Saharut Sirichai, Bangkok (TH)

(73) Assignee: World Richman Manufacturing Corporation, Elgin, IL (US)

( * ) Notice: Subject to any disclaimer, the term of this patent is extended or adjusted under 35 U.S.C. 154(b) by 41 days.

(21) Appl. No.: 14/830,470

(22) Filed: Aug. 19, 2015

(65) Prior Publication Data

US 2016/0051019 A1 Feb. 25, 2016

Related U.S. Application Data

(60) Provisional application No. 62/039,162, filed on Aug. 19, 2014, provisional application No. 62/039,145, filed on Aug. 19, 2014.

(51) Int. Cl.
*A45C 11/00* (2006.01)
*A45C 13/00* (2006.01)
(Continued)

(52) U.S. Cl.
CPC ............ *H04B 1/3888* (2013.01); *A45C 11/00* (2013.01); *G06F 1/182* (2013.01); *H01F 7/0242* (2013.01); *H01F 7/0252* (2013.01); *H05K 5/0017* (2013.01); *H05K 5/0221* (2013.01); *H05K 5/03* (2013.01); *A45C 2011/002* (2013.01); *A45C 2011/003* (2013.01)

(58) Field of Classification Search
CPC ..... H01F 7/0242; H01F 7/0268; A45C 11/00; A45C 2011/003; A45C 2200/15; A45C 2011/002; A45C 13/1069; G06F 1/1626; G06F 1/1613; H04B 1/3888; H04B 1/3877
USPC ...... 320/107; 206/320, 45.24, 756; 248/458; 174/50; 335/219; 361/679.01, 679.55, 361/679.56
See application file for complete search history.

(56) References Cited

U.S. PATENT DOCUMENTS 3,808,577 A * 4/1974 Mathauser ......... H01R 13/6205
439/180
4,616,796 A * 10/1986 Inoue ................... B23Q 3/1546
248/206.5
(Continued)

*Primary Examiner* — J. Gregory Pickett
*Assistant Examiner* — Gideon Weinerth
(74) *Attorney, Agent, or Firm* — Christopher J. Scott

(57) ABSTRACT

A cradle-case combination enables its user to selectively display and or encase an electronic device, and together includes a cradle construction and a case construction. The cradle construction is sized and shaped to removably cradle a select or particular electronic device. The cradle construction has an anterior device-receiving cradle portion and a posterior cradle-to-case interface portion. The cradle-to-case interface portion includes a magnetically attractive first material. The case construction has anterior and posterior case portions, and at least the posterior case portion has a magnetically attractive second material. The first and second magnetically attractive materials enable the user to magnetically fasten the cradle to the case. The anterior case portion is pivotal relative to the posterior case portion for selectively accessing the device-receiving cradle portion in an open case configuration and/or covering the device-receiving cradle portion in a closed case configuration.

17 Claims, 46 Drawing Sheets

(51) Int. Cl.
*A45C 13/10* (2006.01)
*H05K 5/02* (2006.01)
*H04B 1/3888* (2015.01)
*H01F 7/02* (2006.01)
*G06F 1/18* (2006.01)
*H05K 5/00* (2006.01)
*H05K 5/03* (2006.01)

(56) References Cited

U.S. PATENT DOCUMENTS

| | | | | |
|---|---|---|---|---|
| 5,708,561 | A * | 1/1998 | Huilgol | G06F 1/1616 361/679.07 |
| 6,831,541 | B1 * | 12/2004 | Seidler | A45D 33/006 206/818 |
| 7,281,698 | B2 * | 10/2007 | Patterson, Jr. | A45C 11/00 206/756 |
| 7,582,828 | B2 * | 9/2009 | Ryan | H05K 5/0204 174/481 |
| 8,143,982 | B1 * | 3/2012 | Lauder | G06F 1/1626 206/320 |
| 8,474,609 | B1 * | 7/2013 | Hong | A45C 11/00 206/320 |
| 8,665,044 | B2 | 3/2014 | Lauder et al. | |
| 8,665,045 | B2 | 3/2014 | Lauder et al. | |
| 8,672,126 | B2 | 3/2014 | Rohrbach et al. | |
| 8,800,763 | B2 * | 8/2014 | Hale | F16M 11/041 206/320 |
| 9,153,152 | B1 * | 10/2015 | Elmer | H01F 7/0221 |
| D744,489 | S * | 12/2015 | Sirichai | D14/440 |
| 9,225,377 | B1 * | 12/2015 | Hart | H04B 1/3877 |
| 9,310,835 | B2 * | 4/2016 | Bryan | A45C 13/1069 |
| 9,397,719 | B1 * | 7/2016 | Schmidt | F16M 11/24 |
| 9,799,436 | B2 * | 10/2017 | Lee | H01F 7/021 |
| 2006/0086873 | A1 * | 4/2006 | Chen | B60R 11/02 248/206.5 |
| 2006/0187696 | A1 | 8/2006 | Lanni | |
| 2008/0002369 | A1 | 1/2008 | Carnevali | |
| 2008/0303618 | A1 * | 12/2008 | Prest | G06F 1/1616 335/229 |
| 2011/0261509 | A1 | 10/2011 | Xu et al. | |
| 2011/0265289 | A1 * | 11/2011 | Wu | A45C 13/1069 24/303 |
| 2012/0018324 | A1 * | 1/2012 | Hale | F16M 11/041 206/320 |
| 2012/0037673 | A1 * | 2/2012 | Chen | A45C 11/00 224/191 |
| 2012/0075789 | A1 | 3/2012 | DeCamp et al. | |
| 2013/0075280 | A1 * | 3/2013 | Besner | G06F 1/1626 206/45.23 |
| 2013/0097817 | A1 * | 4/2013 | Hayton | A44B 11/06 24/303 |
| 2013/0134061 | A1 * | 5/2013 | Wu | G06F 1/1626 206/320 |
| 2013/0140203 | A1 * | 6/2013 | Chiang | G06F 1/1628 206/320 |
| 2013/0146322 | A1 * | 6/2013 | Chang | G06F 1/1626 174/50 |
| 2013/0221189 | A1 * | 8/2013 | Kubin | F16M 13/04 248/683 |
| 2014/0097110 | A1 * | 4/2014 | Shieh | G06F 1/1679 206/320 |
| 2014/0151248 | A1 * | 6/2014 | Hurst | A45C 13/1069 206/45.23 |
| 2014/0354218 | A1 * | 12/2014 | Kaynar | H02J 7/0044 320/107 |
| 2014/0355200 | A1 * | 12/2014 | Thiers | H04W 88/02 361/679.41 |
| 2014/0360893 | A1 * | 12/2014 | Whitten | A45C 11/00 206/45.2 |
| 2015/0027912 | A1 * | 1/2015 | Liu | G06F 1/1628 206/45.24 |
| 2015/0136933 | A1 * | 5/2015 | Merzon | G06F 1/1626 248/450 |
| 2015/0189962 | A1 * | 7/2015 | Yeo | A45C 11/00 361/679.17 |
| 2015/0320168 | A1 * | 11/2015 | Hoffman | A45C 13/02 206/37 |
| 2015/0325352 | A1 * | 11/2015 | Lowe | H01F 7/0252 335/285 |
| 2015/0365123 | A1 * | 12/2015 | Kim | A47B 23/043 455/575.8 |
| 2016/0018849 | A1 * | 1/2016 | Tilney | A45F 5/00 224/267 |
| 2016/0026218 | A1 * | 1/2016 | Jefferies | A45C 11/00 455/575.8 |
| 2016/0040825 | A1 * | 2/2016 | Franklin | F16M 13/02 439/39 |
| 2016/0051019 | A1 * | 2/2016 | Sirichai | A45C 11/00 206/751 |
| 2016/0058147 | A1 * | 3/2016 | Bemis | A45C 13/1069 206/45.2 |
| 2016/0095402 | A1 * | 4/2016 | Saad | A45C 11/00 206/45.23 |
| 2016/0106190 | A1 * | 4/2016 | Song | A45C 11/00 361/679.3 |
| 2016/0150861 | A1 * | 6/2016 | Yao | A45C 11/00 224/245 |
| 2016/0373152 | A1 * | 12/2016 | Schmidt | H04B 1/3877 |
| 2017/0035172 | A1 * | 2/2017 | Kim | A45C 13/1069 |
| 2017/0155418 | A1 * | 6/2017 | Kim | H04B 1/3888 |
| 2017/0170863 | A1 * | 6/2017 | Liu | H04B 1/3888 |
| 2017/0179995 | A1 * | 6/2017 | Oviedo | A41D 19/0013 |
| 2017/0196327 | A1 * | 7/2017 | Ma | A45C 11/00 |
| 2017/0280842 | A1 * | 10/2017 | Saila | A45C 11/00 |
| 2017/0303657 | A1 * | 10/2017 | Brian | A45C 11/24 |

* cited by examiner

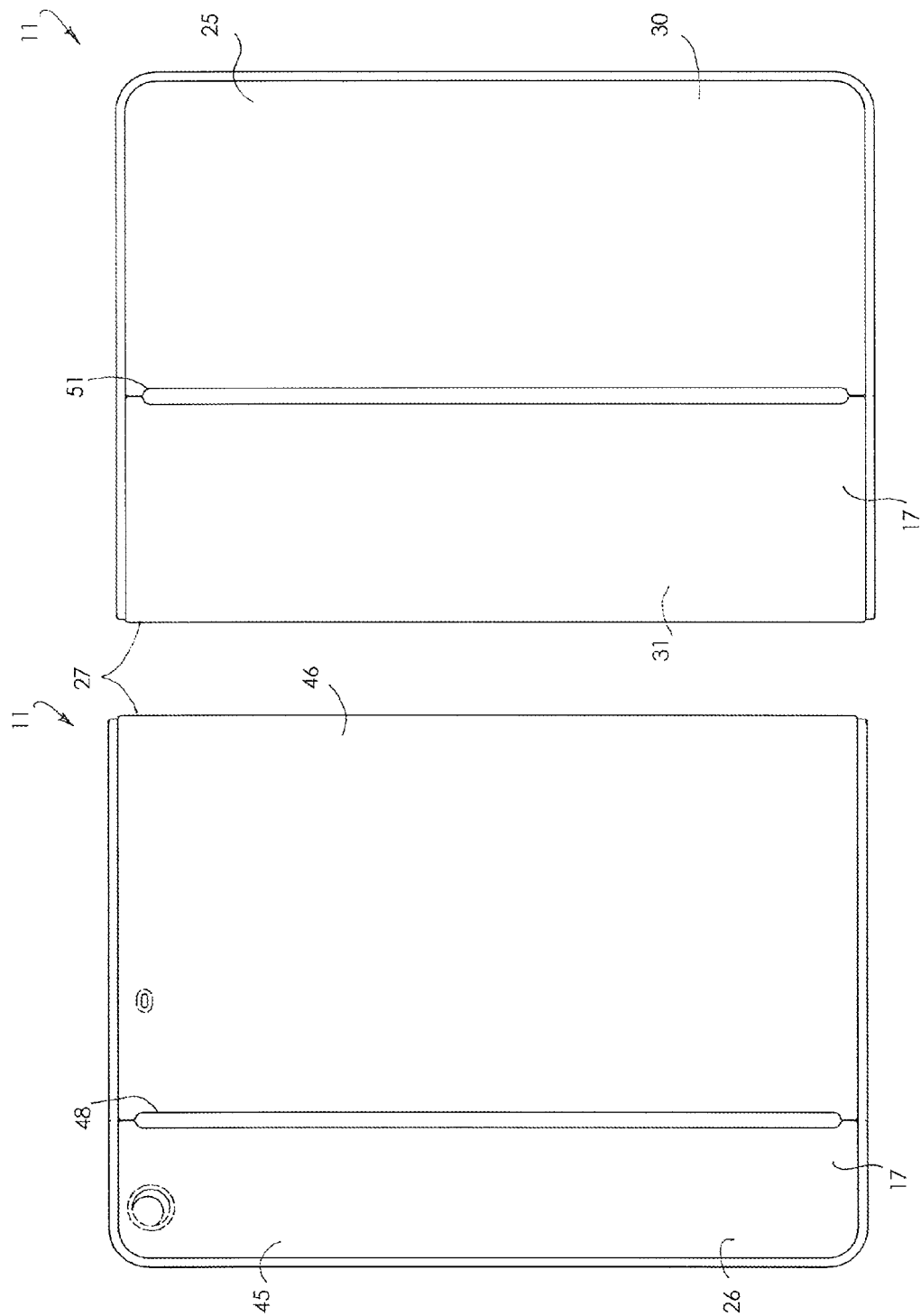

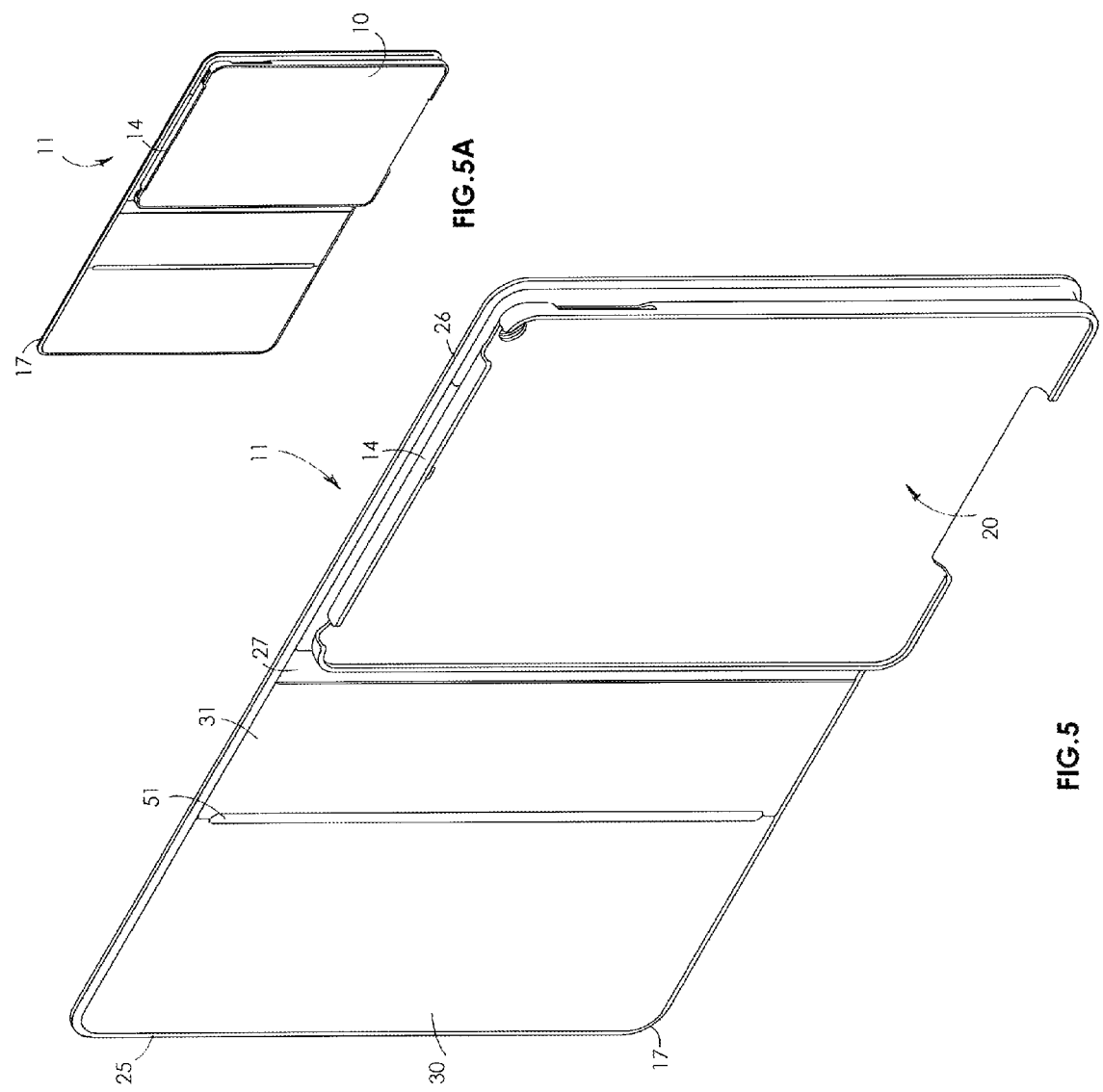

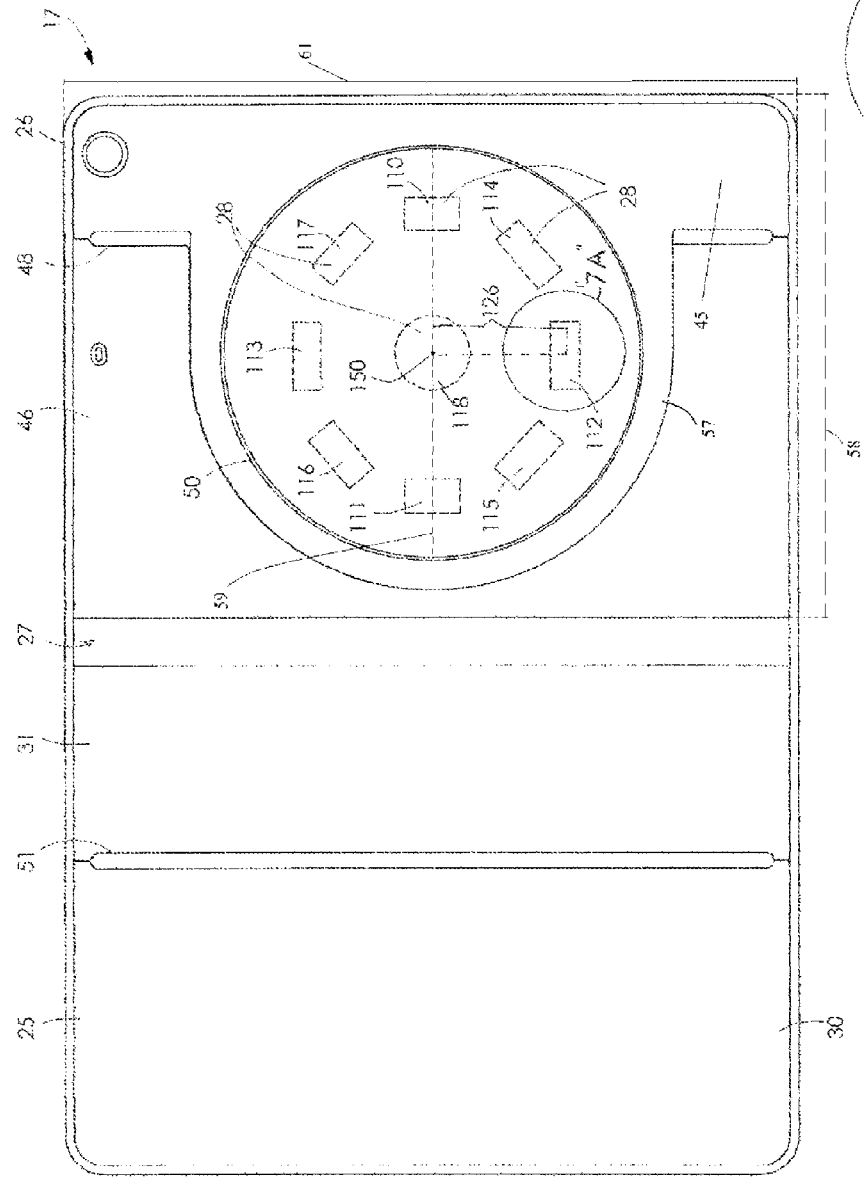
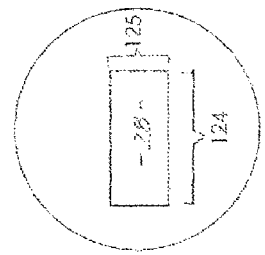
FIG.7
FIG.7A

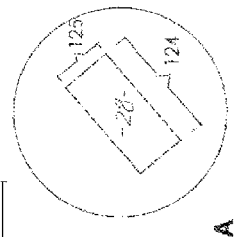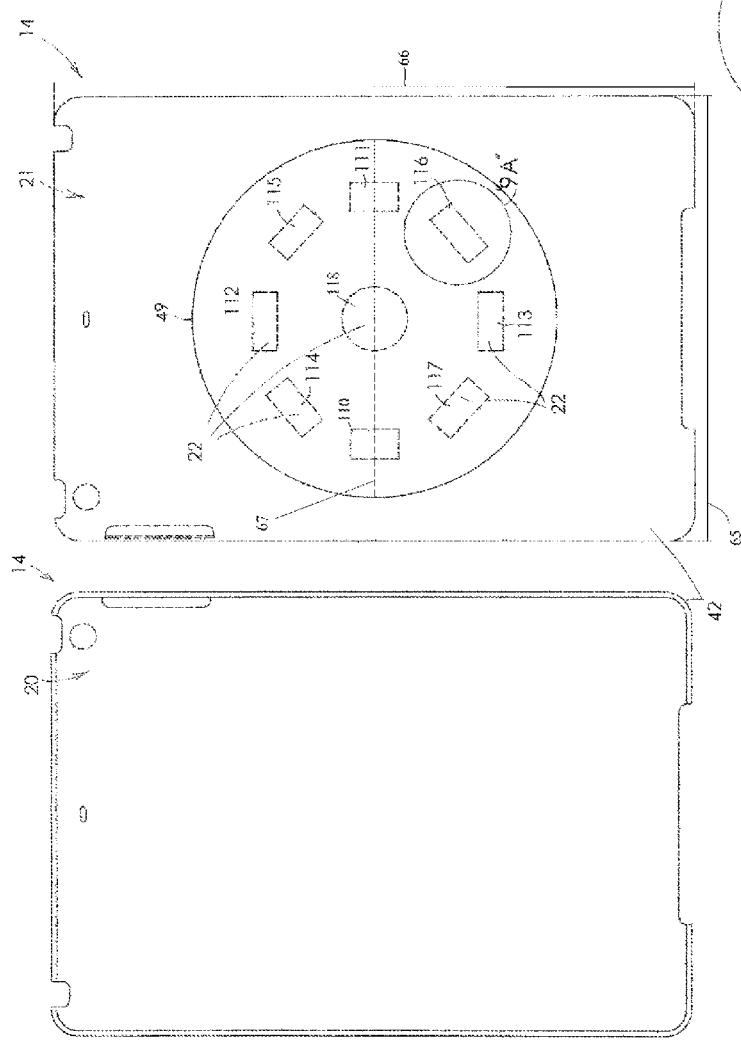

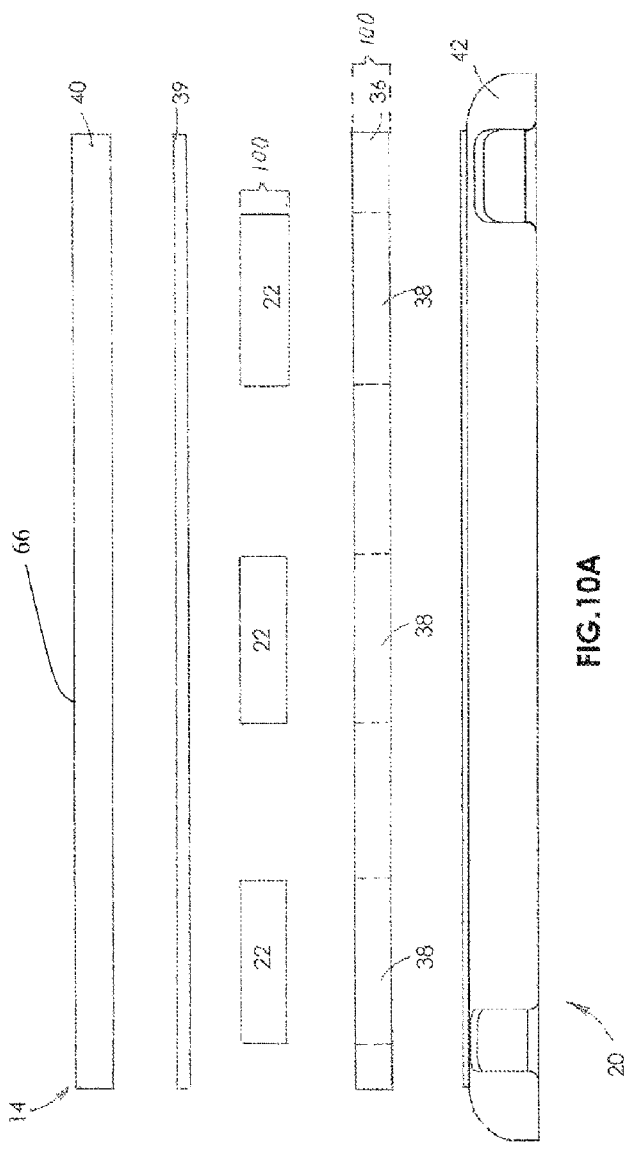
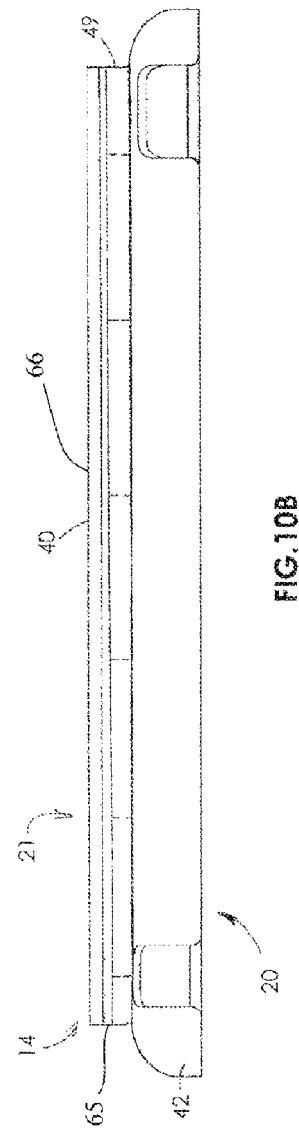
FIG. 10A
FIG. 10B

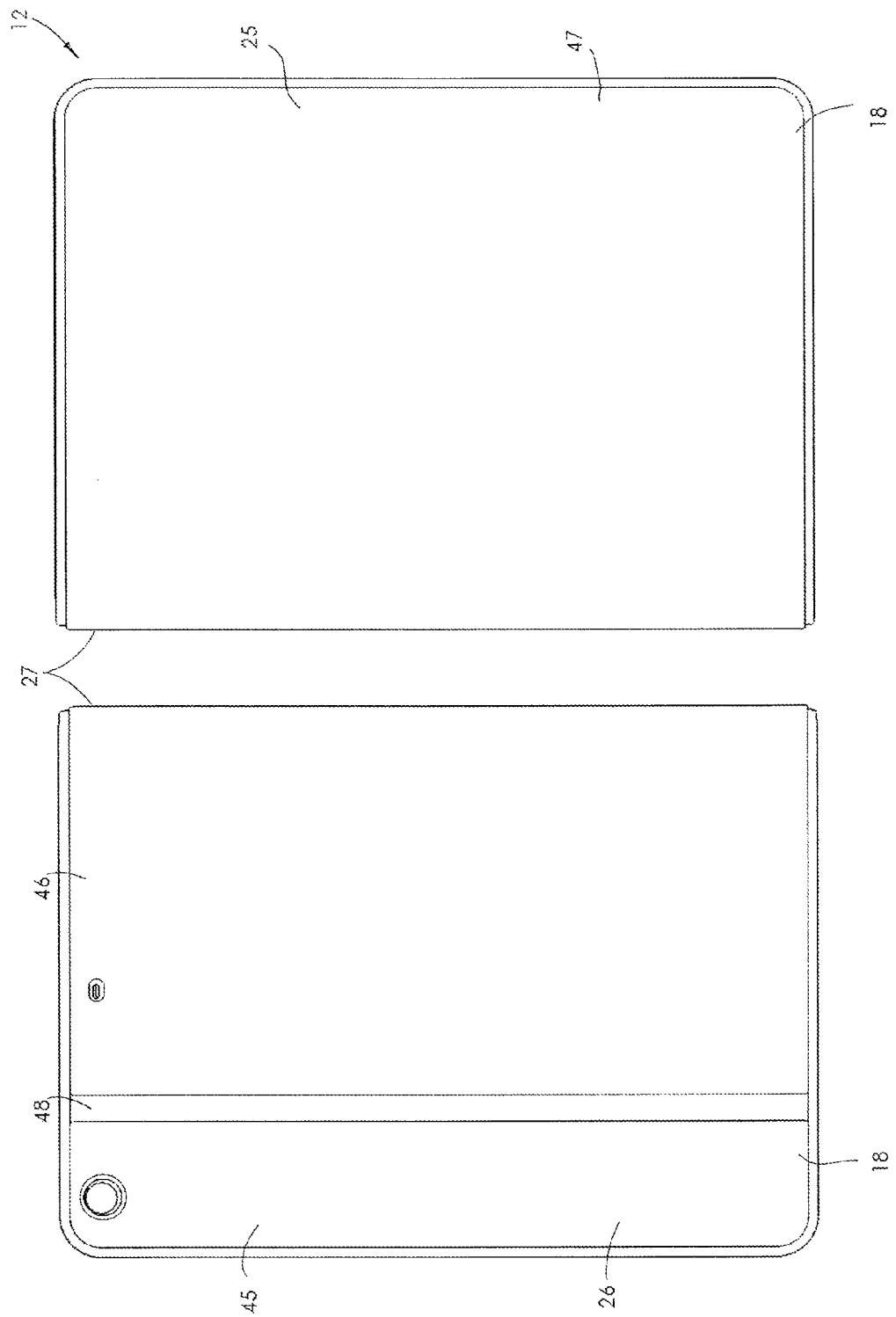

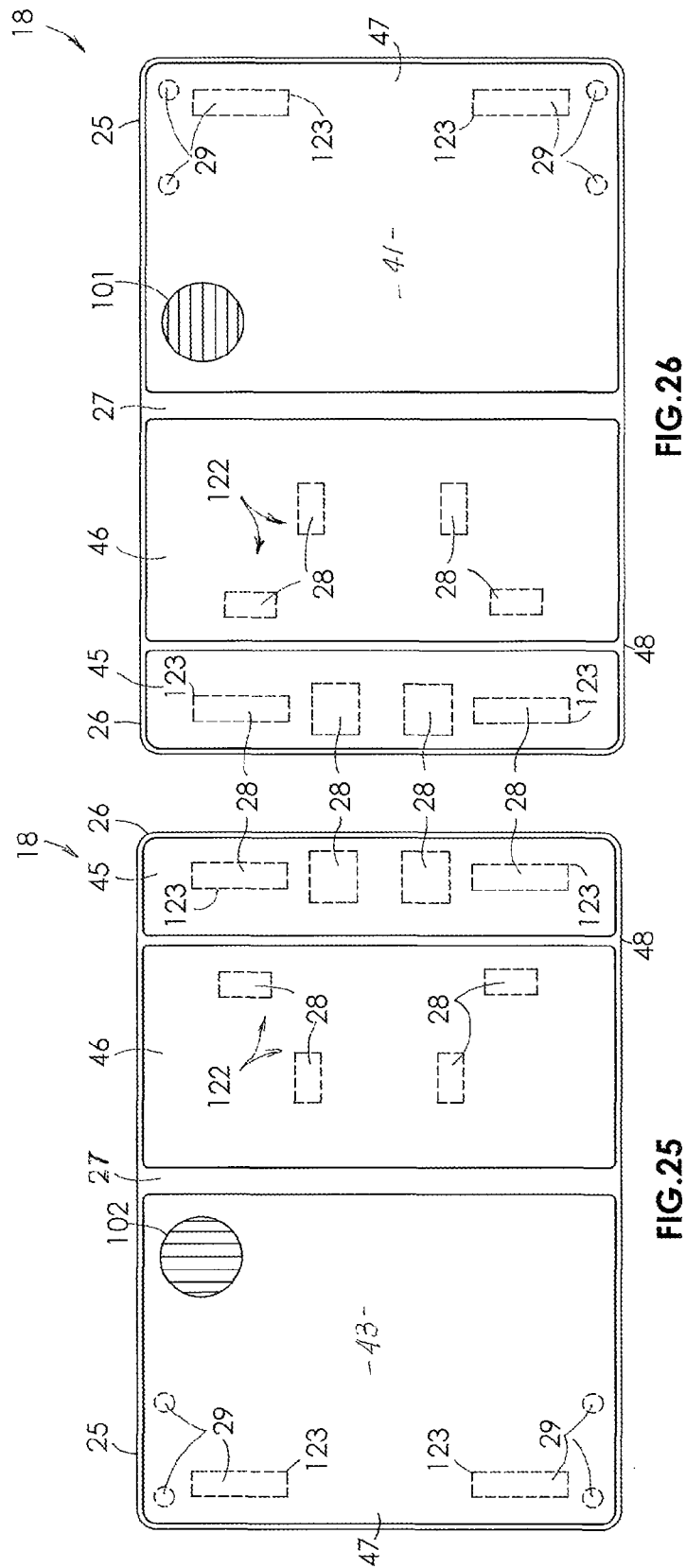

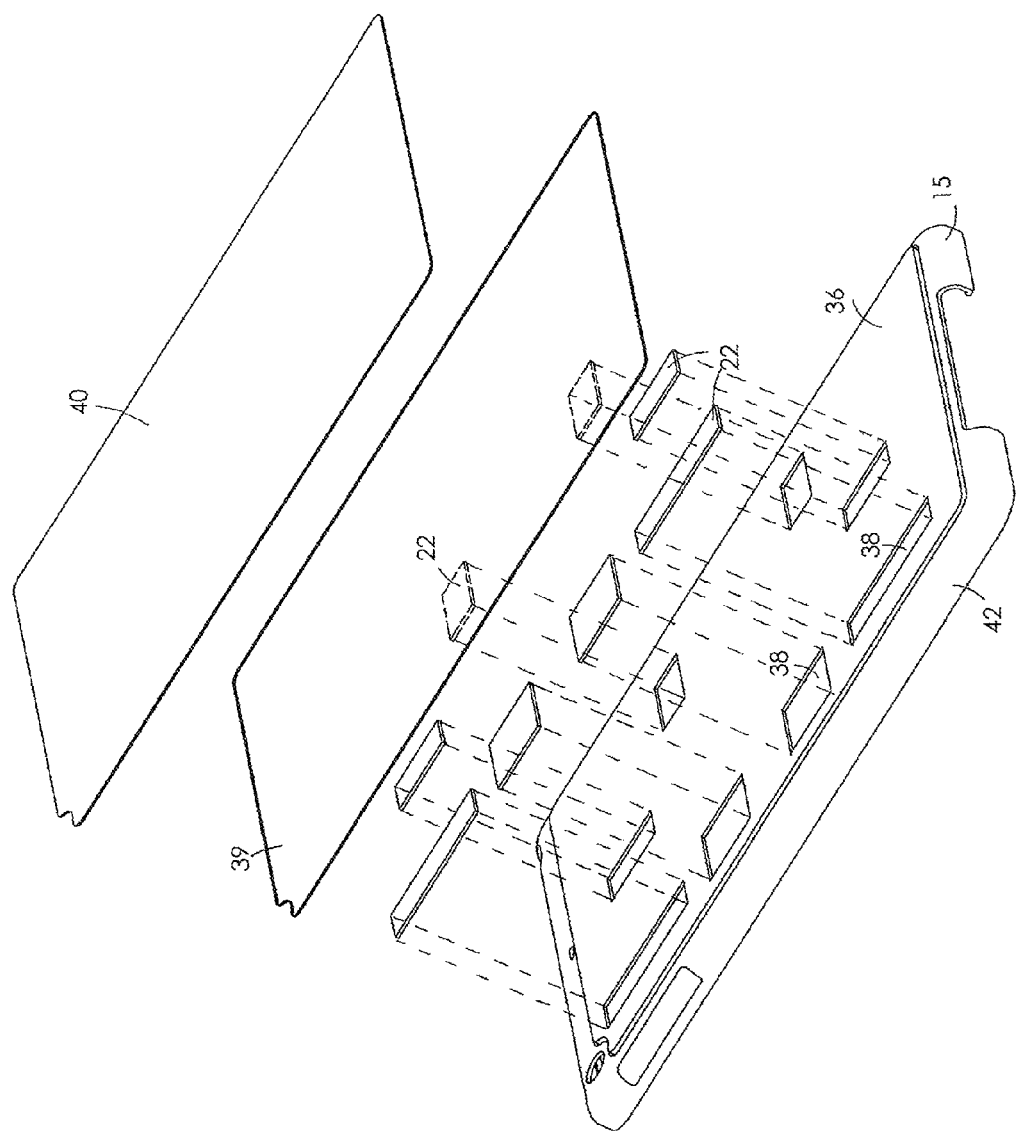

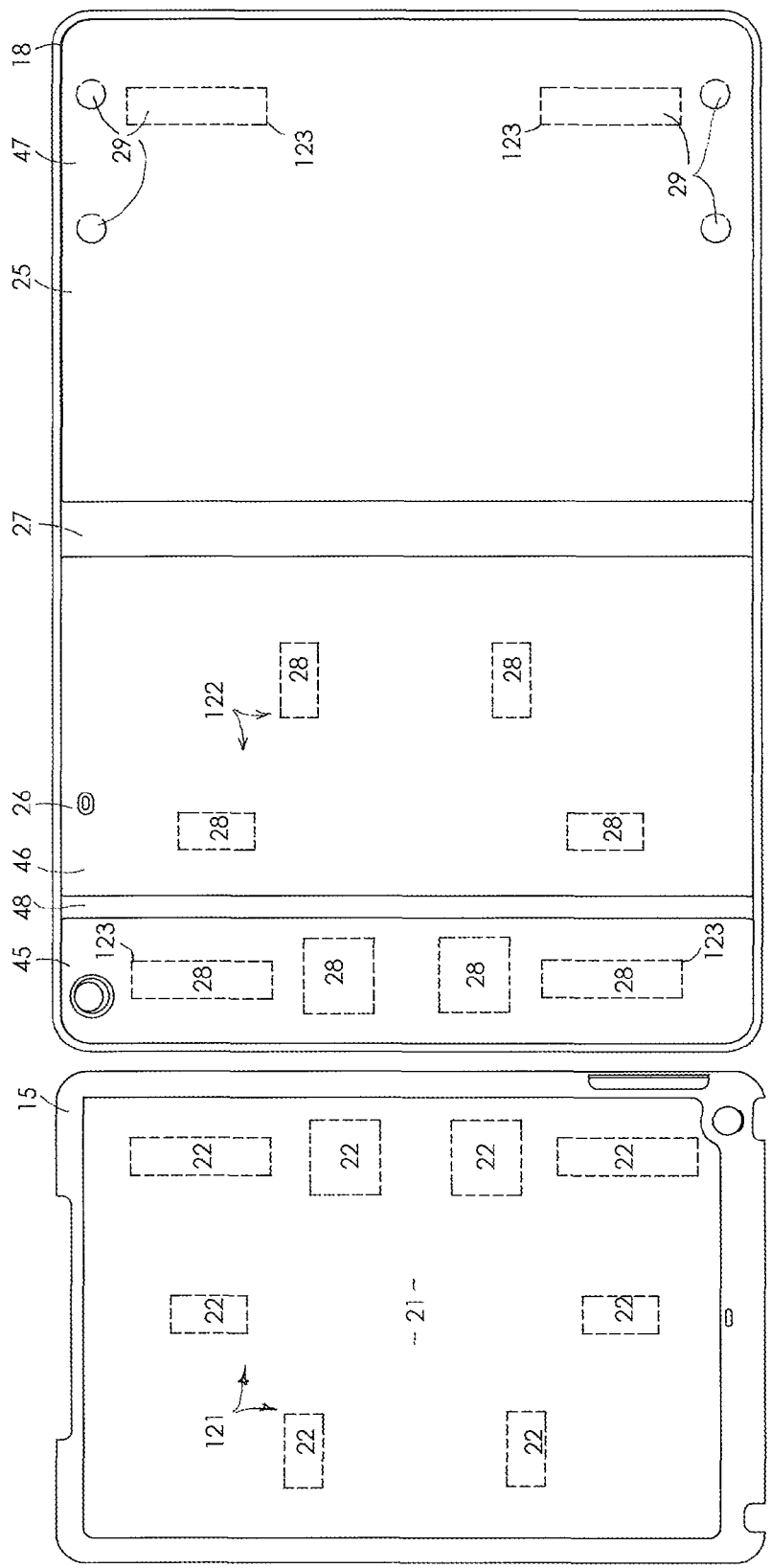

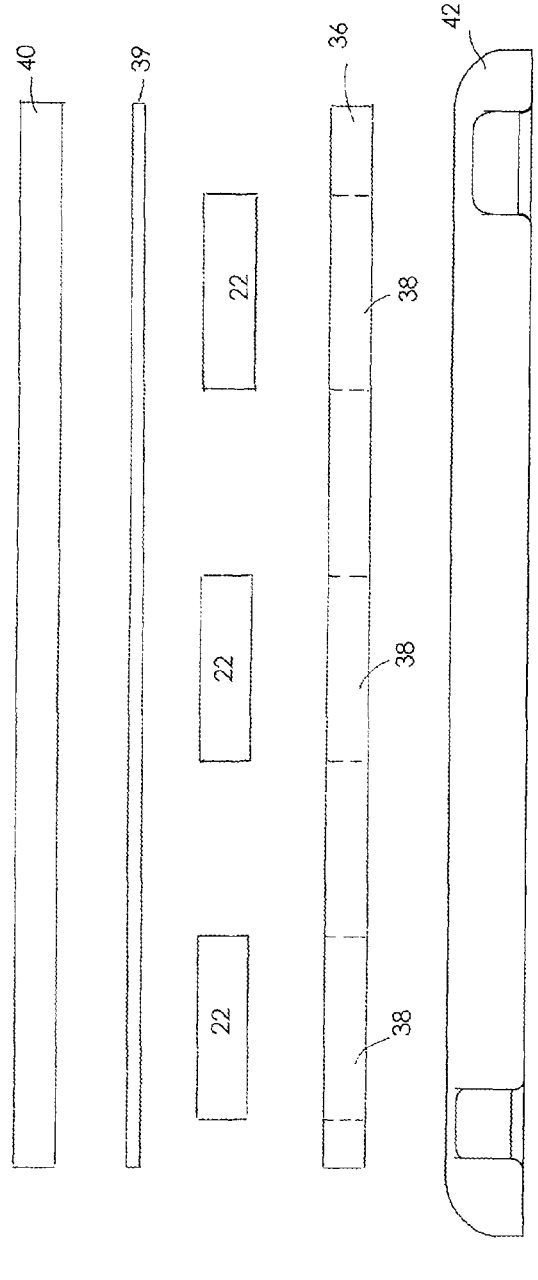
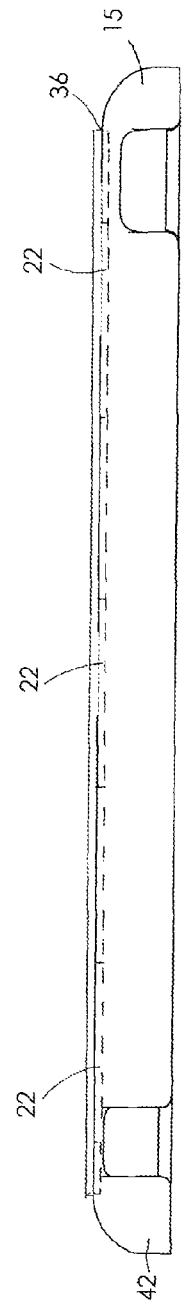
FIG.31A
FIG.31B

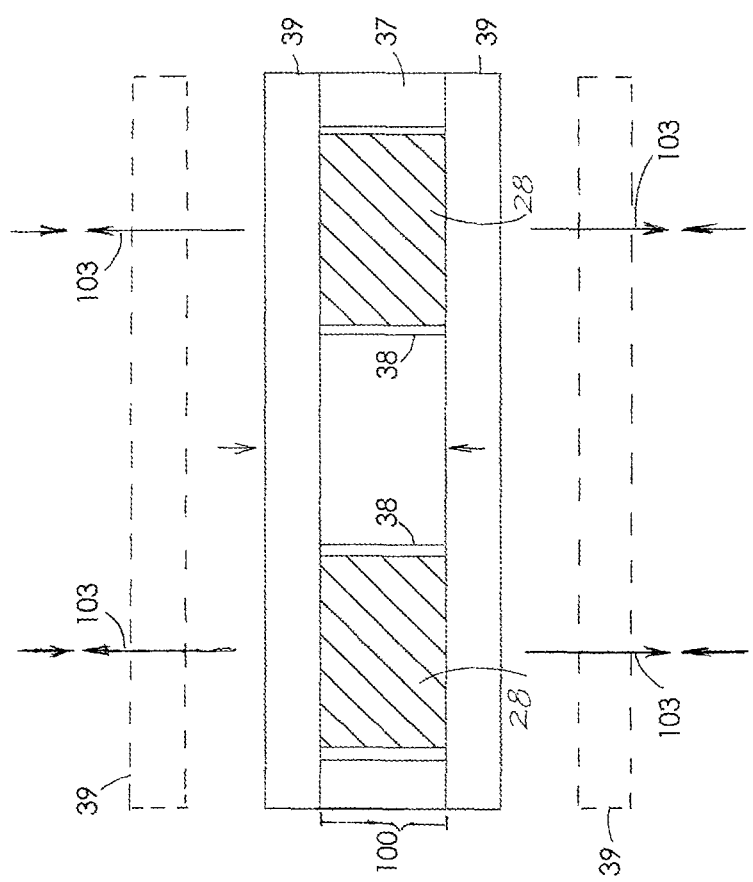

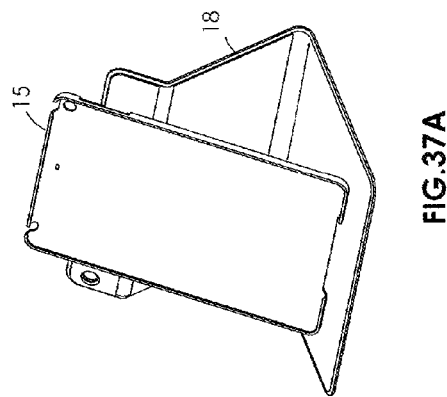
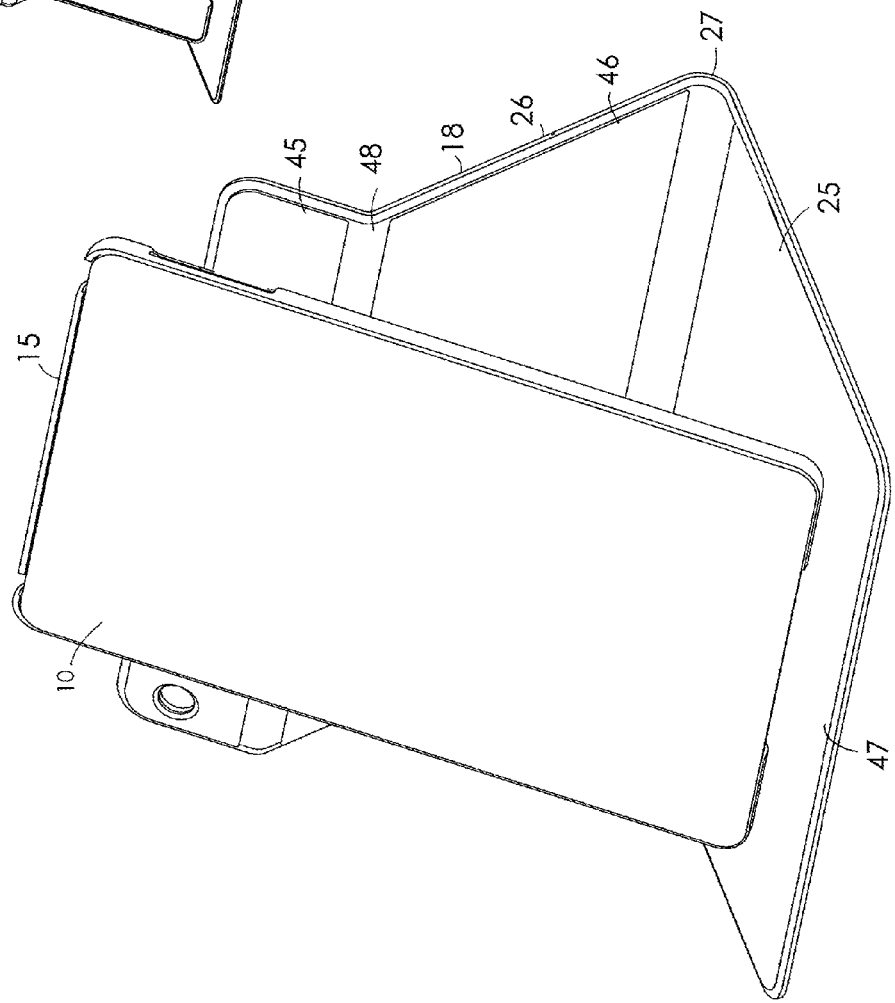

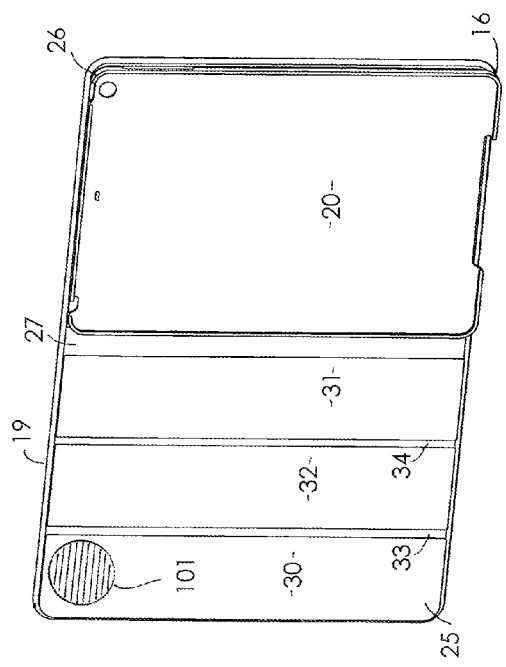
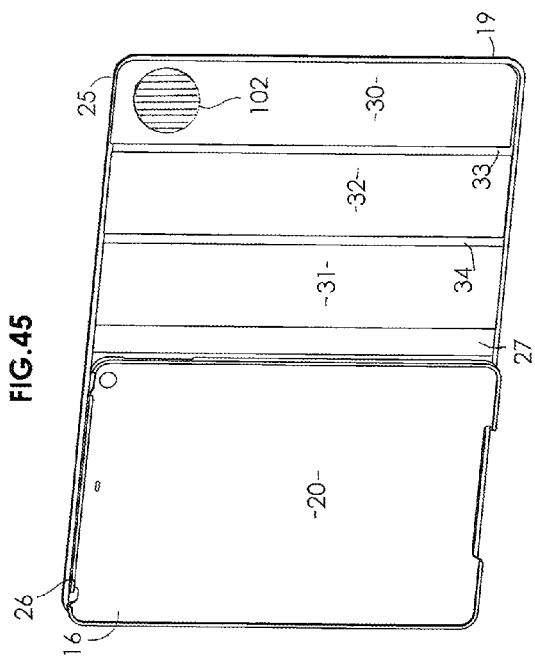
FIG. 45
FIG. 46

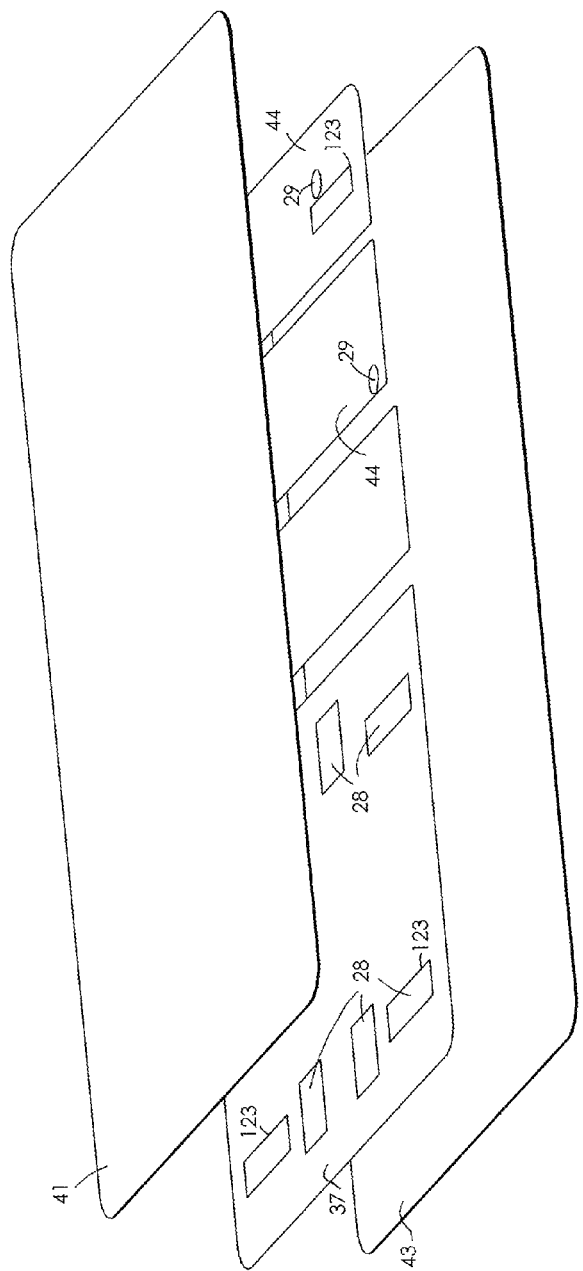
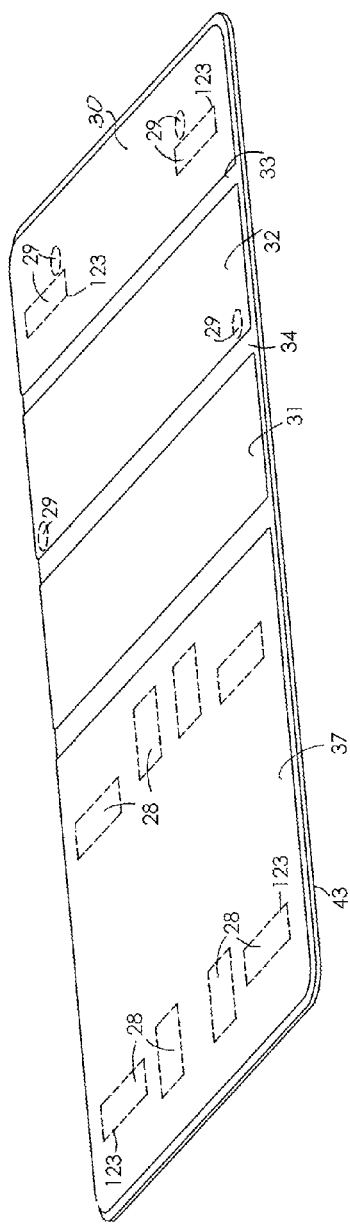
FIG. 47A
FIG. 47B

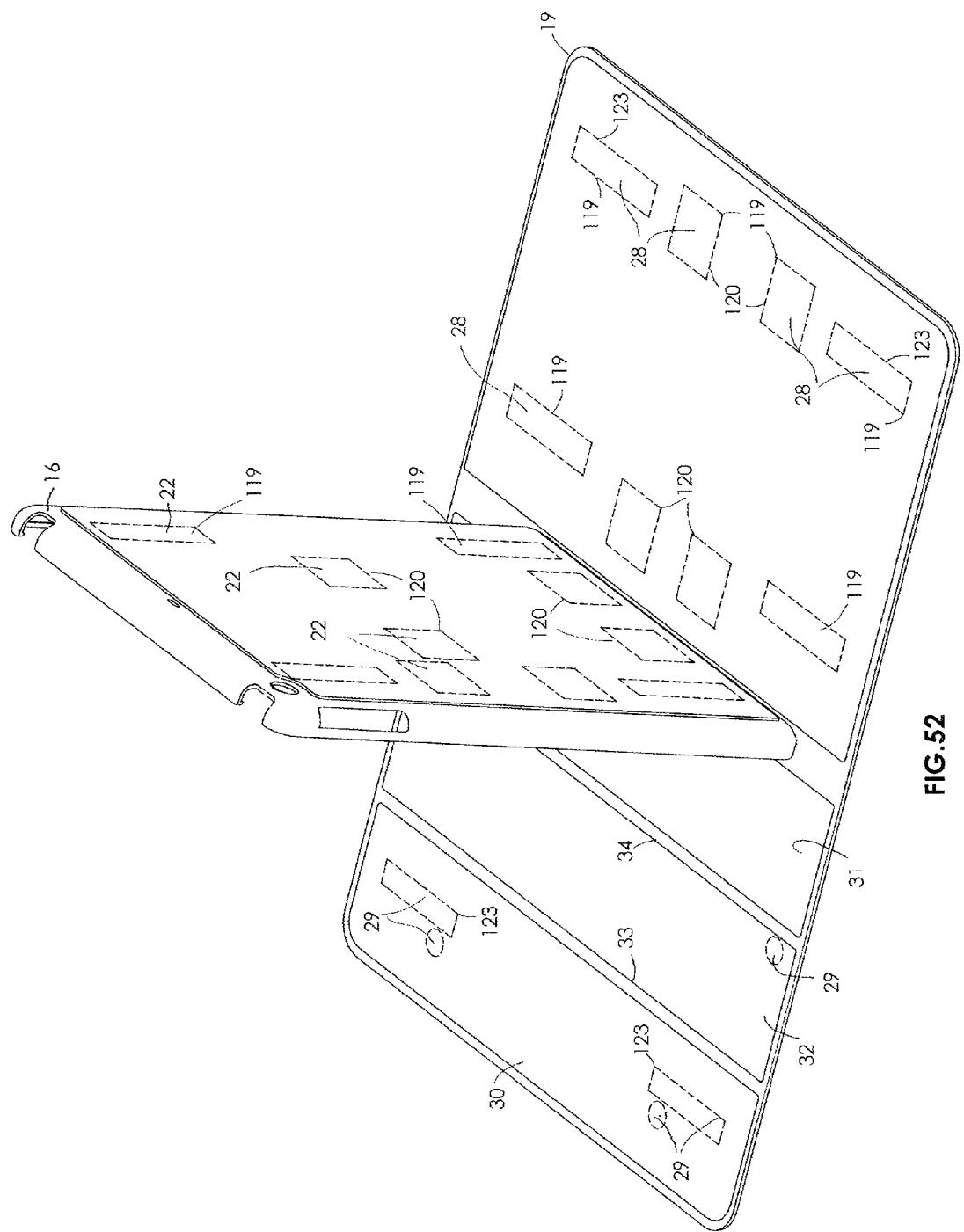

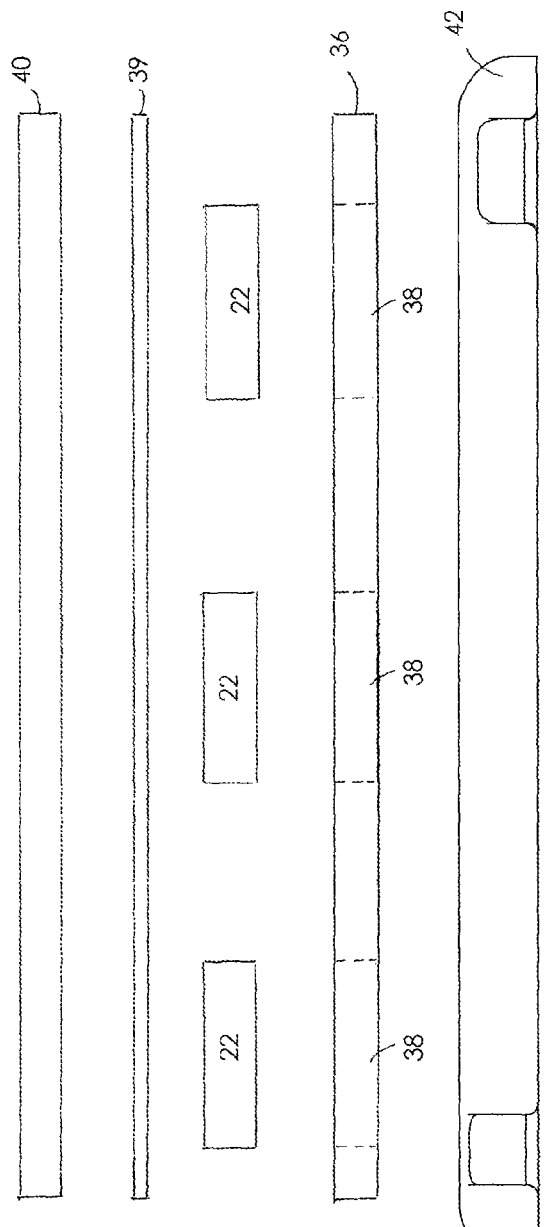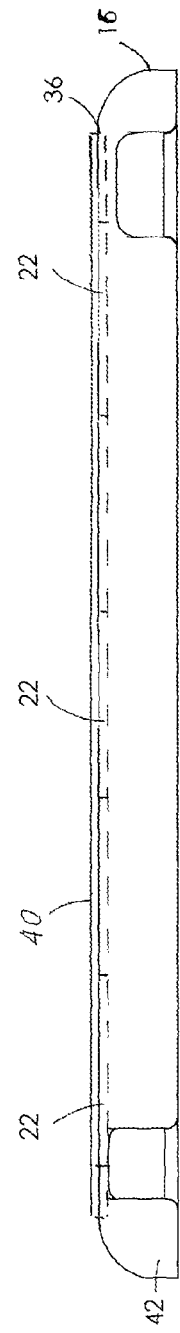
FIG. 53A
FIG. 53B

CRADLE-CASE COMBINATION WITH MAGNETIC FASTENER FEATURE

PRIOR HISTORY

This application (a) primarily claims the benefit of or priority to U.S. Provisional Patent Application No. 62/039,162 filed in the United States Patent and Trademark Office (USPTO) on 19 Aug. 2014, and (b) secondarily claims the benefit of or priority to U.S. Provisional Patent Application No. 62/039,145 filed in the USPTO on 19 Aug. 2014.

BACKGROUND OF THE INVENTION

Field of the Invention

The disclosed invention generally relates to a case-like construction for cradling and selectively positioning a cradled electronic device such as a laptop type computer, tablet computer, smart phone or similar other device. More particularly, the disclosed invention provides a cradle-case combination or assembly for enabling a user to encase or cradle an electronic device and selectively display the electronic device via magnetic attraction(s) intermediate the cradle and case portions of the cradle-case assembly.

Brief Description of the Prior Art

Case constructions for use in combination with electronic devices such as tablet type computers and the like are well known in this field of art. While the basic function of a basic case construction is to protect and/or enclose the device it encases, the art continues to develop with an eye toward enhancing functionality of the case constructions so as to provide the user with various means of manipulating and/or re-positioning the devices.

For example, it may be desirable to rotate or reorient the electronic device for different views or positions, while generally supporting the device within or as attached to the basal case construction. When the tablet computer or similar device is supported in its carrying case during use thereof, the multi-function use of the case provides great advantages for utility thereof, while keeping a structure for the improved use to a minimum.

A few of the more pertinent prior art patent-related disclosures relating to cradle-like devices for holding and enabling the re-positioning of the devices they hold are described hereinafter. United States Patent Application Publication No. 2006/0187696 ('696 Publication), authored by Lanni, for example, discloses a Cradle for Receiving an Adapter. The '696 Publication describes a cradle casing having a DC/DC adapter to receive DC power from a DC power source and generate a first DC power signal. A sleeve accepts an AC/DC adapter, and guides movement of the AC/DC adapter when the AC/DC adapter is inserted into the cradle casing. The AC/DC adapter is capable of receiving AC power from an AC power source and generating a second DC power signal. A circuit receives at least one of the first DC power signal and the second DC power signal and outputs a third DC power signal.

United States Patent Application Publication No. 2008/0002369 ('369 Publication), authored by Carnevali, discloses a Portable Device Docking Station. The '369 Publication describes an external expanding apparatus or "docking station" operable with a portable computer device of a type having a display unit having a display screen on an inner surface thereof and a hard shell backing surface opposite thereof and pivotally mounted on a substantially rigid casing having a pair of locating holes adjacent to opposite corners of a substantially planar bottom surface thereof, and an input/output (I/O) connector positioned on a back plane thereof with a pair of positioning apertures provided on opposite sides thereof.

United States Patent Application Publication No. 2011/0261509 ('509 Publication), authored by Xu et al., discloses a Docking Cradle with Floating Connector Assembly. The '509 Publication describes a docking cradle for a portable electronic device that includes a floating connector assembly. The floating connector assembly isolates a portable electronic device connected to the connector assembly from at least some of the shock, vibration or other motion imposed on the rest of the docking cradle.

The connector assembly is positioned above a base frame and comprises a platform, a device interface on the platform, a device securing mechanism connected to the platform and connectable to the portable electronic device to physically secure the portable electronic device to the connector assembly; and at least one connector assembly spring connecting the connector assembly to the base frame such that the connector assembly is movable laterally relative to the base frame.

United States Patent Application Publication No. 2012/0075789 ('789 Publication), authored by DeCamp et al., discloses a Swiveling Base for a Portable Computing Device. The '789 Publication describes certain swiveling bases for portable computing devices. A swiveling base according to the '789 Publication includes a base member and a rotatable member. The base member can be placed on a flat surface and rotatably supports the rotatable member. The rotatable member releasably secures the portable computing device and can rotate relative to the base member to reorient a display of the portable computing device.

The swiveling bases may further include a control component disposed on the base member. The control component is disposed on the base member and facilitates user interaction with a computing application being executed on the portable computing device. The control component may be, for example, a button, a joystick, a D-pad, a tactile sensor pad, a touch-sensitive D-pad, a spherical trackball, a slider, or a sliding disk.

U.S. Pat. No. 8,665,044 ('044 patent) and U.S. Pat. No. 8,665,045 ('045 patent), both issued to Lauder et al., respectively disclose a Cover for an Electronic Device and an Accessory Device with Magnetic Attachment. The '044 and '045 patents basically describe a magnetic attachment mechanism and certain associated methods. The magnetic attachment mechanism can be used to releasably attach at least two objects together in a preferred configuration without fasteners and without external intervention. The magnetic attachment mechanism can be used to releasably attach an accessory device to an electronic device. The accessory device can be used to augment the functionality of usefulness of the electronic device.

U.S. Pat. No. 8,672,126 ('126 patent), issued to Rohrback et al., discloses a Foldable Case for Use with an Electronic Device. The '126 patent describes a case for securing and protecting an electronic device. The case can include a cover connected to a pouch by a hinge such that the cover can be overlaid over a device interface. The case can be constructed by layering and combining several types of materials, including for example materials having resistant outer surfaces, materials limiting the deformation of the case, materials providing a soft surface to be placed in contact with the device, and rigid materials for defining a structure of the case. In some embodiments, the case can include a tab that allows a user to fold open the cover of the case to form a triangular prism. The prism can be placed on any of its surfaces such that the device can be oriented towards a user at particular angles.

From a review of the foregoing citations in particular, and from a consideration of the prior art in general, it will be seen that the prior art thus perceives a need for a cradle apparatus usable in combination with a case or cover construction for enabling a user to removably cradle an electronic device as exemplified by a tablet type computer or smart phone and magnetically attach the cradle and cradled electronic device to a case construction in a select orientation selected from the group consisting of a landscape orientation and a portrait orientation as summarized in more detail hereinafter.

SUMMARY OF THE INVENTION

Among the many objectives of this invention is the provision of a cradle-case combination or assembly for selectively displaying or encasing an electronic device such as a notebook, laptop, or tablet type computer, smart phone, or similar other device. These and other readily identifiable objectives of the invention (which other objectives become clear by consideration of the specification, claims and drawings as a whole) are met by providing a cradle-case combination or assembly that cooperates with an electronic device for selectively displaying or encasing the same.

To achieve these and other readily identifiable objectives, the present invention provides a cradle-case combination in several embodiments for encasing and selectively displaying an electronic device. Each of the cradle-case combinations according to the present invention preferably and essentially comprise a cradle construction and a case construction as variously taught.

The cradle constructions are all sized and shaped to removably receive or cradle a select electronic device, and comprise an anterior device-receiving cradle portion and a posterior cradle-to-case interface portion. The posterior cradle-to-case interface portion(s) all preferably comprise a first material construction as exemplified by a cradle-based magnets or a series of magnets.

The case constructions all basically function to envelope the anterior device-receiving cradle portion and posterior cradle-to-case interface portion of the respective cradle constructions when in a closed-case configuration and comprise a first outer case portion or layer, a second outer case portion or layer, an anterior case portion, a posterior case portion, and an anterior-to-posterior junction section. The anterior-to-posterior junction sections enable the user to pivot the anterior case portion(s) relative to the posterior case portion(s), and the posterior case portion(s) each preferably comprise a second material construction as exemplified by a case-back-based magnet or a series of magnets.

The first and second material constructions are magnetically attractive for magnetically fastening the posterior cradle-to-case interface portion of the respective cradle construction(s) to the posterior case portion of the respective case construction(s). The anterior case portion(s) are pivotal relative to the posterior case portion(s) via the anterior-to-posterior junction section(s) for selectively (a) enabling access to the anterior device-receiving cradle portion(s) when in an open case configuration or (b) covering/enveloping the anterior device-receiving cradle portion(s) when in a closed case configuration.

Certain cradle-case combinations comprise anterior case portion(s) having a third material construction exemplified by a case-front-based permanent magnet or a series of magnets. The third material construction according to the present invention is magnetically attractive to a select material construction as selected from the group consisting of the first and second material constructions of either the posterior cradle-to-case interface portion(s) or the posterior case portion(s). Thus, the third material construction of the anterior case portion(s) enhances the user's ability to selectively fasten alternative portions of certain of the cradle-case combinations.

The cradle-case combinations exemplified by certain embodiments may preferably comprise anterior case portion(s) having at least a two-panel construction, including at least a distal anterior panel and a proximal anterior panel, the distal anterior panel being pivotal relative to the proximal anterior panel. In the case of a three-panel construction, the three-panel construction may further a distal-to-proximal junction panel intermediate the distal and proximal anterior panels.

A distal junction section enables the distal anterior panel to pivot relative to the distal-to-proximal junction panel, and a proximal junction section enables the distal-to-proximal junction panel to pivot relative to the proximal anterior panel. The three-panel construction exemplified by case construction enables the user to form a triangular anterior case portion. The triangular anterior case portion enhances the user's ability to selectively display the anterior device-receiving cradle portion.

The distal anterior panel of the anterior case portion preferably comprises the third material construction exemplified by magnets. The third material construction of the distal anterior panel is magnetically fastenable to the second material construction of the corresponding posterior case portion for either maintaining the triangular anterior case portion in fastened engagement to the posterior case portion in the case of the three-panel type anterior case portion, or holding the anterior case portion in parallel relation to the posterior case portion in the case of the two-panel type anterior case portion.

The posterior cradle-to-case interface portion, the posterior case portion and/or the anterior case portion may preferably comprise an apertured panel outfitted with apertures for receiving and spatially situating the first, second and/or third material constructions as further exemplified by magnets. A thin lamination material layer may be applied to opposite faces of the apertured panels for securing the magnetically attractive material constructions within the apertures formed in the apertured panels.

Preferably, the apertures formed in the apertured panels of at least the anterior and posterior case constructions extend orthogonally through the entire plane of the panels. The second and/or third material constructions, being received in said apertures, thereby more effectively enable bidirectional or oppositely directed magnetic attractions via those panels. This feature particularly helps support the reversibility of certain case constructions relative to respective cradle constructions.

The first and second outer case portions or layers are preferably reversible and comprise differing ornamental appearances. The differing ornamental appearances of the reversible first and second outer case portions or layers enable the user to selectively display an outer case material, and the bidirectional magnetic attractions of the magnets enable the user to magnetically fasten the posterior cradle-to-case interface portion(s) of certain cradle constructions to either of two reversible sides portions or layers of the posterior case portion(s) of the applicable or corresponding case construction(s).

It is contemplated that either the anterior case portion(s) or the posterior case portion(s) may preferably comprise at least a distal panel and a proximal panel with a pivotal junction therebetween. In this regard, the distal anterior and posterior panels are pivotal relative to the proximal anterior and posterior panels about junction sections. The distal anterior or posterior panels comprise the second material construction exemplified by magnetic elements.

The magnetically attractive first and second material constructions are structurally configured or situated for enabling the user to reorient the cradle construction(s) intermediate portrait and landscape orientations relative to the respective case construction(s). The first and second series of magnets may be respectively spaced from one another within the posterior cradle-to-case interface portion(s) and the posterior case portion(s) in an interface portion magnet arrangement and a posterior case portion magnet arrangement, whereby the arrangements are mirror images of one another when viewed in a side-by-side comparison view. Such magnet arrangements enhance the magnetic attractive forces between the various cradle and case constructions.

Similarly, the second and third material constructions may respectively comprise a second and third series of magnets as at magnets spaced from one another within the distal anterior and posterior panels in distal panel magnet arrangements that are mirror images of one another when viewed in a side-by-side comparison view, which magnet arrangements enhance the magnetic attractive forces between the anterior and posterior case portions.

In one embodiment, the posterior cradle-to-case interface portion may preferably comprises a first circular formation, and the distal posterior panel may preferably comprise a depending second circular formation. The first and second circular formations incorporate or locate the first and second material constructions, and are matable for enabling the first circular formation to rotate relative to the second circular formation about a cradle-to-case axis of rotation for enabling the user to reorient the cradle construction intermediate portrait and landscape orientations relative to the case construction.

Other objects of the present invention, as well as particular features, elements, and advantages thereof, will be elucidated or become apparent from, the following description and the accompanying drawing figures.

BRIEF DESCRIPTIONS OF THE DRAWINGS

Other features and objectives of my invention will become more evident from a consideration of the following brief descriptions of patent drawings:

FIG. 1 is a posterior plan view of a first alternative cradle-case combination or assembly according to the present invention in a case-closed configuration.

FIG. 2 is an anterior plan view of the first alternative cradle-case combination or assembly according to the present invention in a case-closed configuration.

FIG. 5 is an anterior perspective view of the first alternative cradle-case combination or assembly according to the present invention in a case-open configuration.

FIG. 5A is a reduced anterior perspective view of the first alternative cradle-case combination or assembly according to the present invention in a case-open configuration with a generic electronic device received in an anterior device-receiving cradle portion of a cradle construction of the first alternative cradle-case combination.

FIG. 7 is an anterior plan view of a case construction of the first alternative cradle-case combination or assembly according to the present invention in a case-open configuration depicting in broken lines a series of otherwise hidden case-based magnet sites.

FIG. 7A is an enlarged view of a magnet site as enlarged from FIG. 7, enlarged to depict in greater detail the shape of the magnet from the magnet site.

FIG. 8 is an anterior plan view of a cradle construction of the first alternative cradle-case combination or assembly according to the present invention.

FIG. 9 is a posterior plan view of the cradle construction of the first alternative cradle-case combination or assembly according to the present invention depicting in broken lines a series of otherwise hidden cradle-based magnet sites.

FIG. 9A is an enlarged view of a magnet site as enlarged from FIG. 9 and enlarged to depict in greater detail the shape of the magnet site.

FIG. 10A is an exploded lateral perspective view of the cradle construction of the first alternative cradle-case combination or assembly according to the present invention showing from top to bottom a top or outer material layer, a lamination material layer, a series of magnets, an apertured panel and a shell.

FIG. 10B is an assembled lateral view of the cradle construction of the first alternative cradle-case combination or assembly according to the present invention.

Figure 12:
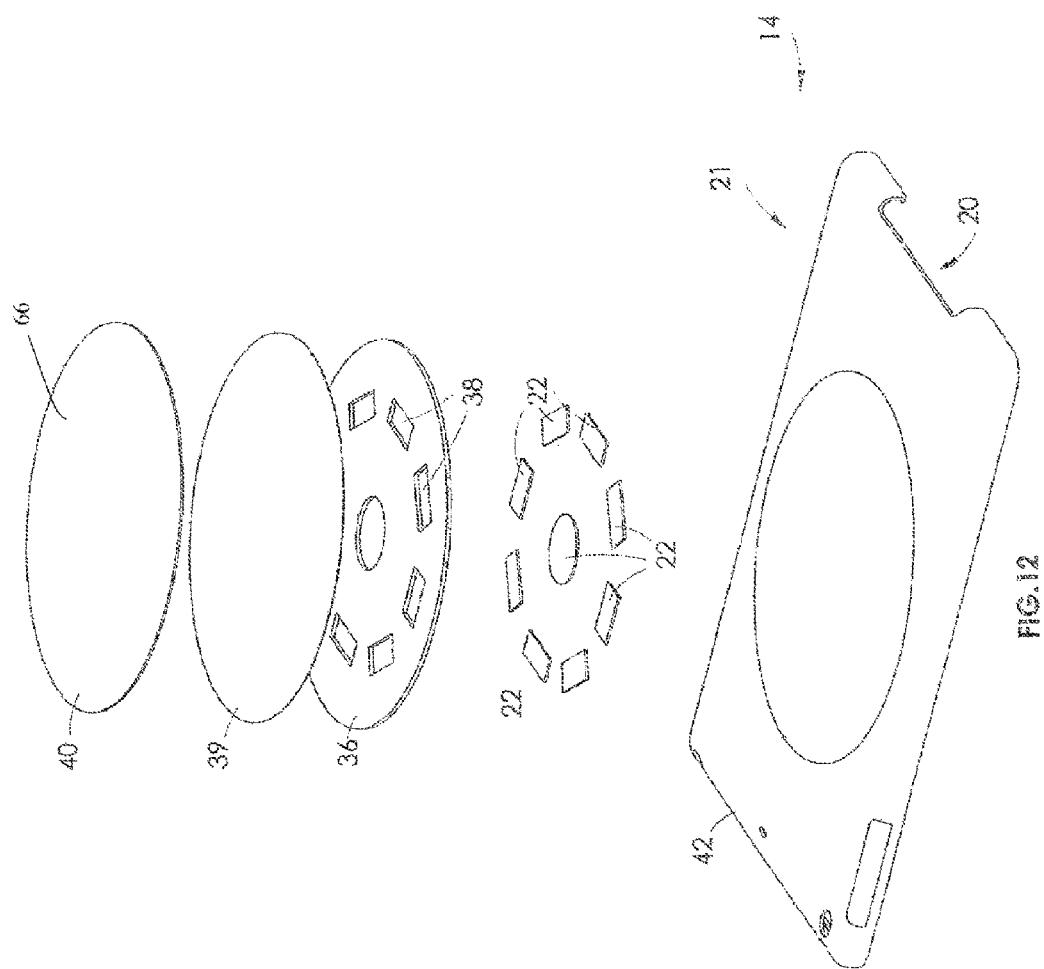

FIG. 12 is an exploded posterior perspective view of the cradle construction of the first alternative cradle-case combination or assembly according to the present invention showing from back to front a rear or outer material layer, a lamination material layer, an apertured panel, a series of magnets, and a male circular formation of a posterior cradle-to-case interface portion of the cradle construction.

Figure 13:
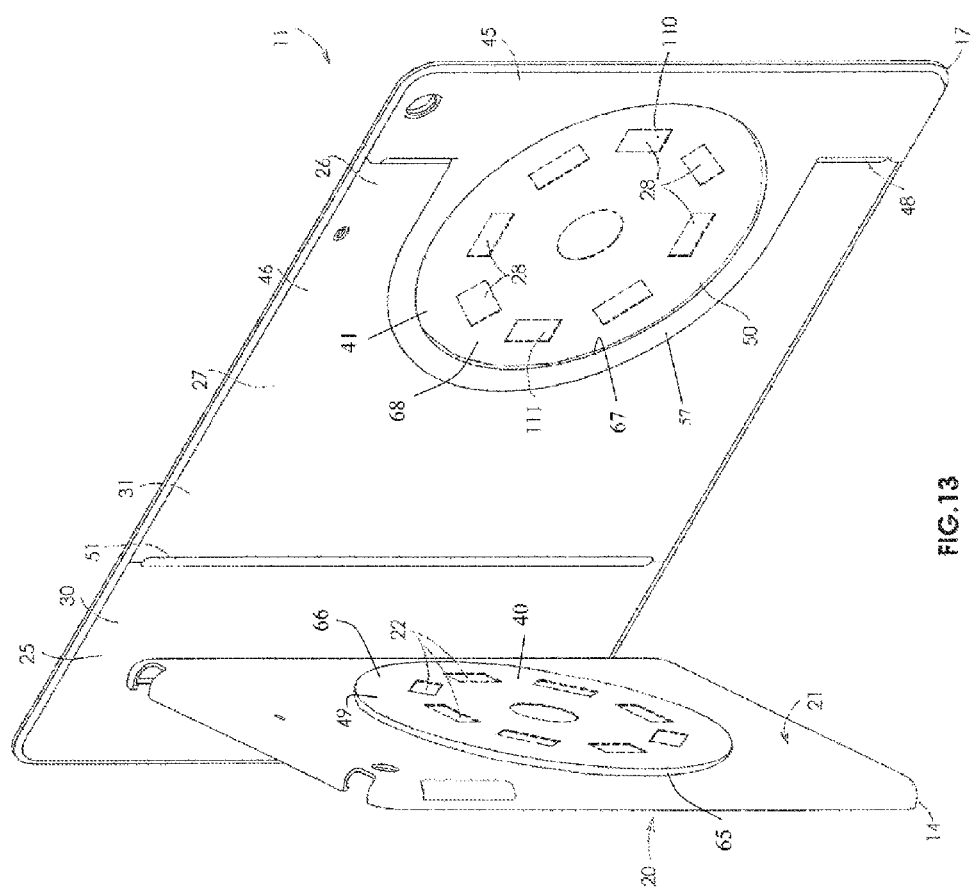

FIG. 13 is an exploded view of the cradle construction and case construction of the first alternative cradle-case combination or assembly according to the present invention showing the cradle construction in posterior perspective and showing the case construction in anterior perspective.

Figure 14:
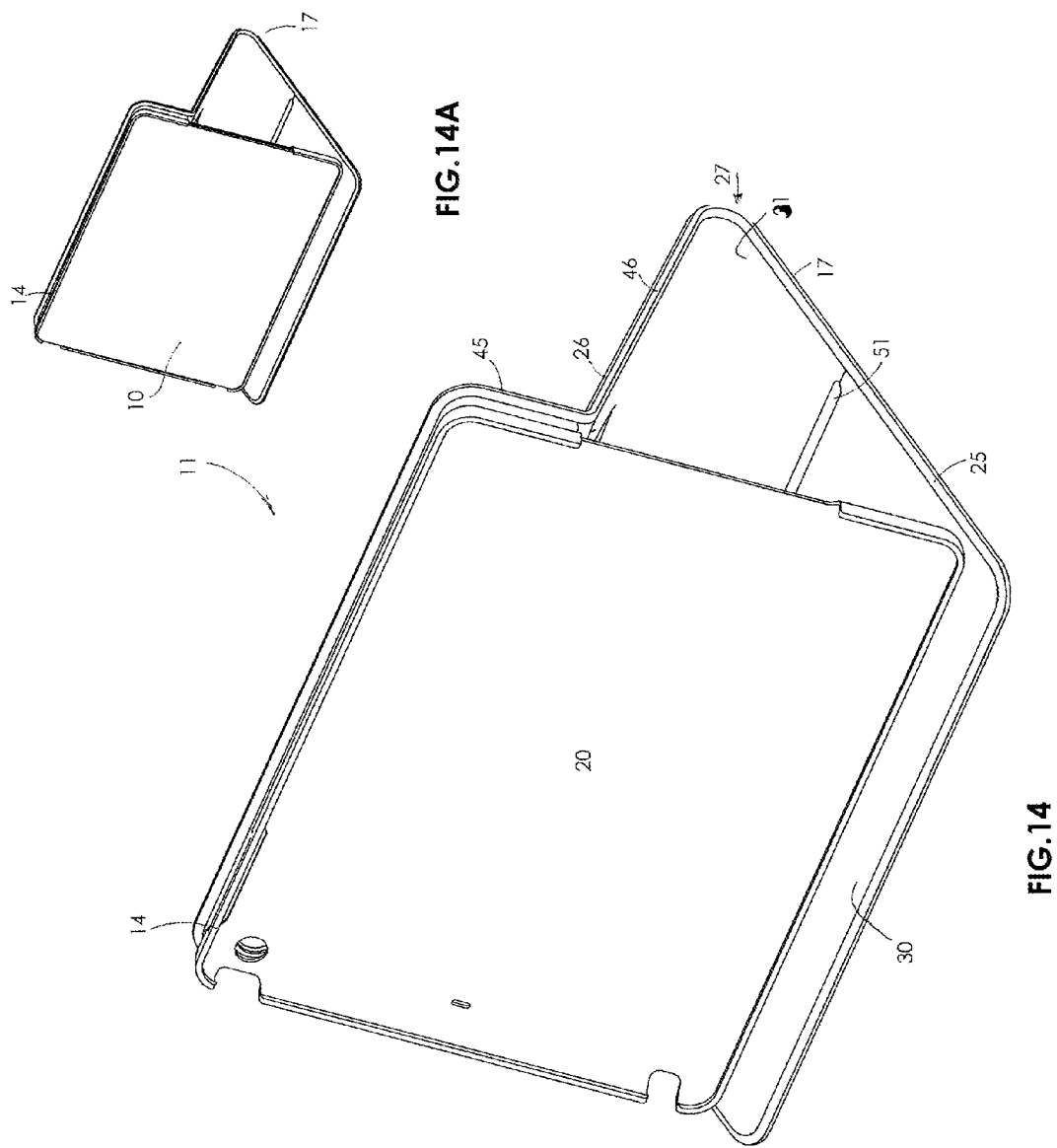

FIG. 14 is an anterior perspective view of the first alternative cradle-case combination or assembly according to the present invention in a case-open configuration for displaying the anterior device-receiving cradle portion of the first alternative cradle-case combination in a landscape orientation.

FIG. 14A is a reduced anterior perspective view of the first alternative cradle-case combination or assembly according to the present invention in a case-open configuration for displaying a generic electronic device as cradled by the anterior device-receiving cradle portion of the first alternative cradle-case combination in a landscape orientation.

Figure 15:
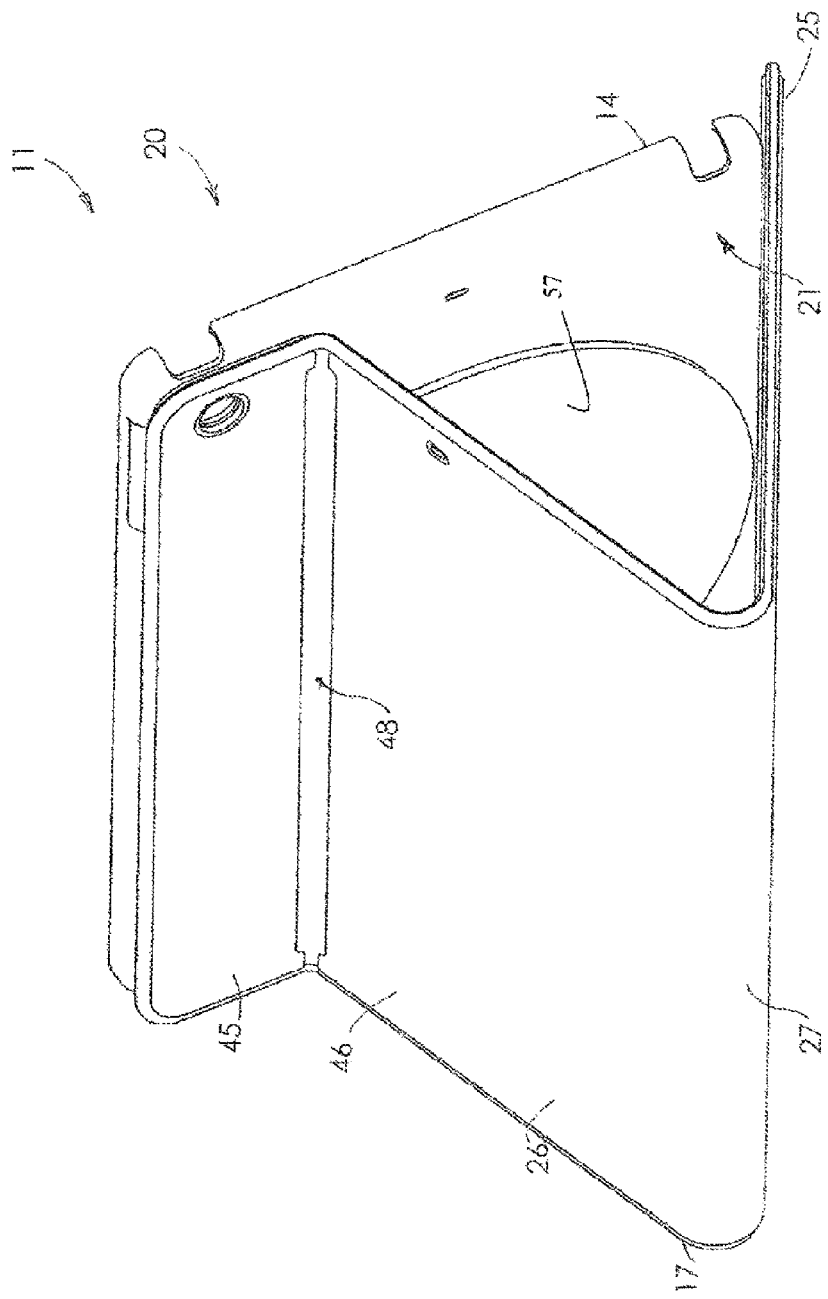

FIG. 15 is a posterior perspective view of the first alternative cradle-case combination or assembly according to the present invention in a case-open configuration for displaying the anterior device-receiving cradle portion of the first alternative cradle-case combination in a landscape orientation.

Figure 16:
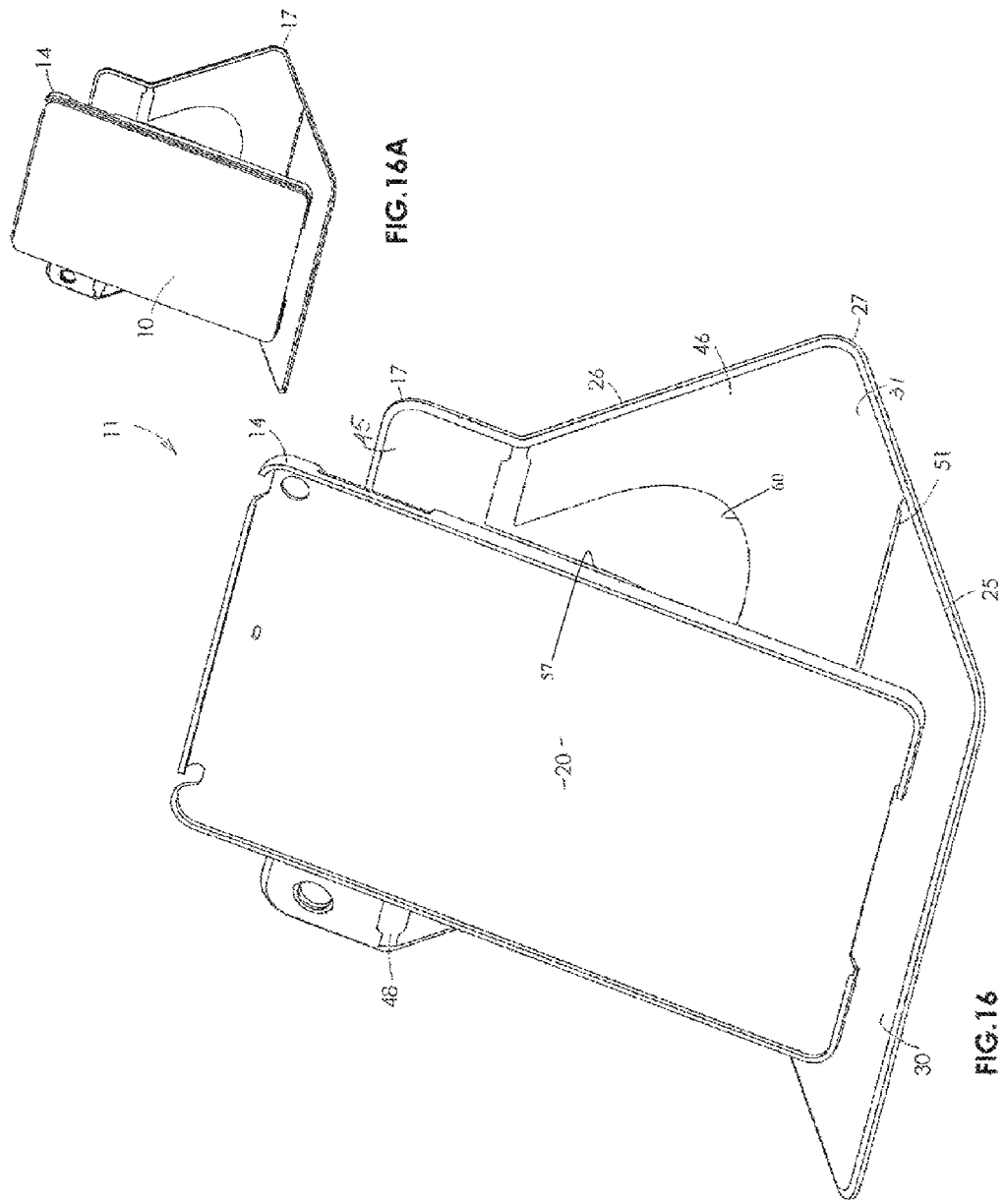

FIG. 16 is an anterior perspective view of the first alternative cradle-case combination or assembly according to the present invention in a case-open configuration for displaying the anterior device-receiving cradle portion of the first alternative cradle-case combination in a portrait orientation.

FIG. 16A is a reduced anterior perspective view of the first alternative cradle-case combination or assembly according to the present invention in a case-open configuration displaying a generic electronic device received in the anterior device-receiving cradle portion of the first alternative cradle-case combination in a portrait orientation.

Figure 17:
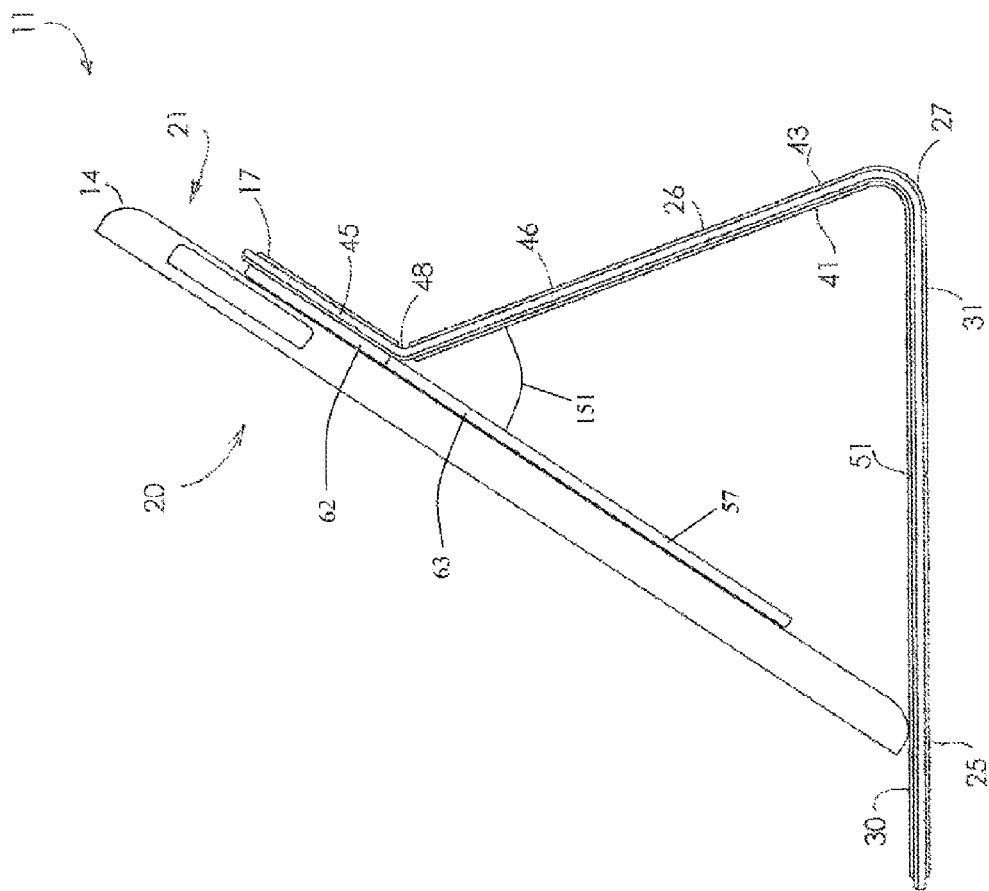

FIG. 17 is a lateral edge view of the first alternative cradle-case combination or assembly according to the present invention in a case-open configuration for displaying the anterior device-receiving cradle portion of the first alternative cradle-case combination in a portrait orientation.

Figure 18:
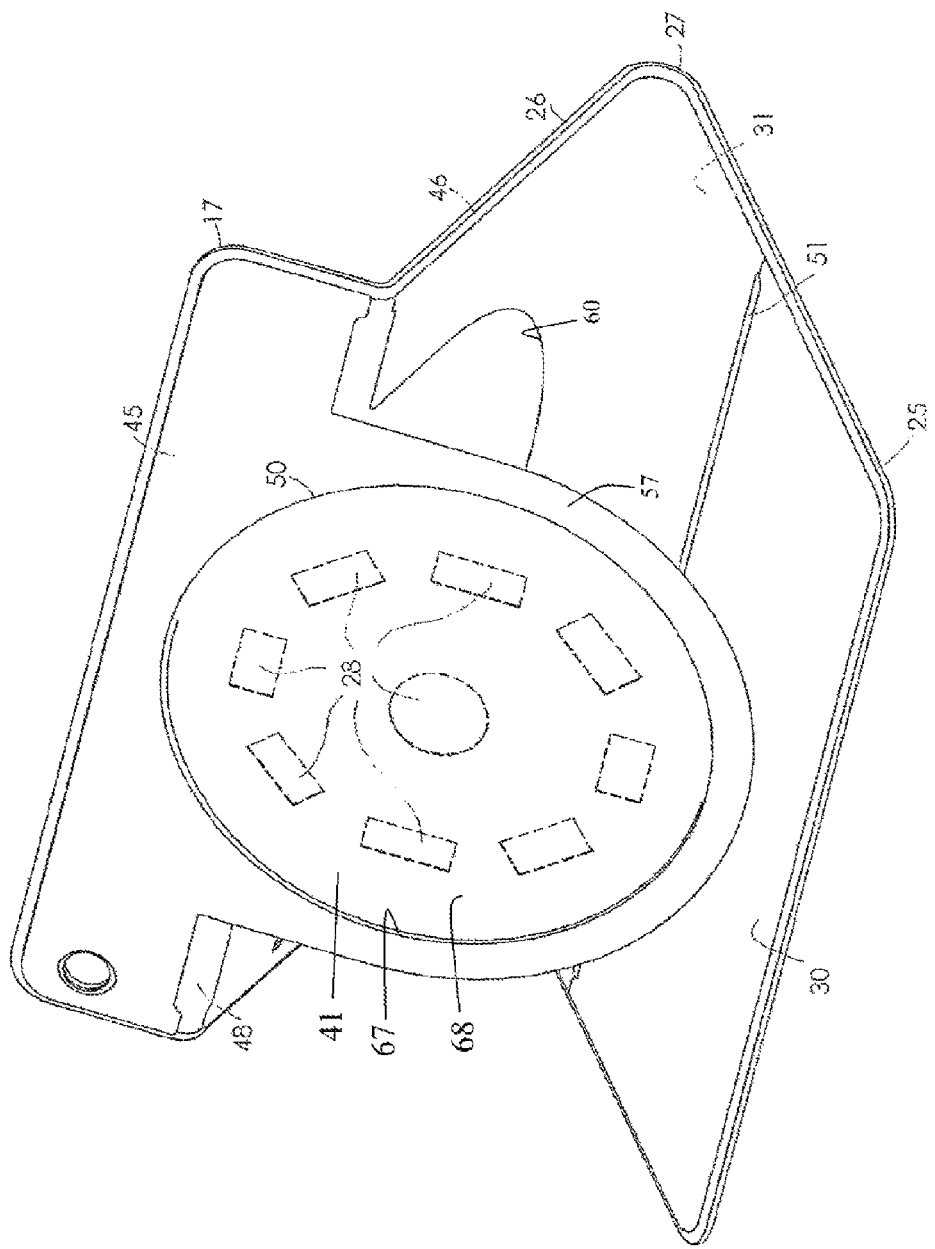

FIG. 18 is an anterior perspective view of the case construction of the first alternative cradle-case combination or assembly according to the present invention in a case-open configuration for supporting the cradle construction in either a landscape or portrait orientation.

FIG. 19 is a posterior plan view of a second alternative cradle-case combination or assembly according to the present invention in a case-closed configuration.

FIG. 20 is an anterior plan view of the second alternative cradle-case combination or assembly according to the present invention in a case-closed configuration.

Figure 21:
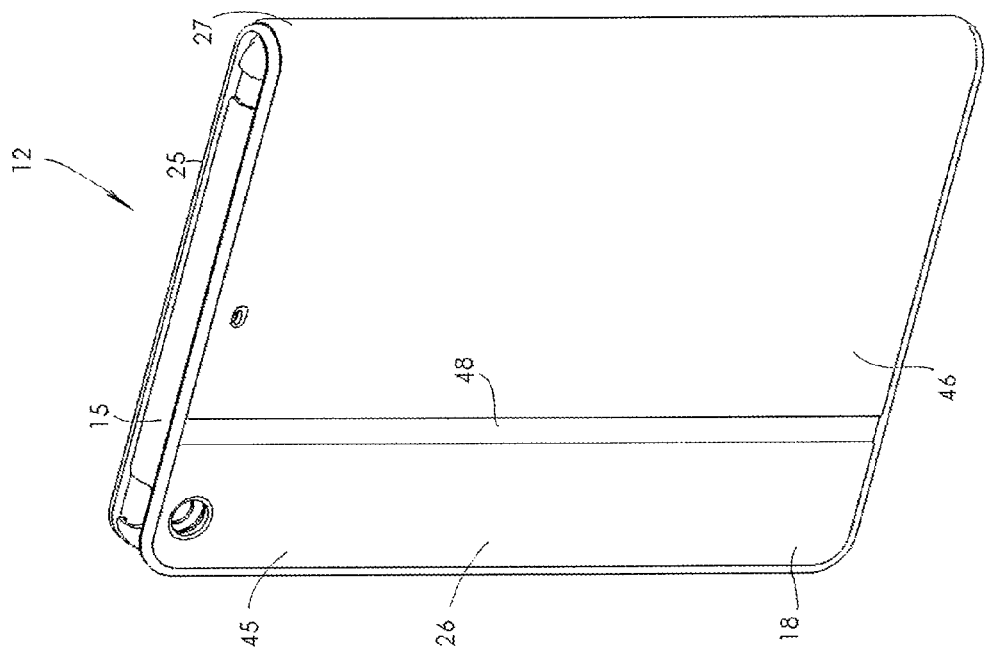

FIG. 21 is a posterior perspective view of the second alternative cradle-case combination or assembly according to the present invention in a case-closed configuration.

Figure 22:
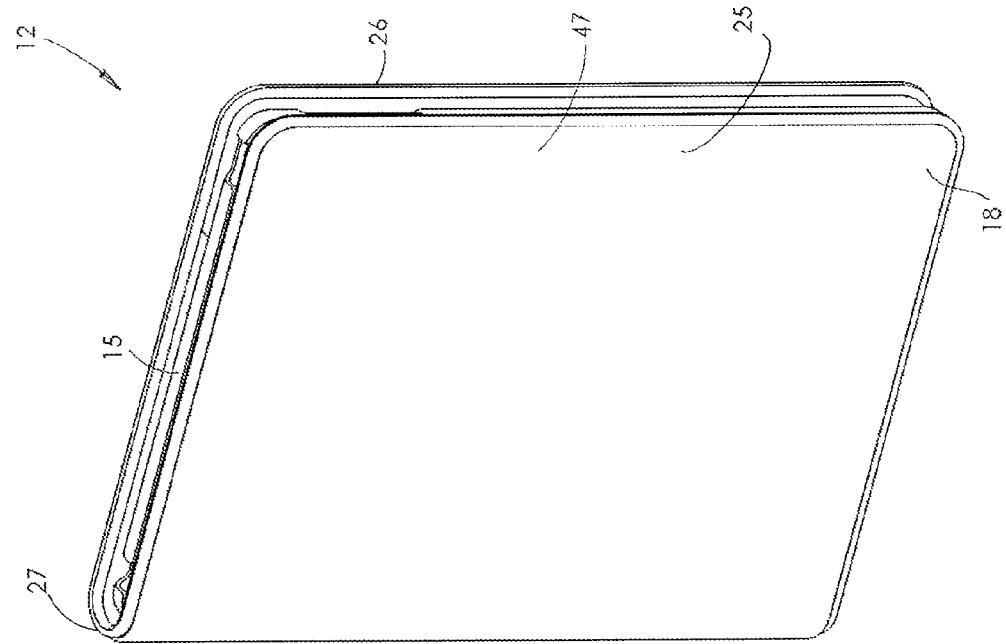

FIG. 22 is an anterior perspective view of the second alternative cradle-case combination or assembly according to the present invention in a case-closed configuration.

Figure 23:
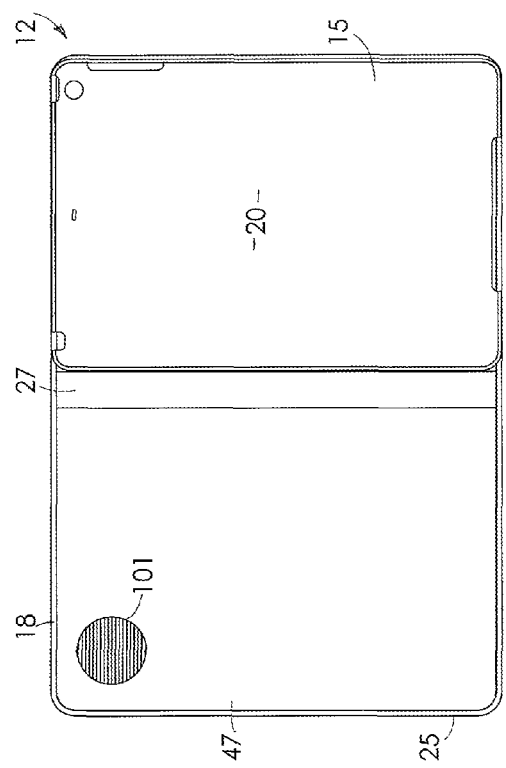

FIG. 23 is an anterior plan view of the second alternative cradle-case combination or assembly according to the present invention in a first case-open configuration showing a first (reversible) outer material layer upon an anterior case portion of the case construction of the second alternative cradle-case combination.

Figure 24:
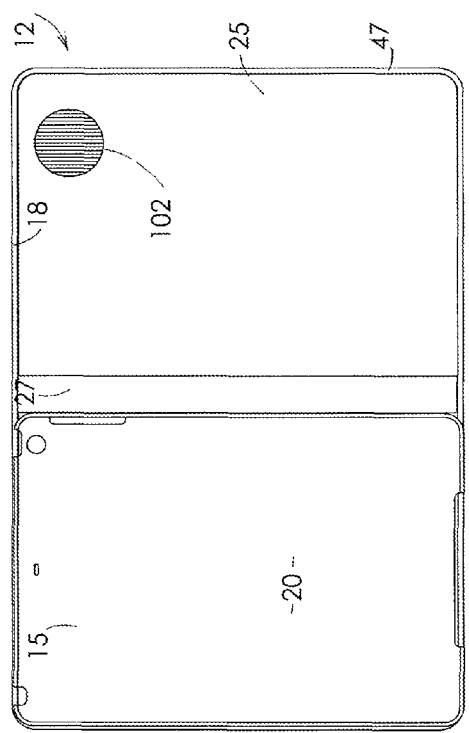

FIG. 24 is an anterior plan view of the second alternative cradle-case combination or assembly according to the present invention in a second case-open configuration showing a second (reversible) outer material layer upon an anterior case portion of the case construction of the second alternative cradle-case combination.

FIG. 25 is an anterior plan view of a case construction of the second alternative cradle-case combination or assembly according to the present invention in the second case-open configuration showing the second (reversible) outer material layer upon an anterior case portion of the case construction and depicting in broken lines a series of magnet sites otherwise hidden behind the second (reversible) outer material layer.

FIG. 26 is an anterior plan view of the case construction of the second alternative cradle-case combination or assembly according to the present invention in the second case-open configuration showing the first (reversible) outer material layer upon an anterior case portion of the case construction and depicting in broken lines a series of magnet sites otherwise hidden behind the first (reversible) outer material layer.

FIG. 27 is an exploded posterior perspective view of a cradle construction of the second alternative cradle-case combination or assembly according to the present invention showing from back to front a top or outer material layer, a lamination material layer, a series of magnets, and an assembled shell-apertured panel assembly.

Figure 28:
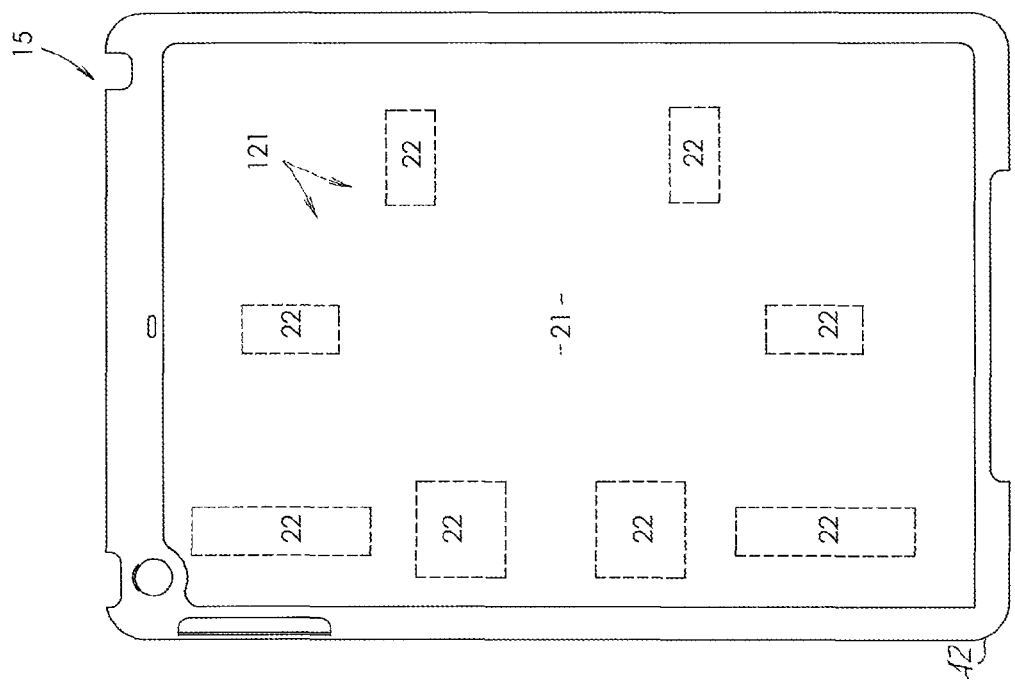

FIG. 28 is a posterior plan view of the cradle construction of the second alternative cradle-case combination or assembly according to the present invention showing in broken lines a series of magnet sites otherwise hidden from view.

Figure 29:
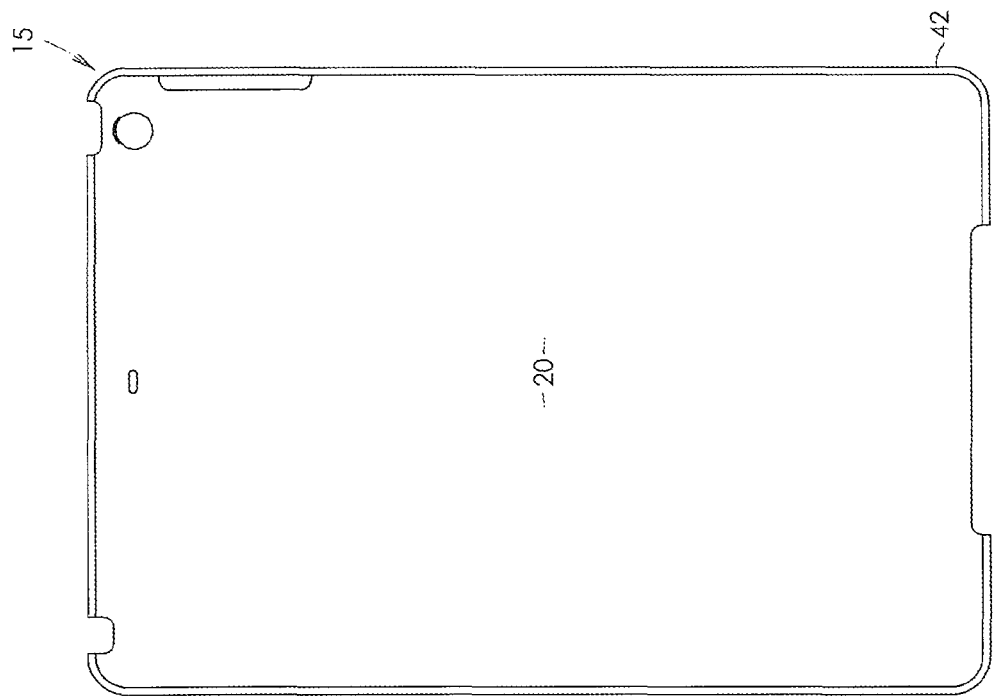

FIG. 29 is an anterior plan view of the cradle construction of the second alternative cradle-case combination or assembly according to the present invention.

FIG. 30 is a side-by-side landscape orientation comparison view of the cradle construction and case construction of the second alternative cradle-case combination or assembly according to the present invention depicting in broken lines (a) a magnet arrangement of the posterior cradle-to-case interface portion of the cradle construction, (b) a magnet arrangement of the posterior case portion of the case construction, and (c) a magnet arrangement of the anterior case portion of the case construction.

FIG. 30A is a first plan view of a first side of the case construction of the second alternative cradle-case combination or assembly according to the present invention depicting in broken lines (a) the magnet arrangement of the posterior case portion of the case construction, and (b) the magnet arrangement of the anterior case portion of the case construction.

FIG. 31A is an exploded lateral view of the cradle construction of the second alternative cradle-case combination or assembly according to the present invention showing from top to bottom a top or outer material layer, a lamination material layer, a series of magnets, an apertured panel and a shell.

FIG. 31B is an assembled lateral view of the cradle construction of the second alternative cradle-case combination or assembly according to the present invention.

Figure 32:
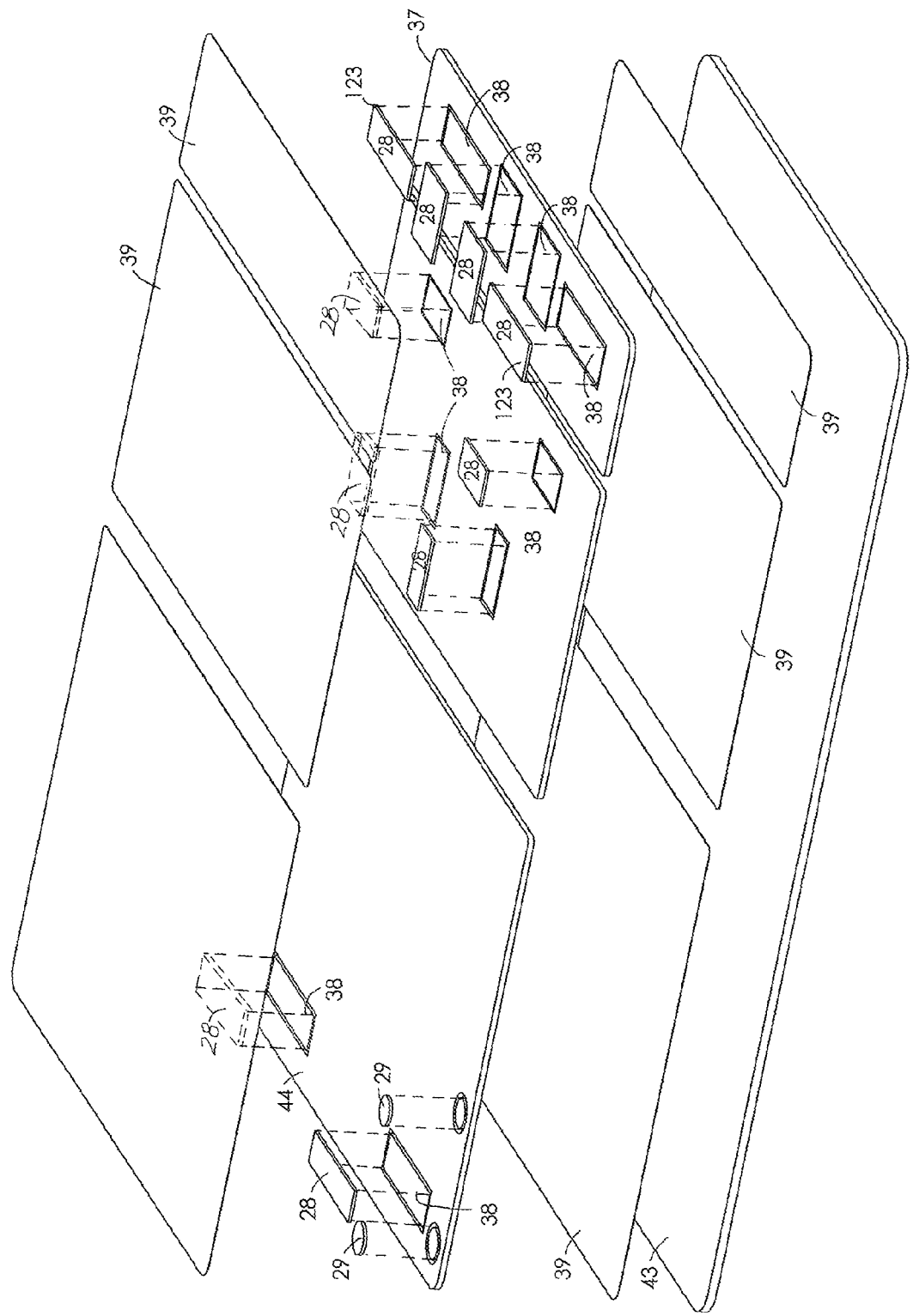

FIG. 32 is an exploded perspective view of a series of apertured panels in superior adjacency to a first outer material layer.

Figure 33:
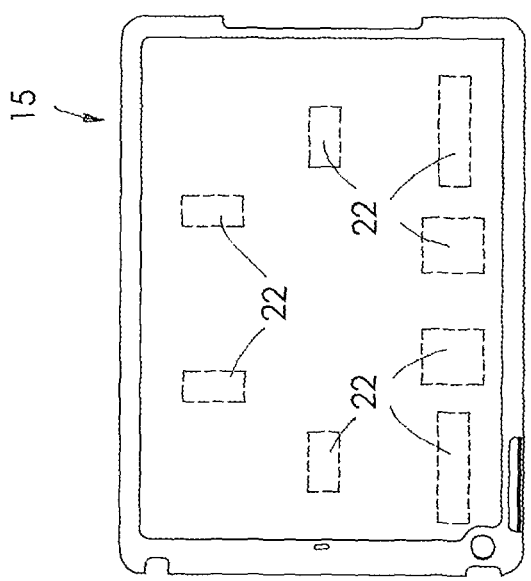

FIG. 33 is a posterior plan view of the cradle construction of the second alternative cradle-case combination or assembly according to the present invention depicting in broken lines the magnet arrangement of the posterior cradle-to-case interface portion of the cradle construction.

Figure 34:
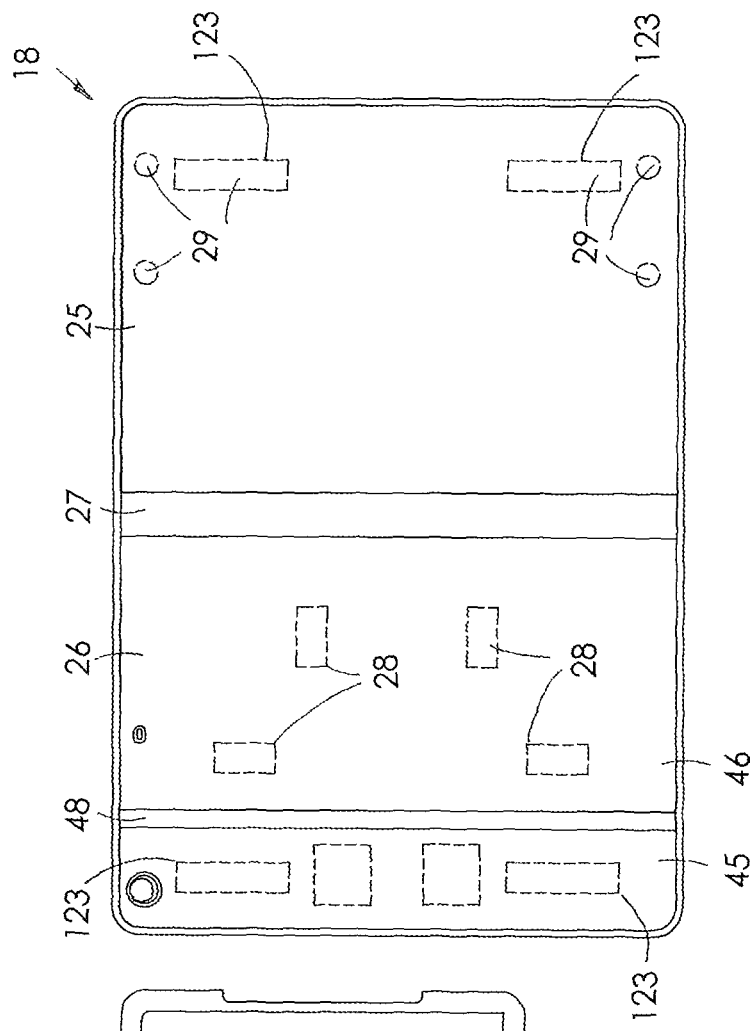

FIG. 34 is a second plan view of the first side of the case construction of the second alternative cradle-case combination or assembly according to the present invention depicting in broken lines (a) the magnet arrangement of the posterior case portion of the case construction, and (b) the magnet arrangement of the anterior case portion of the case construction.

FIG. 35 is an enlarged diagrammatic depiction of a section of an apertured panel with magnets received in apertures formed in the apertured panel with lamination material layers in solid lines securing the magnets within the apertures, and lamination layers in broken lines to depict prior movement of the lamination material layers in the direction of the apertured panel.

Figure 36A:
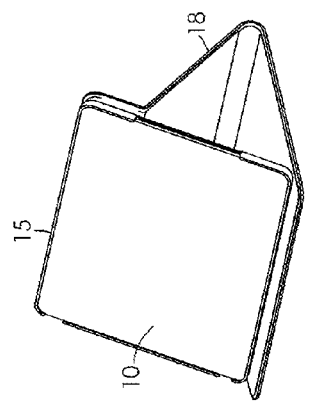
Figure 36:
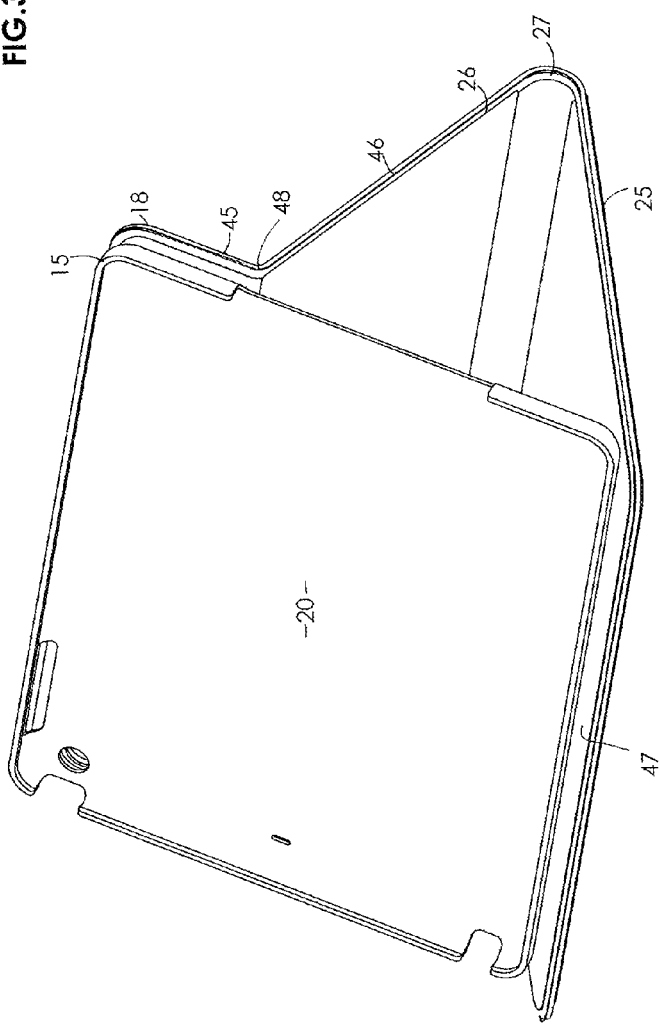

FIG. 36 is an anterior perspective view of the second alternative cradle-case combination or assembly according to the present invention in a case-open configuration for displaying the anterior device-receiving cradle portion of the second alternative cradle-case combination in a landscape orientation.

FIG. 36A is a reduced anterior perspective view of the second alternative cradle-case combination or assembly according to the present invention in a case-open configuration for displaying a generic electronic device as cradled by the anterior device-receiving cradle portion of the second alternative cradle-case combination in a landscape orientation.

FIG. 37 is an anterior perspective view of the second alternative cradle-case combination or assembly according to the present invention in a case-open configuration for displaying a generic electronic device as cradled by the anterior device-receiving cradle portion of the second alternative cradle-case combination in a portrait orientation.

FIG. 37A is a reduced anterior perspective view of the second alternative cradle-case combination or assembly according to the present invention in a case-open configuration for displaying the anterior device-receiving cradle portion of the second alternative cradle-case combination in a portrait orientation.

Figure 38:
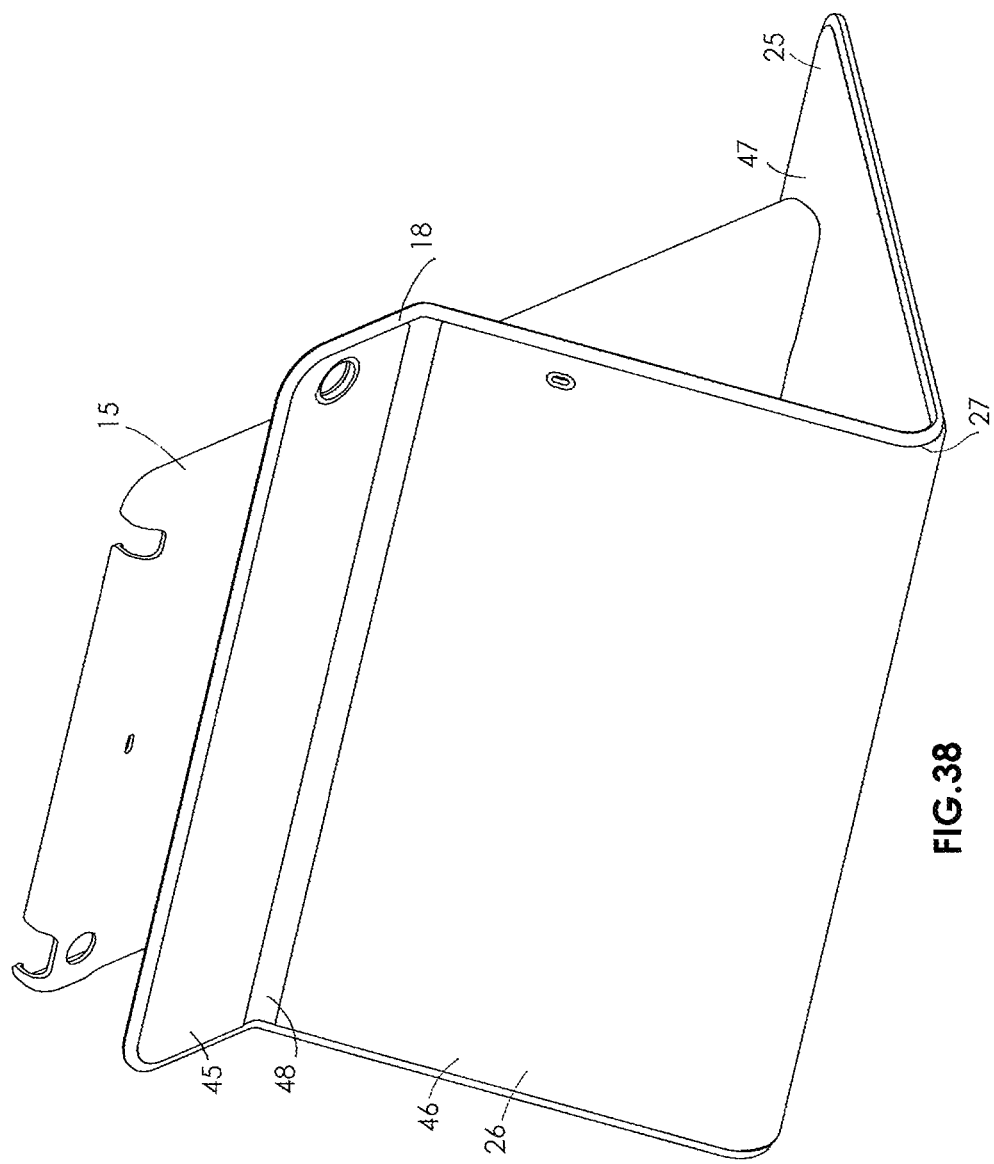

FIG. 38 is a posterior perspective view of the second alternative cradle-case combination or assembly according to the present invention in a case-open configuration for displaying the anterior device-receiving cradle portion of the second alternative cradle-case combination in a portrait orientation.

Figure 39:
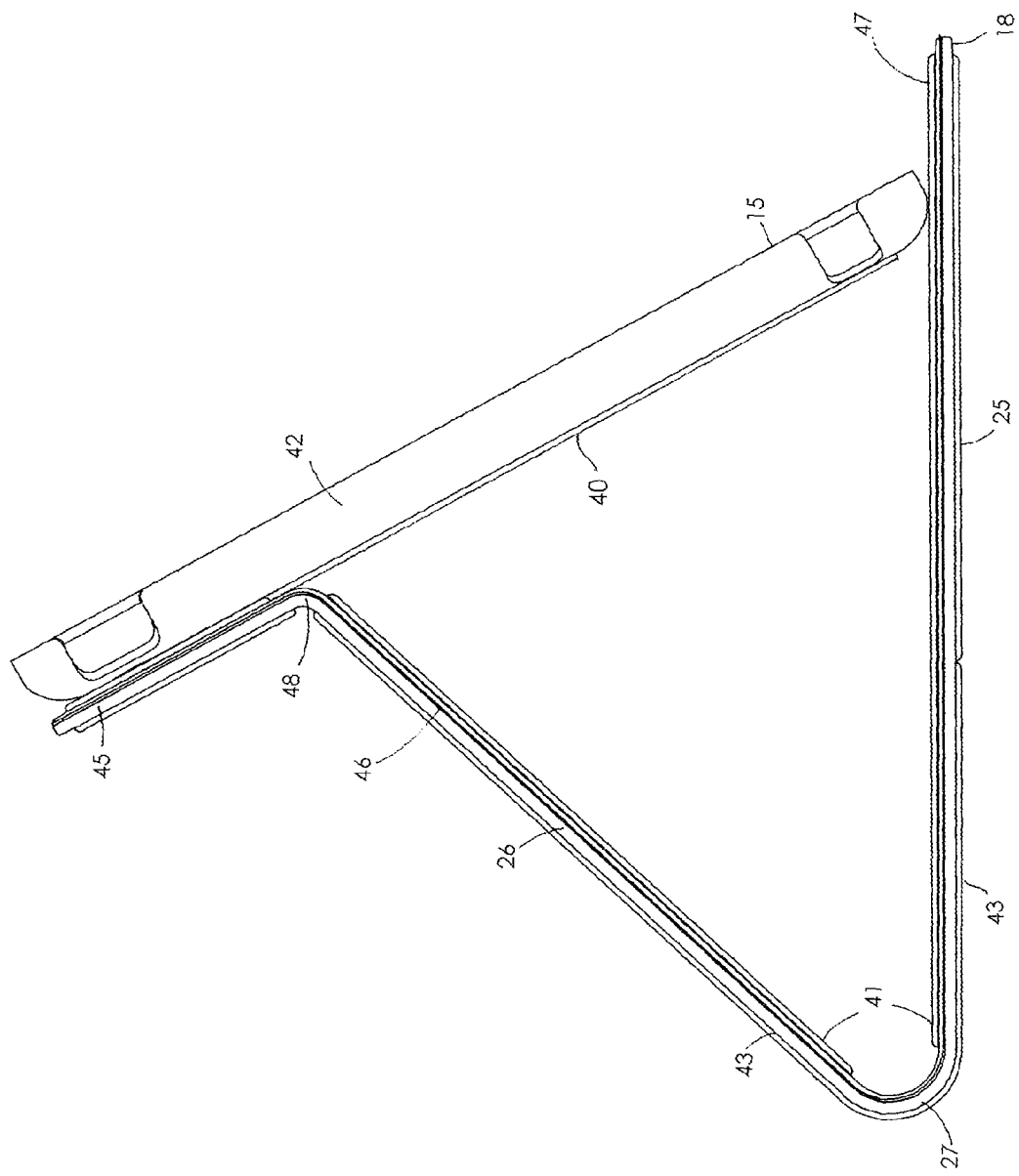

FIG. 39 is a lateral edge view of the second alternative cradle-case combination or assembly according to the present invention in a case-open configuration for displaying the anterior device-receiving cradle portion of the second alternative cradle-case combination in a landscape orientation.

Figure 40:
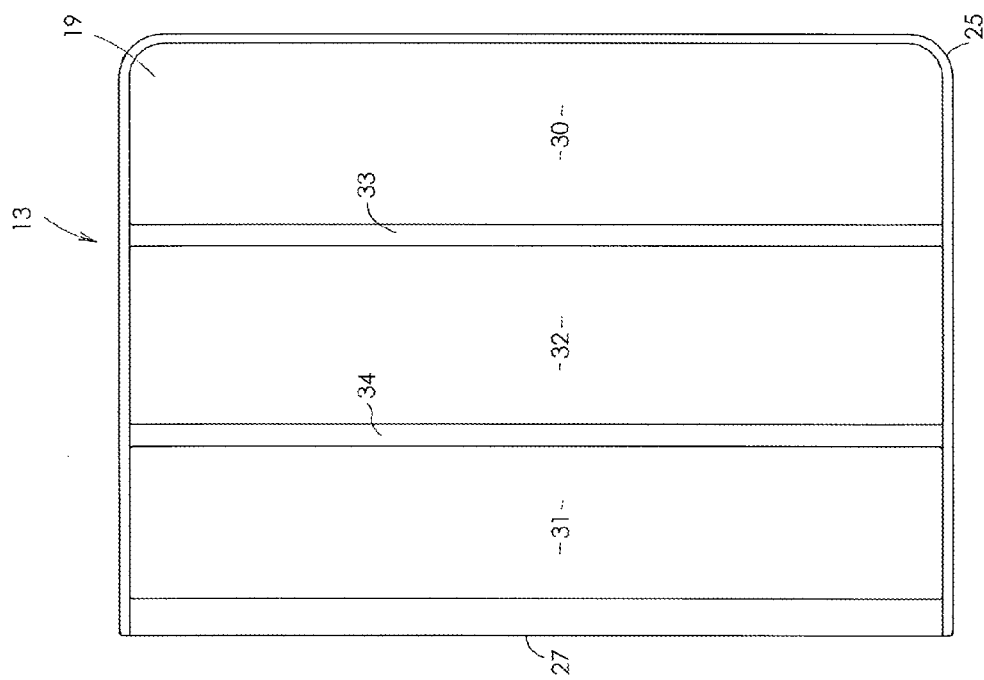

FIG. 40 is an anterior plan view of a third alternative cradle-case combination or assembly according to the present invention in a case-closed configuration.

Figure 41:
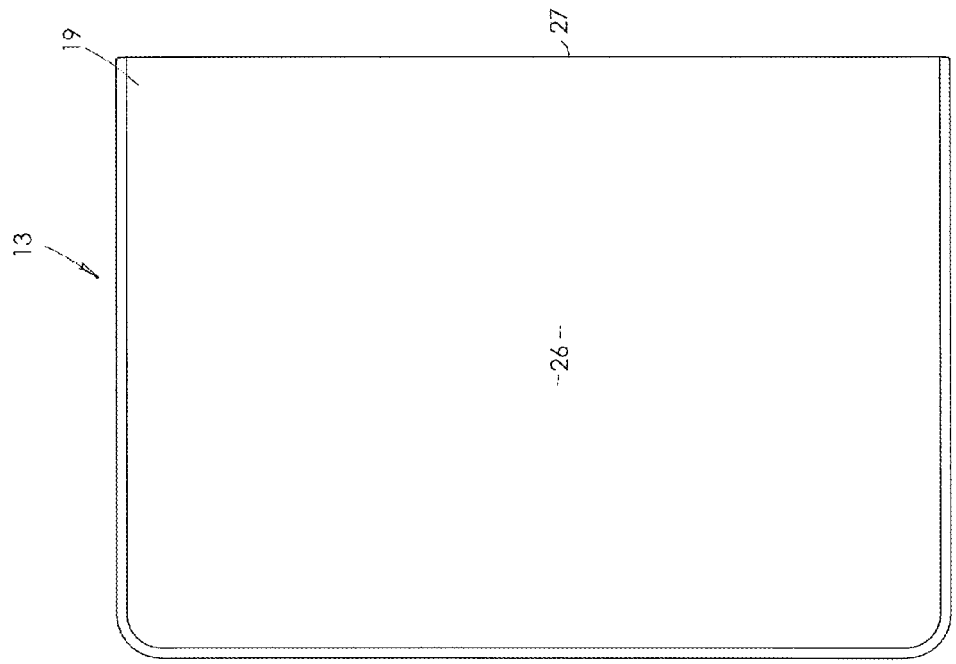

FIG. 41 is a posterior plan view of the third alternative cradle-case combination or assembly according to the present invention in a case-closed configuration.

Figure 42:
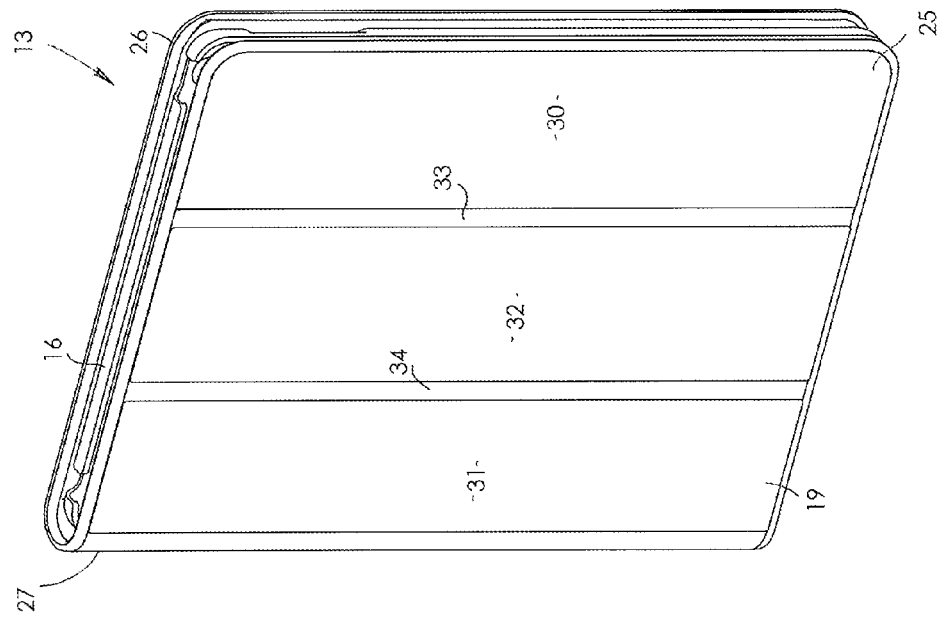

FIG. 42 is an anterior perspective view of the third alternative cradle-case combination or assembly according to the present invention in a case-closed configuration.

Figure 43:
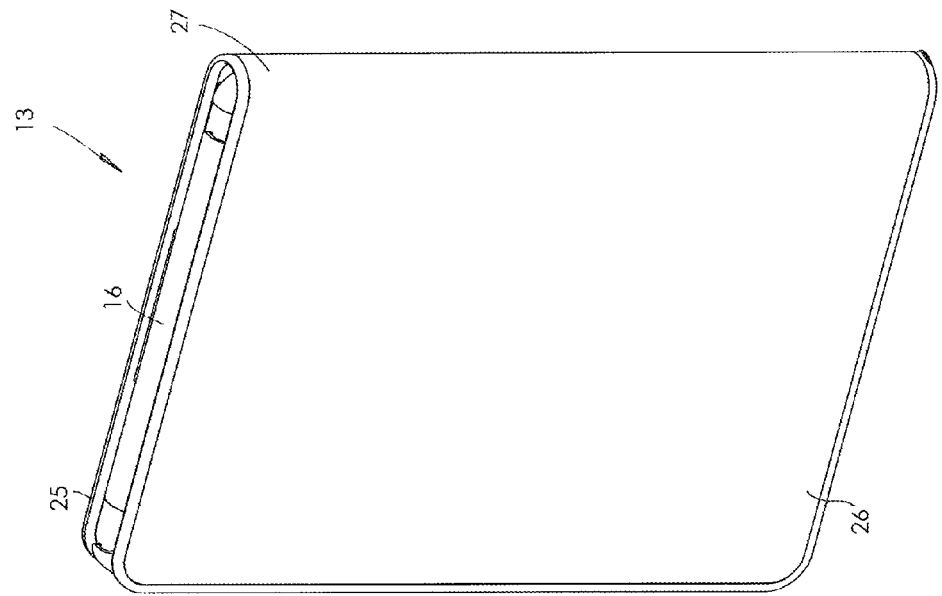

FIG. 43 is a posterior perspective view of the third alternative cradle-case combination or assembly according to the present invention in a case-closed configuration.

Figure 44:
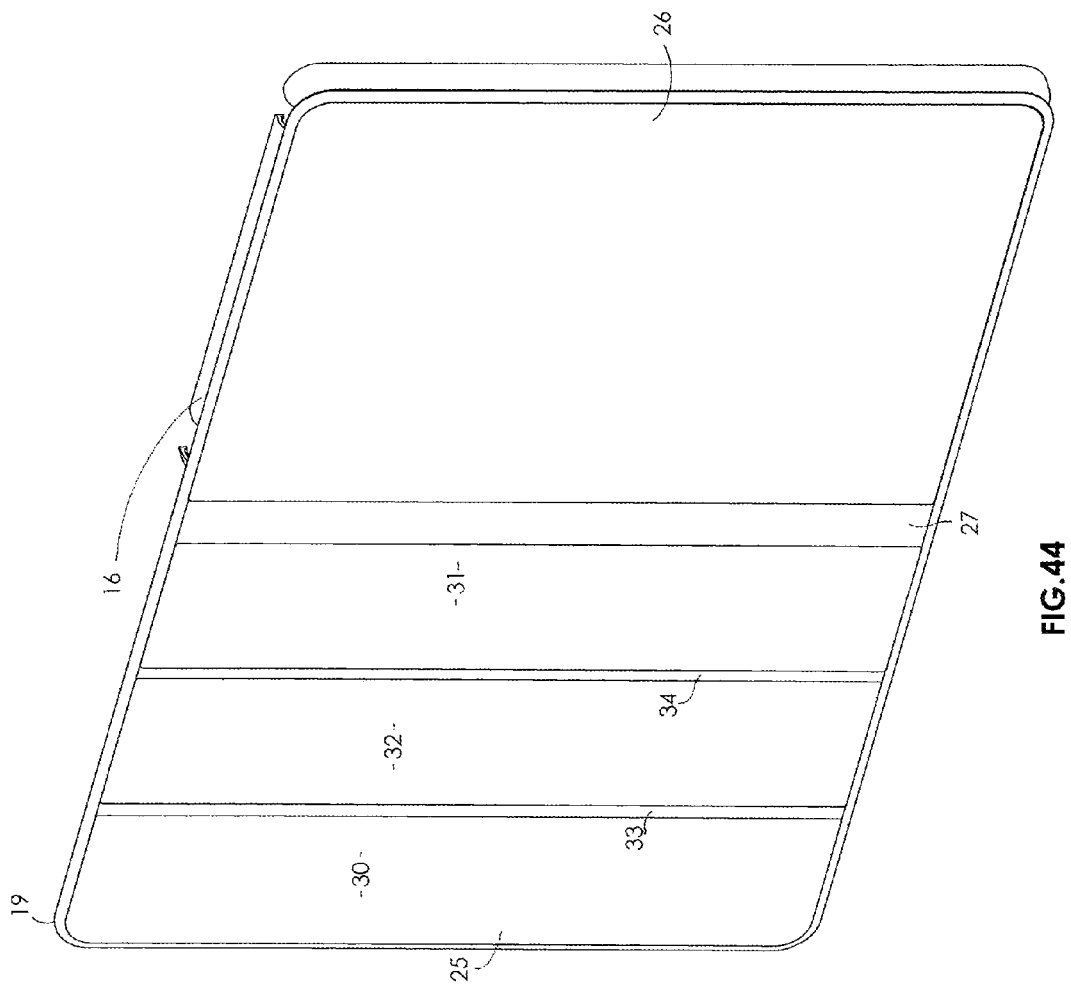

FIG. 44 is a posterior perspective view of the third alternative cradle-case combination or assembly according to the present invention in a first case-open configuration.

FIG. 45 is an anterior perspective view of the third alternative cradle-case combination or assembly according to the present invention in the first case-open configuration showing a first (reversible) outer material layer upon an anterior case portion of the case construction of the third alternative cradle-case combination.

FIG. 46 is an anterior perspective view of the third alternative cradle-case combination or assembly according to the present invention in a second case-open configuration showing a second (reversible) outer material layer upon an anterior case portion of the case construction of the third alternative cradle-case combination.

FIG. 47A is an exploded perspective view of a series of apertured panels outfitted with magnet sites intermediate (a) first and second, upper and lower lamination material layers and (b) first and second, upper and lower outer material layers.

FIG. 47B is an assembled perspective view of the structures otherwise depicted in FIG. 47A, the magnet sites being depicted in broken lines as otherwise hidden behind the first upper outer material layer.

Figure 48:
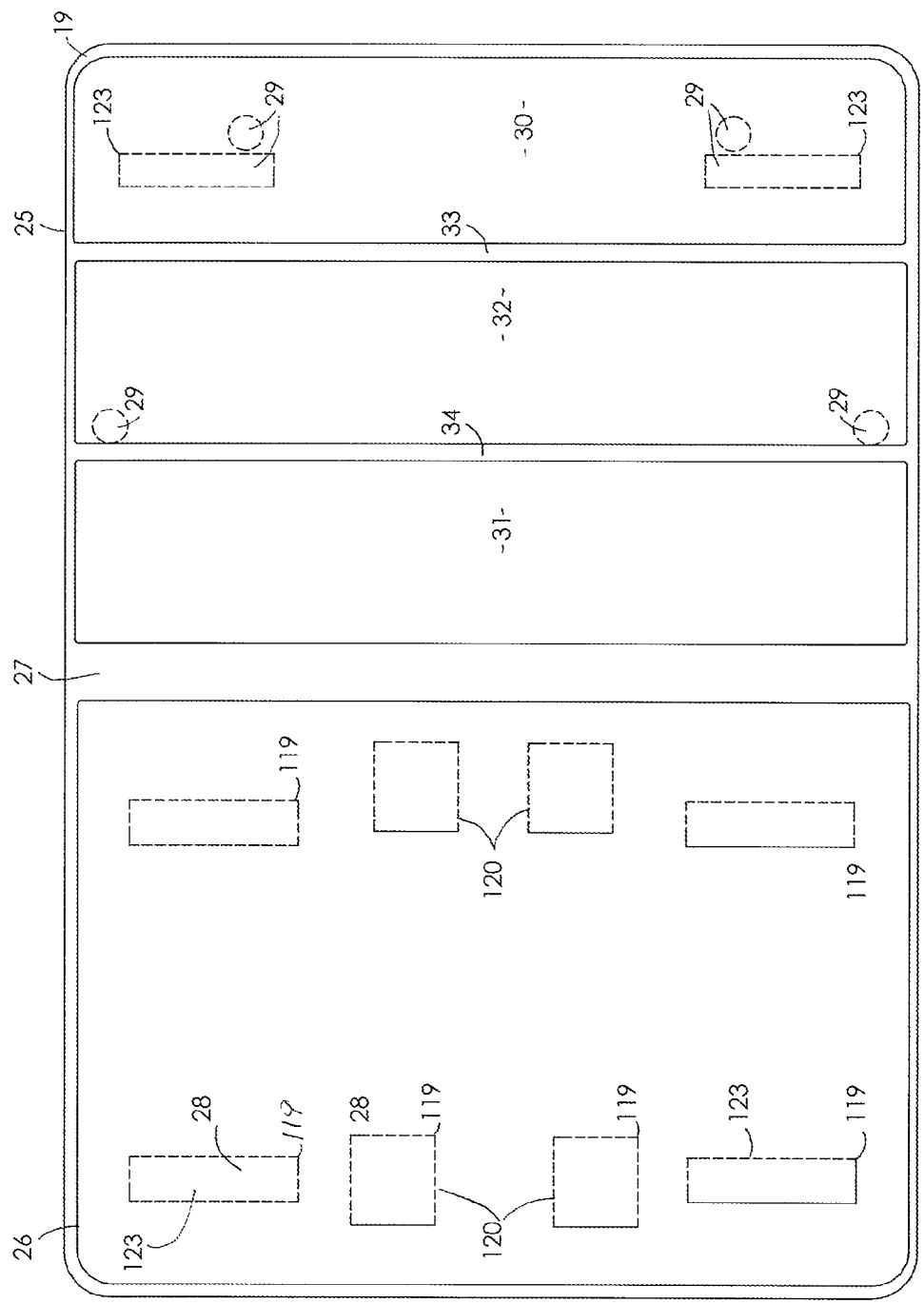

FIG. 48 is a plan view of a first side of the case construction of the third alternative cradle-case combination or assembly according to the present invention depicting in broken lines (a) the magnet arrangement of the posterior case portion of the case construction, and (b) the magnet arrangement of the anterior case portion of the case construction.

Figure 49:
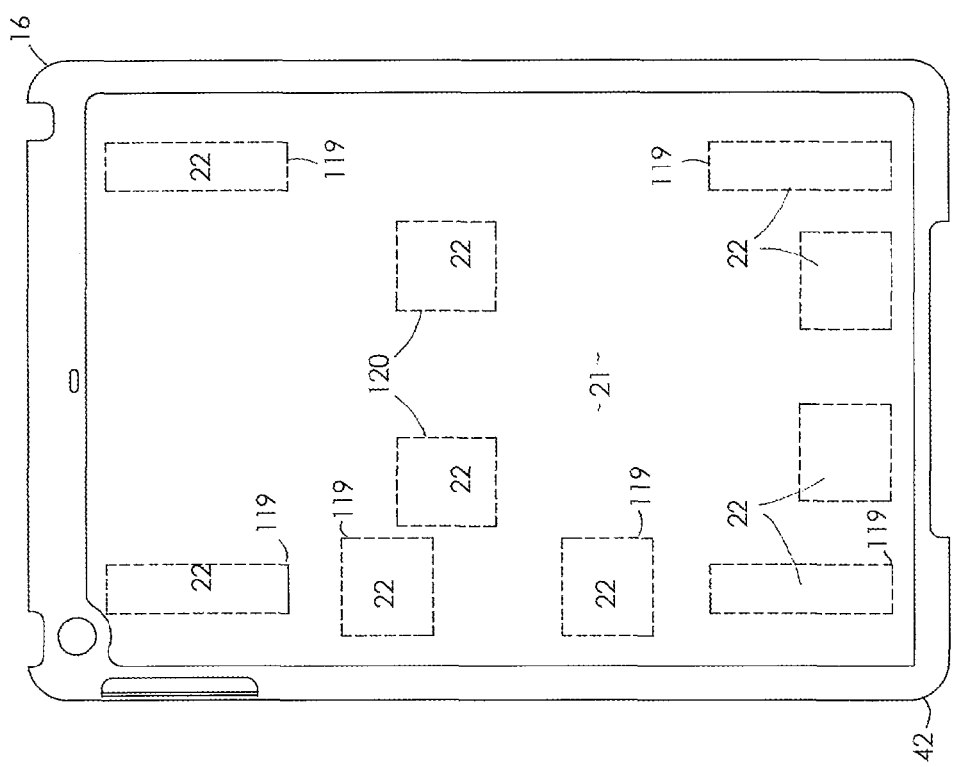

FIG. 49 is a posterior plan view of the cradle construction of the third alternative cradle-case combination or assembly according to the present invention depicting in broken lines the magnet arrangement of the posterior cradle-to-case interface portion of the cradle construction.

Figure 50:
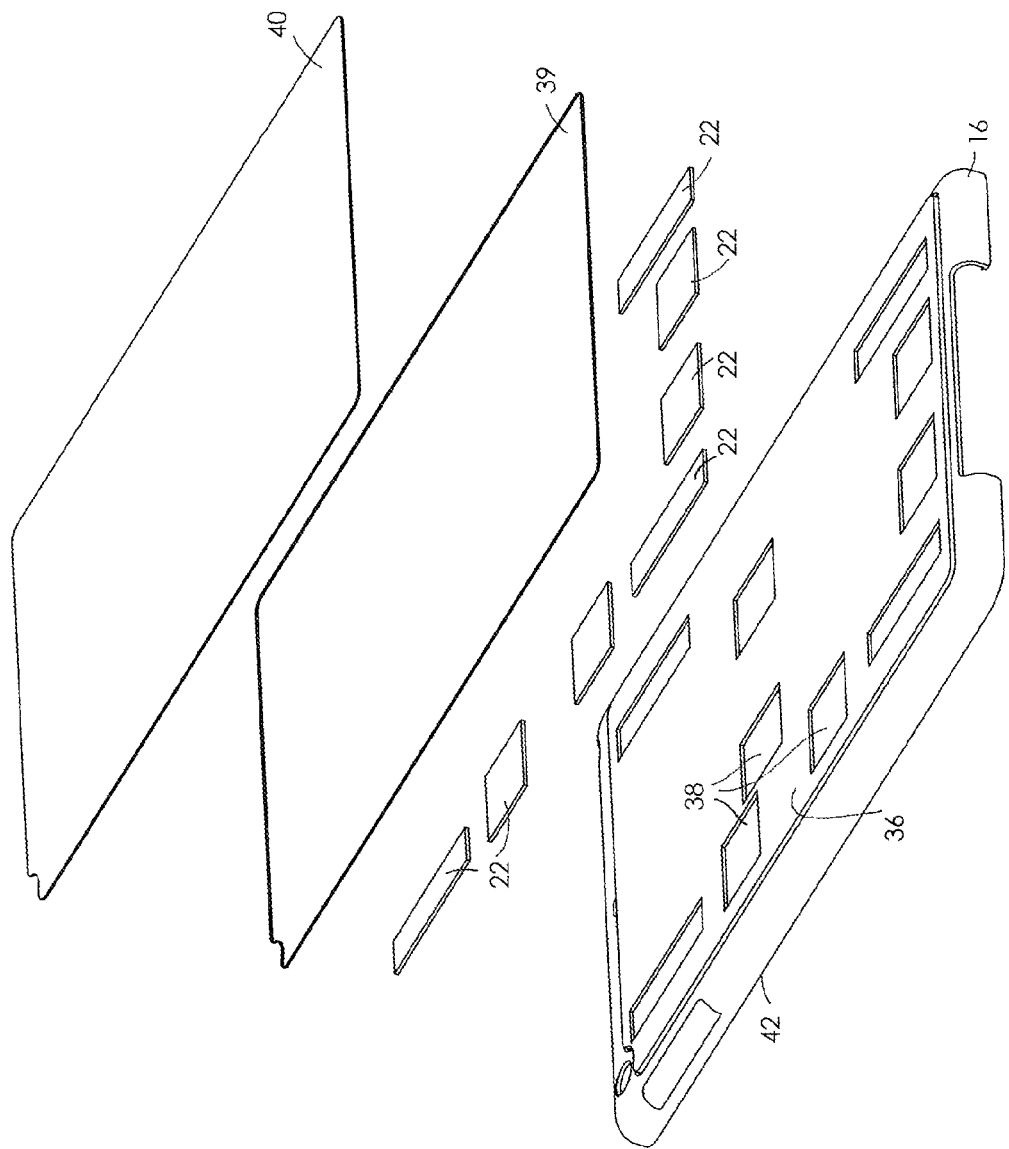

FIG. 50 is an exploded posterior perspective view of the cradle construction of the third alternative cradle-case combination or assembly according to the present invention showing from back to front a top or outer material layer, a lamination material layer, a series of magnets, and an assembled shell-apertured panel assembly.

Figure 51:
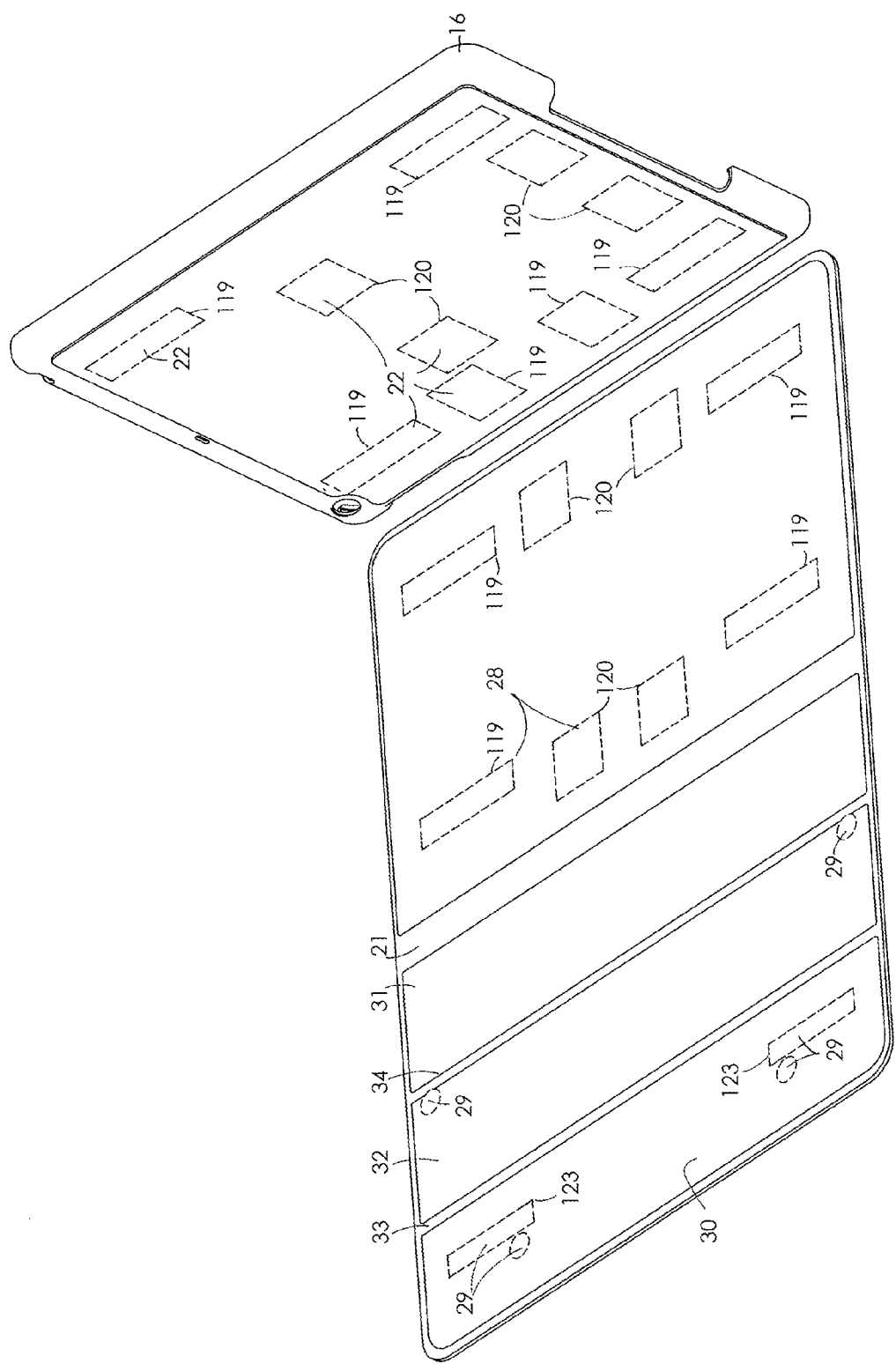

FIG. 51 is a first exploded view of the cradle construction and case construction of the third alternative cradle-case combination or assembly according to the present invention showing the cradle construction in posterior perspective and showing the case construction in a first anterior perspective with various magnet arrangements being depicted in broken lines as otherwise hidden behind concealing outer material layers.

FIG. 52 is a second exploded view of the cradle construction and case construction of the third alternative cradle-case combination or assembly according to the present invention showing the cradle construction in posterior perspective and showing the case construction in a first anterior perspective with various magnet arrangements being depicted in broken lines as otherwise hidden behind concealing outer material layers.

FIG. 53A is an exploded lateral view of the cradle construction of the third alternative cradle-case combination or assembly according to the present invention showing from top to bottom a top or outer material layer, a lamination material layer, a series of magnets, an apertured panel and a shell.

FIG. 53B is an assembled lateral view of the cradle construction of the third alternative cradle-case combination or assembly according to the present invention.

Figure 54:
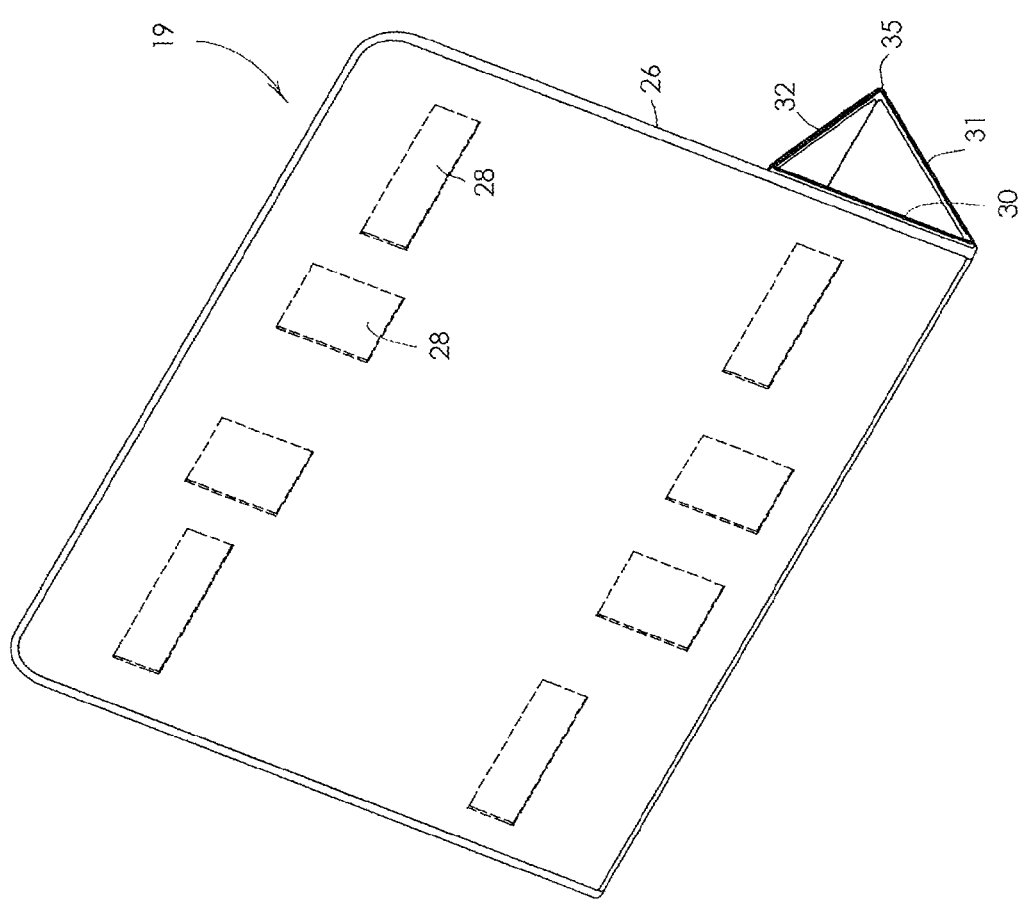

FIG. 54 is an anterior perspective view of the case construction of the third alternative cradle-case combination or assembly according to the present invention in a case-open configuration for supporting the cradle construction in either a landscape or portrait orientation and depicting in broken lines a magnet arrangement of the posterior case portion otherwise hidden behind a second (reversible) outer material layer.

Figure 55:
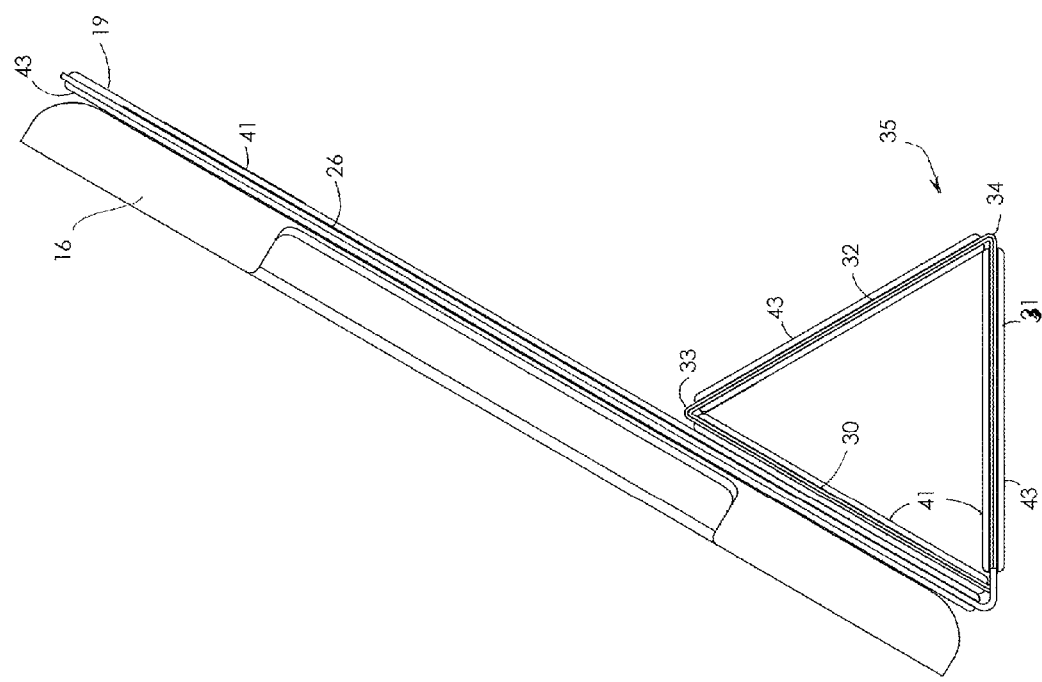

FIG. 55 is a lateral edge view of the third alternative cradle-case combination or assembly according to the present invention in a case-open configuration for displaying the anterior device-receiving cradle portion of the third alternative cradle-case combination in a landscape orientation.

Figure 56:
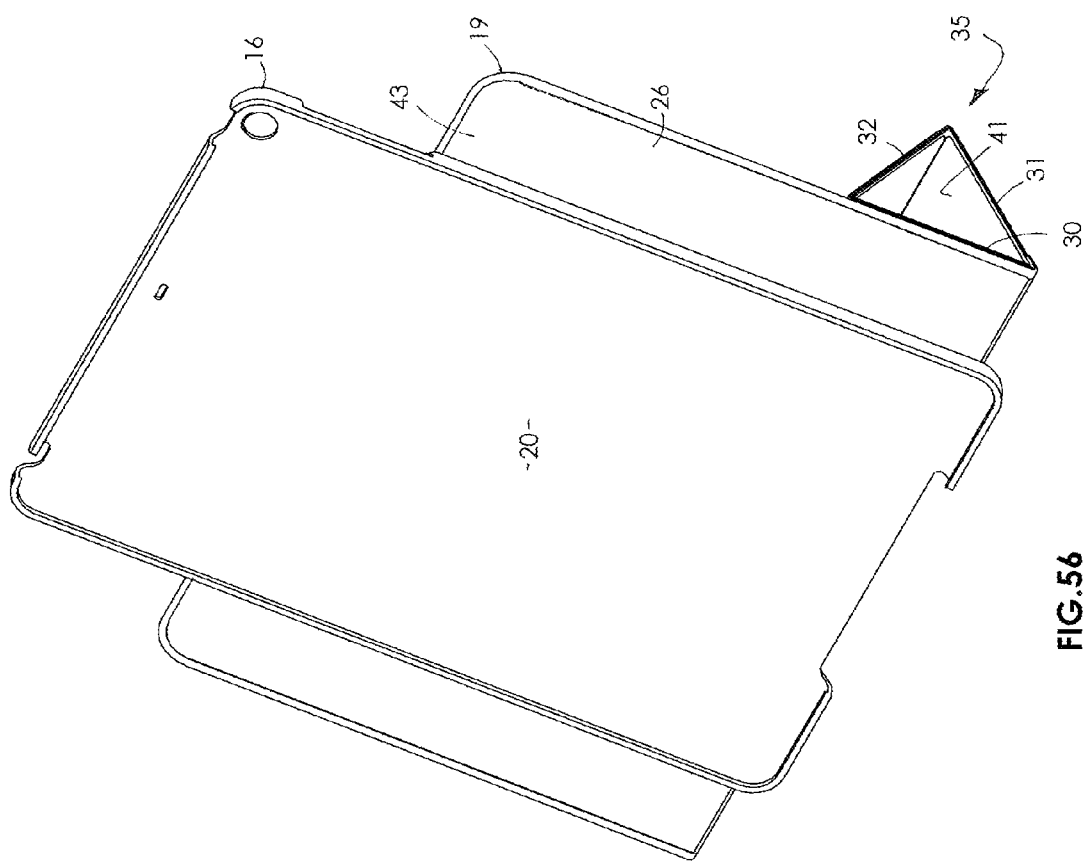

FIG. 56 is an anterior perspective view of the third alternative cradle-case combination or assembly according to the present invention in a case-open configuration for displaying the anterior device-receiving cradle portion of the third alternative cradle-case combination in a portrait orientation.

Figure 57:
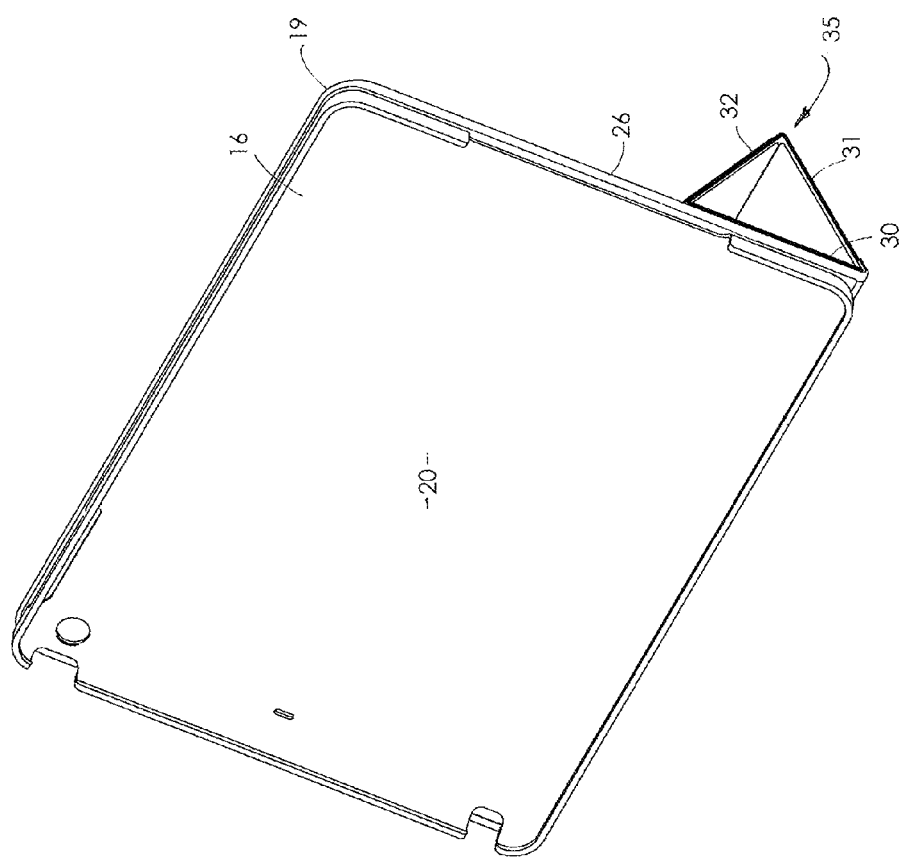

FIG. 57 is an anterior perspective view of the third alternative cradle-case combination or assembly according to the present invention in a case-open configuration for displaying the anterior device-receiving cradle portion of the third alternative cradle-case combination in a landscape orientation.

DETAILED DESCRIPTION OF THE PREFERRED EMBODIMENTS

Referring now to the drawings with more specificity, the present invention preferably provides a cradle-case combination or assembly as variously depicted and referenced at assembly or embodiment 11; assembly or embodiment 12; and assembly or embodiment 13 for encasing and selectively displaying an electronic device, such as a smart phone, tablet computer, personal digital assistant, or similar other device as generically depicted and referenced at 10. Each cradle-case combination or assembly referenced at embodiments 11, 12, and 13 essentially comprises a cradle construction and a case construction whereby the cradle construction is removably and adjustably attached to the respective case construction via certain magnetic means for attachment.

With regard to the cradle construction(s) according to the present invention, the cradle construction of embodiment 11 is depicted and referenced at 14; the cradle construction of embodiment 12 is depicted and referenced at 15; and the cradle construction of embodiment 13 is depicted and referenced at 16. With regard to the case construction(s) according to the present invention, the case construction of embodiment 11 is depicted and referenced at 17; the case construction of embodiment 12 is depicted and referenced at 18; and the case construction of embodiment 13 is depicted and referenced at 19.

Each cradle construction 14, 15, and 16 is preferably sized and shaped to removably receive a select electronic device 10, and preferably comprises an anterior device-receiving cradle portion as at 20, a posterior cradle-to-case interface portion as at 21, a cradle width as at 65 and a cradle length as at 66. The posterior cradle-to-case interface portion(s) 21 preferably comprise or are cooperably associated with a magnetically attractive first material construction. The magnetically attractive first material construction may be preferably exemplified by a series of cradle-based permanent magnets 22 embedded within the posterior cradle-to-case interface portion 21.

Each case construction 17, 18, and 19 basically functions to envelope or encase the anterior device-receiving cradle portion and posterior cradle-to-case interface portion of the respective cradle constructions 14, 15, and 16 when in a closed case configuration and preferably comprises a first outer case portion or layer as at 41, a second outer case portion or layer as at 43, an anterior case portion as at 25, a posterior case portion as at 26, and an anterior-to-posterior junction section as at 27. The first outer case portion 41 and the second outer case portion of case construction 17 are not reversible and thus respectively provide or define an inner case portion 41 and an outer case portion 43.

The anterior-to-posterior junction section(s) 27 enable the user to pivot the anterior case portion(s) 25 relative to the posterior case portion(s) 26. The posterior case portion(s) 26 preferably comprise or are cooperably associated with a magnetically attractive second material construction. The magnetically attractive second material construction may be preferably exemplified by a series of case-back-based permanent magnets 28 embedded within the posterior case portion(s) 26.

The magnetically attractive first and second material constructions are thus magnetically attractive for magnetically fastening the posterior cradle-to-case interface portion 21 of each of the cradle construction(s) 11, 12, and 13 to the posterior case portion 26 of each of the case construction(s) 17, 18, and 19. The anterior case portion(s) 25 are pivotal relative to the posterior case portion(s) 26 via the anterior-to-posterior junction section(s) 27 for selectively (a) enabling an open case configuration (as generally depicted in FIGS. 5, 6, 14-17, 23, 24, 36-39, 44-46, and 55-57) for accessing the anterior device-receiving cradle portion(s) 20 and (b) enabling a closed case configuration (as generally depicted in FIGS. 1-4, 19-22, 40-43) for Covering the anterior device-receiving cradle portion(s) 20.

The posterior cradle-to-case interface portion(s) 21 and the posterior case portion(s) 26 each preferably comprise an apertured panel or construction as at cradle-based apertured panel 36 and case-back-based apertured panel 37 for respectively receiving and positioning the magnets 22 and magnets 28. In other words, the first and second material constructions as exemplified by magnets 22 and 28 are respectively received in apertures 38 formed in the apertured panels 36 and 37.

The apertured panels 36 and 37 each have a preferred material thickness that is the substantially the same as the thickness of magnets 22 and 28 as at thickness 100. To help secure the magnets 22 and 28 within the apertures 38 formed in the apertured panels 36 and 37, a thin lamination material layer 39 may be applied to one or both sides of the apertured panels 36 and 37. In other words, the posterior cradle-to-case interface portion(s) 21 and the posterior case portion(s) 26 may each preferably comprise a lamination layer for securing the first and second material constructions within the apertures 38 formed in the apertured panels 36 and 37.

A top or concealing material layer 40 covers or conceals the apertured panel(s) 36 of the cradle constructions 14, 15, and 16; a first outer or concealing material layer 41 having a first ornamental effect covers or conceals the apertured panel(s) 37 of the case constructions 17, 18, and 19 from a first direction or on a first side of the apertured panel(s) 37. The top or concealing material layer 40 is thus cooperably associated with the shell portion 42 of each of the cradle constructions 14, 15, and 16 for enclosing and/or providing the finished posterior cradle-to-case interface portion(s) 21. A second outer or concealing material layer 43 having a second ornamental effect covers or conceals the apertured panel(s) 37 of the case constructions 17, 18, and 19 from a second direction or on a second side of the apertured panel(s) 37.

Notably, the apertures 38 formed in the apertured panel 37 of the posterior case portion or construction 26 preferably extend orthogonally through the entire said apertured panel 37, and the second material construction as exemplified by magnets 28, being received in said apertures 38, thereby enable bidirectional or oppositely directed magnetic attractive forces via the apertured panel 37 as at arrows 103 in FIG. 35. Further, the first outer or concealing material layer 41 has a first ornamental effect as generically depicted by a first set of representative horizontal hatch markings 101, and that the second outer or concealing material layer 43 has a second ornamental effect as generically depicted by a second set of representative vertical hatch markings 102.

The present invention contemplates case construction(s) 18 and 19 wherein the first and second outer case portions or layers 41 and 43 are reversible and comprise differing ornamental appearances. Case construction 17 is not reversible, and thus the first and second outer case portions or layers 41 and 43 of case construction 17 remain fixed as an inner cradle-opposing case portion layer and an outer exposed case portion layer. The differing ornamental appearances of the reversible first and second outer case portions or layers 41 and 43 of case constructions 18 and 19 enable the user to selectively display an outer case material. The bi-directional magnetic attraction as at arrows 103 further enable the user to magnetically fasten the posterior cradle-to-case interface portion(s) 21 of the cradle construction(s) 15 and 16 to either of two reversible sides/layers 41 or 43 of the posterior case portion(s) 26 of the case construction(s) 18 and 19.

The anterior case portion(s) 25 of the case constructions 18 and 19 may further preferably comprise a magnetically attractive third material construction as preferably exemplified by a series of case-front-based permanent magnets 29. The third material construction is thus magnetically attractive to a select material construction as selected from the group consisting of the first and second material constructions. In other words, the anterior case portion(s) 25 of the case constructions 18 and 19 may thus magnetically attach to either the posterior cradle-to-case interface portion(s) 21 of the cradle constructions 15 and 16 or magnetically attach to posterior case portion(s) 26 of case constructions 18 and 19. The third material construction structurally affiliated with the anterior case portions 25 thus enhances the user's ability to selectively fasten alternative portions of the cradle-case combination(s) 12 and 13.

Similar to the posterior case portion(s) 26, the anterior case portion(s) 25 of case constructions 18 and 19 may also preferably comprise at least one apertured panel as at 44. Notably, the apertures 38 formed in the apertured panel 44 of the anterior case portion or construction(s) 25 preferably extend orthogonally through the entire apertured panel 44, and the third material construction as exemplified by magnets 29, being received in the apertures 38, thereby enable bidirectional or oppositely directed magnetic attractive forces via the apertured panel 44 as otherwise referenced at arrows 103 in FIG. 35.

The cradle-case combinations or embodiments 11 and 13 preferably comprise case constructions 17 and 19 with anterior case portions 25 that further preferably comprises at least a two-panel construction. In this regard, the at least two-panel construction of the anterior case portion(s) 25 of the case constructions 17 and 19 of embodiments 11 and 13 preferably comprises at least a distal anterior panel as at 30 and a proximal anterior panel as at 31 with a junction section therebetween (as referenced at 51 in connection with case construction 17). Junction section 51 enables the distal anterior panel 30 to pivot relative to the proximal panel 31 in case construction 17.

Case construction 19 further provides a three-panel construction including a distal-to-proximal junction panel as at 32, a distal junction section as at 33, and a proximal junction section as at 34. The distal junction section 33 enables the distal anterior panel 30 to pivot relative to the distal-to-proximal junction panel 32, and the proximal junction section 34 enables the distal-to-proximal junction panel 32 to pivot relative to the proximal panel 31. Together, the panels 30, 31, and 32 of the three-panel construction enabling the user to form a triangular anterior case portion as at 35. When outfitted with case-front-based permanent magnets 29 or the third material construction, the triangular anterior case portion 35 may magnetically attach to the posterior case portion 26 of case construction 19.

The posterior case portion 26 may thus be propped by the triangular anterior case portion 35 and magnetically held in a propped position via magnetic attractions between the triangular anterior case portion 35 and the posterior case portion 26 as generally depicted in FIGS. 54-57. In this regard, it will be seen that the distal anterior panel 30 preferably comprises the magnetically attractive third material construction such that the third material construction of the distal anterior panel 30 is magnetically fastenable to the second material construction of the posterior case portion 26 for maintaining the triangular anterior case portion 35 in fastened engagement to the posterior case portion 26. The formation of the triangular anterior case portion 35 thus effectively enhances the user's ability to selectively display the anterior device-receiving cradle portion 20 of the cradle construction 16.

The posterior case portion(s) 26 may further be defined by preferably comprising a distal posterior panel as at 45 and a proximal posterior panel as at 46 separated by a posterior junction section 48. Similarly, the anterior case portion(s) 25 may be further defined by comprising distal most panel (as at anterior panel 30) or portion (relative to the section 27) as at portion 47. The distal posterior panel 45 is pivotal relative to the proximal posterior panel 46 via the posterior junction section 48. The distal posterior panel 45 preferably comprises the second material construction as exemplified by magnets 28.

Noting that the first and second material constructions are respectively exemplified a first and second series of magnets as at magnets 22 and magnets 28, the reader will further note that the first and second series of magnets 22 and 28 are preferably structurally situated within the apertured panels 36 and 37 for enabling the user to reorient the cradle construction 14, 15, and 16 intermediate portrait and landscape orientations relative to the respective case constructions 17, 18, and 19.

Comparatively referencing FIGS. 7, 9, and 13, the reader will there note that embodiment 11 preferably comprises magnet arrangements characterized by magnet positions that may be described as a north position as at 110, a south position as at 111, an east position as at 112, a west position as at 113, a northeast position as at 114, a southeast position as at 115, a southwest position as at 116, a northwest position as at 117, and a central position as at 118. The mated magnetic engagement of the north position 110 magnets 22 and 28 thus enable the landscape orientation generally depicted in FIGS. 14 and 15, and the mated magnetic engagement of the north position 110 magnet 22 with the east position 112 magnet 28 enable the portrait orientation as generally depicted in FIGS. 16 and 17.

Comparatively referencing FIGS. 48, 49, 51, and 52, the reader will there note that embodiment 13 may preferably comprise magnet arrangements characterized by magnet positions that may be described a landscape position set 119 and a portrait position set 120. The mated magnetic engagement of the landscape position 119 set magnets 22 and 28 thus enable the landscape orientation generally depicted in FIGS. 51, 55, and 57, and the mated magnetic engagement of the portrait position set 120 magnets 22 and 28 enable the portrait orientation as generally depicted in FIGS. 52 and 56.

Alternatively, the first and second series of magnets 22 and 28 may be respectively spaced from one another within the posterior cradle-to-case interface portion 21 and the posterior case portion 26 respectively in an interface portion magnet arrangement as at 121 and a posterior case portion magnet arrangement as at 122, which interface portion magnet arrangement 121 and the posterior case portion magnet arrangement 122 are mirror images of one another when viewed in a side-by-side comparison view as generally depicted in FIG. 30 in connection with embodiment 12, although it is noted that embodiment 11 also demonstrates this attribute. The described magnet arrangements are believed to enhance magnetic attractive forces between the various cradle and case constructions.

Similarly, the second and third material constructions as exemplified by magnets 28 and magnets 29 may be preferably spaced from one another within the apertured panels 37 and 44 such that (a) the magnet arrangement in the distal posterior panel 45 and the distal most anterior panel or portion (e.g. portion 47) of the anterior case portion(s) 25 may be in a distal panel magnet arrangement as at 123. The distal panel magnet arrangements of the anterior and posterior case portions 25 and 26 are preferably mirror images of one another (about section 27) when viewed in a side-by-side comparison view as generally depicted in FIGS. 25, 26, 30, 34, 47A, 47B, 48, 51, and 52. The distal panel magnet arrangements at 123 enhance the magnetic attractive forces between the anterior and posterior case portions 25 and 26.

In the cradle-case combination or embodiment 11, the posterior cradle-to-case interface portion 21 may further be preferably defined by comprising a first circular formation as at 49, which first circular formation 49 preferably comprises a first formation diameter as at 67. The first formation diameter 67 is preferably centered relative to the cradle width 65 and cradle length 66. The distal posterior panel construction 45 preferably comprises a proximally-depending portion 57 having a second circular formation as at 50. The first and second circular formations 49 and 50 preferably comprise the first and second material constructions as exemplified by magnets 22 and 28, and are matable for enabling the first circular formation 49 to rotate relative to the second circular formation 50 about a cradle-to-case axis of rotation 150 for enabling the user to reorient the cradle construction 14 intermediate portrait and landscape orientations relative to the case construction 17.

The first circular formation 49 is preferably a projected male structure and the second circular formation 50 is preferably a depressed female structure. The posterior cradle-to-case interface portion 21 of the cradle-case combination 11 is thus insertable into the second circular formation 50 via the first circular formation 49 for enhancing the user's ability to manually reorient the cradle construction 14 intermediate portrait and landscape orientations relative to the case construction 17 as comparatively depicted in FIGS. 14 and 15 versus FIGS. 16 and 17.

In the cradle-case combination 11, the first and second material constructions are each preferably exemplified by a series of magnets as at magnets 22 and 28. Each series of magnets 22 and 28 in embodiment 11 preferably comprises a central circular magnet as at central position 118 magnets 22 and 28, and a series of spaced magnets as at position(s) 110-117 magnets 22 and 28. The series of spaced magnets 22 and 28 at positions 110-117 are preferably arranged in radial adjacency to the central circular magnet(s) 22 and 28 at central position 118. Each magnet in the series of spaced magnets in radial adjacency to the centrally positioned circular magnets 22 and 28 is rectangular and comprises a magnet length as at 124 and a magnet width as at 125, the magnet lengths 124 being greater than the magnet widths 125, and the magnet lengths each extend orthogonally relative to a radial distance 126 from the central circular magnets 22 and 28.

While the above descriptions contain much specificity, this specificity should not be construed as limitations on the scope of the invention, but rather as an exemplification of the invention. The basic invention may be said to essentially teach or disclose a cradle-case combination as at embodiments 11, 12, and 13 for encasing and selectively displaying an electronic device as at 10. The cradle-case combinations according to the present invention preferably and essentially comprise a cradle construction and a case construction as variously taught.

The cradle constructions 14, 15, and 16 are all sized and shaped to removably receive or cradle a select electronic device 10, and comprise an anterior device-receiving cradle portion as at 20, and a posterior cradle-to-case interface portion as at 21. The posterior cradle-to-case interface portion(s) all preferably comprise a first material construction as exemplified by cradle-based permanent magnets 22.

The case constructions 17, 18, and 19 all basically function to envelope the anterior device-receiving cradle portion 20 and posterior cradle-to-case interface portion 21 of the respective cradle constructions 14, 15, and 16 when in a closed case configuration and comprise a first outer case portion or layer as at 41, a second outer case portion or layer as at 43, an anterior case portion as at 25, a posterior case portion as at 26, and an anterior-to-posterior junction section as at 27. The anterior-to-posterior junction sections 27 enable the user to pivot the anterior case portion(s) 25 relative to the posterior case portion(s) 26, and the posterior case portion(s) 26 each preferably comprise a second material construction as exemplified by case-back-based permanent magnets 28.

The first and second material constructions are magnetically attractive for magnetically fastening the posterior cradle-to-case interface portion 21 of the respective cradle construction(s) 14, 15, and 16 to the posterior case portion 26 of the respective case construction(s) 17, 18, and 19. The anterior case portion(s) 25 are pivotal relative to the posterior case portion(s) 26 via the anterior-to-posterior junction section(s) 27 for selectively (a) enabling access to the anterior device-receiving cradle portion(s) 20 when in an open case configuration or (b) covering/enveloping the anterior device-receiving cradle portion(s) 20 when in a closed case configuration. The foregoing descriptions are believed to cover all three cradle-case combinations or embodiments 11, 12, and 13.

The cradle-case combinations depicted and referenced at embodiments 12 and 13 comprise anterior case portion(s) 25 having a third material construction exemplified by case-front-based permanent magnets 29. The third material construction according to the present invention is magnetically attractive to a select material construction as selected from the group consisting of the first and second material constructions of either the posterior cradle-to-case interface portion(s) 21 or the posterior case portion(s) 26. Thus, the third material construction of the anterior case portion(s) 25 enhances the user's ability to selectively fasten alternative portions of the cradle-case combinations 12 and 13.

The cradle-case combinations exemplified by embodiments 17 and 19, but also embracing embodiment 18, may preferably comprise anterior case portion(s) 25 having at least a two-panel construction, including at least a distal anterior panel as at 30 and a proximal anterior panel as at 31, the distal anterior panel 30 being pivotal relative to the proximal anterior panel 31. In the case of a three-panel construction, the three-panel construction may further a distal-to-proximal junction panel as at 32 intermediate the distal and proximal anterior panels 30 and 31.

A distal junction section 33 enables the distal anterior panel 30 to pivot relative to the distal-to-proximal junction panel 32, and a proximal junction section enables the distal-to-proximal junction panel 32 to pivot relative to the proximal anterior panel 31. The three-panel construction exemplified by case construction 19 enables the user to form a triangular anterior case portion as at 35. The triangular anterior case portion 35 enhances the user's ability to selectively display the anterior device-receiving cradle section 20.

The distal anterior panel 30 of the anterior case portion 25 (of case construction 19) preferably comprises the third material construction exemplified by magnets 29. The third material construction of the distal anterior panel is magnetically fastenable to the second material construction of the corresponding posterior case portion 26 for either maintaining the triangular anterior case portion 35 in fastened engagement to the posterior case portion 26 in the case of the three-panel type anterior case portion 25, or holding the anterior case portion 25 in parallel relation to the posterior case portion 26 in the case of the two-panel type anterior case portion 25.

The posterior cradle-to-case interface portion 21, the posterior case portion 26 and/or the anterior case portion 25 may preferably comprise an apertured panel as variously depicted and referenced at 36, 37 and 44 outfitted with apertures 38 for receiving and spatially situating the first, second and/or third material constructions as further exemplified by magnets 22, 28 and 29. A thin lamination material layer 39 may be applied to opposite faces of the panels for securing the magnetically attractive material constructions within the apertures 38 formed in the apertured panels 36, 37, or 44.

Preferably, the apertures 38 formed in the apertured panels 37 and 44 of at least the anterior and posterior case constructions 25 and 26 extend orthogonally through the entire plane of the panels 37 and 44. The second and/or third material constructions, being received in said apertures 38, thereby more effectively enable bidirectional or oppositely directed magnetic attractions via those panels 37/44. This feature particularly helps support the reversibility of the case constructions 18 and 19 relative to the cradle constructions 15 and 16.

In this last regard, it will be recalled that the first and second outer case portions or layers as at 41 and 43 are preferably reversible and comprise differing ornamental appearances as generically depicted at hatch markings 101 and 102. The horizontal hatch markings depicted and referenced at 101 are not meant to be limiting in terms of blue coloration and the vertical hatch markings 102 are not meant to be limiting in terms of red or pink coloration according to standardized drawing symbols accepted by the International Organization for Standardization (ISO) or under 37 C.F.R. 1.84(n). Rather, the symbols have been used for their simplicity and overall generic distinctiveness to depict two different types of ornamental appearances.

The differing ornamental appearances of the reversible first and second outer case portions or layers 41 and 43 enable the user to selectively display an outer case material, and the bidirectional magnetic attractions of the magnets 28 (or magnets 29) enable the user to magnetically fasten the posterior cradle-to-case interface portion(s) 21 of the cradle construction(s) 15 and 16 to either of two reversible sides portions or layers 41 or 43 of the posterior case portion(s) 26 (or anterior case portion(s) 25) of the case construction(s) 18 and 19.

It is contemplated that either the anterior case portion(s) 25 or the posterior case portion(s) 26 may preferably comprise at least a distal panel and a proximal panel with a pivotal junction therebetween. In this regard, the distal anterior and posterior panels 30 and 45 have been shown to be pivotal relative to the proximal anterior and posterior panels 31 and 46 about junction sections 51 and 48. Preferably, the distal panels 30 and/or 45, whether anterior or posterior, comprise the second material construction as exemplified by magnets 29 or 28.

The magnetically attractive first and second material constructions as exemplified by magnets 22 and 28, are structurally configured or situated for enabling the user to reorient the cradle construction(s) 14, 15, and 16 intermediate portrait and landscape orientations relative to the case construction(s) 17, 18, and 19. The first and second series of magnets 22 and 28 may be respectively spaced from one another within the posterior cradle-to-case interface portion(s) 21 and the posterior case portion(s) 26 in an interface portion magnet arrangement and a posterior case portion magnet arrangement, whereby the arrangements are mirror images of one another when viewed in a side-by-side comparison view. Such magnet arrangements enhance the magnetic attractive forces between the various cradle and case constructions.

Similarly, the second and third material constructions may respectively comprise a second and third series of magnets as at magnets 28 and 29 spaced from one another within the distal anterior and posterior panels 37 and 44 in distal panel magnet arrangements that are mirror images of one another when viewed in a side-by-side comparison view, which magnet arrangements enhance the magnetic attractive forces between the anterior and posterior case portions 25 and 26.

Peculiar to embodiment 11, the posterior cradle-to-case interface portion 21 may preferably comprises a male first circular formation as at 49, and the distal posterior panel construction 45 may preferably comprise a proximally-depending portion 57 having a female second circular formation as at 50. The male first and female second circular formations 49 and 50 incorporate or locate the first and second material constructions respectively exemplified by first and second series of magnets or magnet arrangements as at 22 and 28, and are matable for enabling the male first circular formation 49 to rotate relative to the female second circular formation 50 about a cradle-to-case axis of rotation 150 for enabling the user to reorient the cradle construction 14 intermediate portrait and landscape orientations relative to the case construction 17.

The male first circular formation 49 preferably comprises a first apertured panel 36, a series of first magnets 22 received in first apertures 38 formed in the first apertured panel 36, a first concealing material layer as at 40, and a cylindrical first edge as at 65. The first concealing material layer 40 conceals the first apertured panel 36 and the series of first magnets 22 such that a case-opposing surface 66 of the first concealing material layer 40 is substantially planar or smooth as variously depicted throughout the drawings submitted in support of these specifications.

The female second circular formation 50 preferably comprises a second apertured panel 37, a series of second magnets 28 received in second apertures 38 formed in the second apertured panel 37, a second concealing material layer as at 41, a cylindrical second edge as at 67, and a second formation diameter as at 59. The second concealing material layer 41 conceals the second apertured panel 37 and the series of second magnets 28 such that a cradle-opposing surface 68 of the second concealing material layer 41 is planar or smooth as further variously depicted.

It will thus be seen in summary that the case construction 17 of embodiment 11 selectively enables (a) cradle construction access and (b) cradle construction encasement and preferably comprises an inner case portion 41, an outer case portion 43, an anterior case portion 25, a posterior case portion 26, and an anterior-to-posterior junction section 27. The anterior-to-posterior junction section 27 enables the user to pivot the anterior case portion 25 relative to the posterior case portion 26. The posterior case portion 26 preferably comprises a distal posterior panel construction 45, a proximal posterior panel portion 46, a posterior junction section 48, and a posterior portion width as at 58.

The distal posterior panel construction 45 of the case construction 17 is pivotal relative to the proximal posterior panel 46 about the posterior junction section 48. Notably, the distal posterior panel construction 45 of the case construction 17 preferably comprises a proximally-depending portion 57 and the female second circular formation as at 50. The female second circular formation 50 preferably comprises a second magnet arrangement as at magnets 28 and a second formation diameter as at 59.

Figure 4:
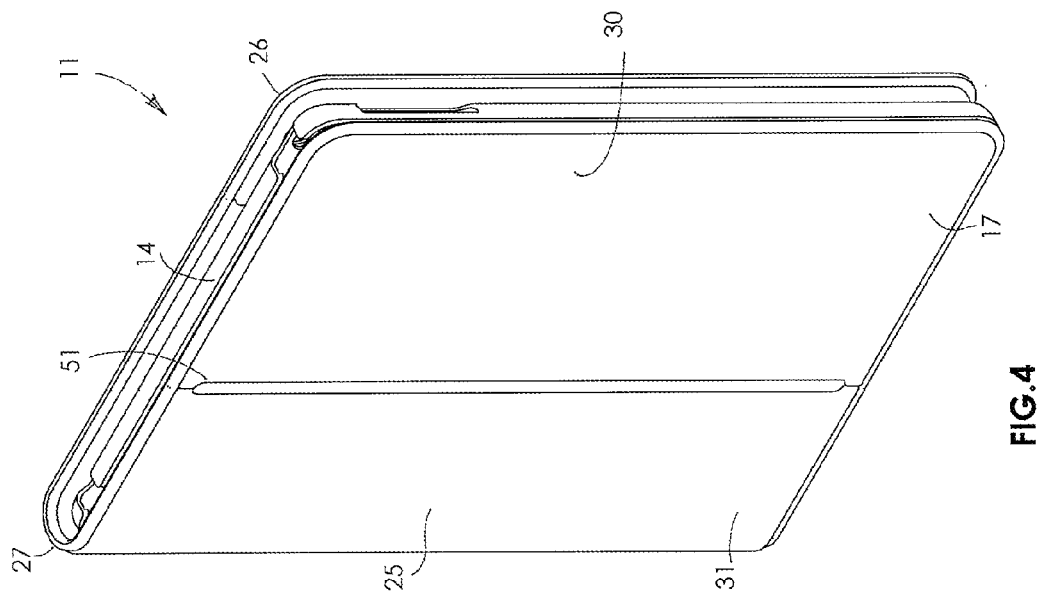
FIG. 4 is an anterior perspective view of the first alternative cradle-case combination or assembly according to the present invention in a case-closed configuration.
Figure 3:
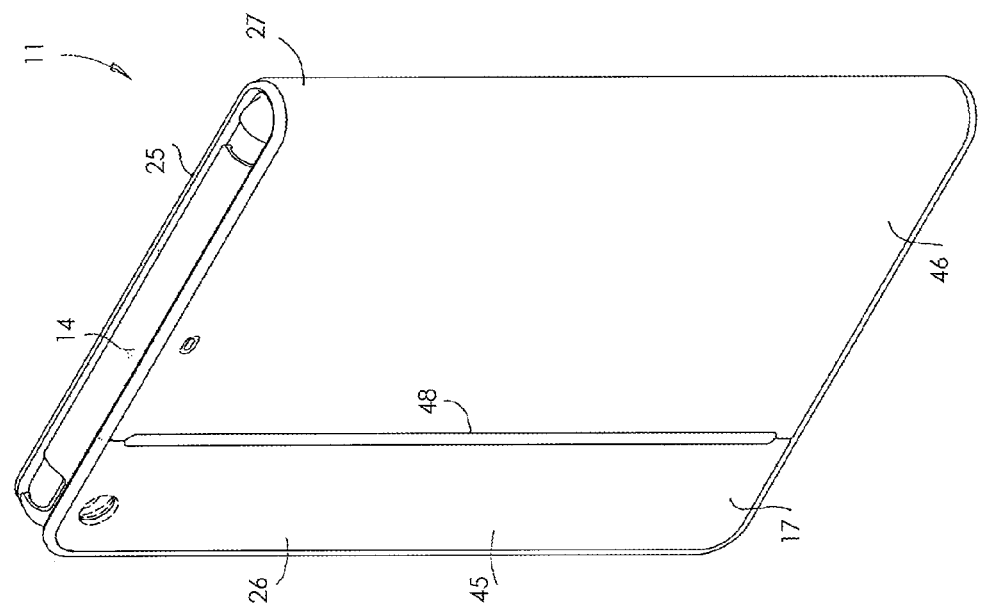
FIG. 3 is a posterior perspective view of the first alternative cradle-case combination or assembly according to the present invention in a case-closed configuration.
Figure 6:
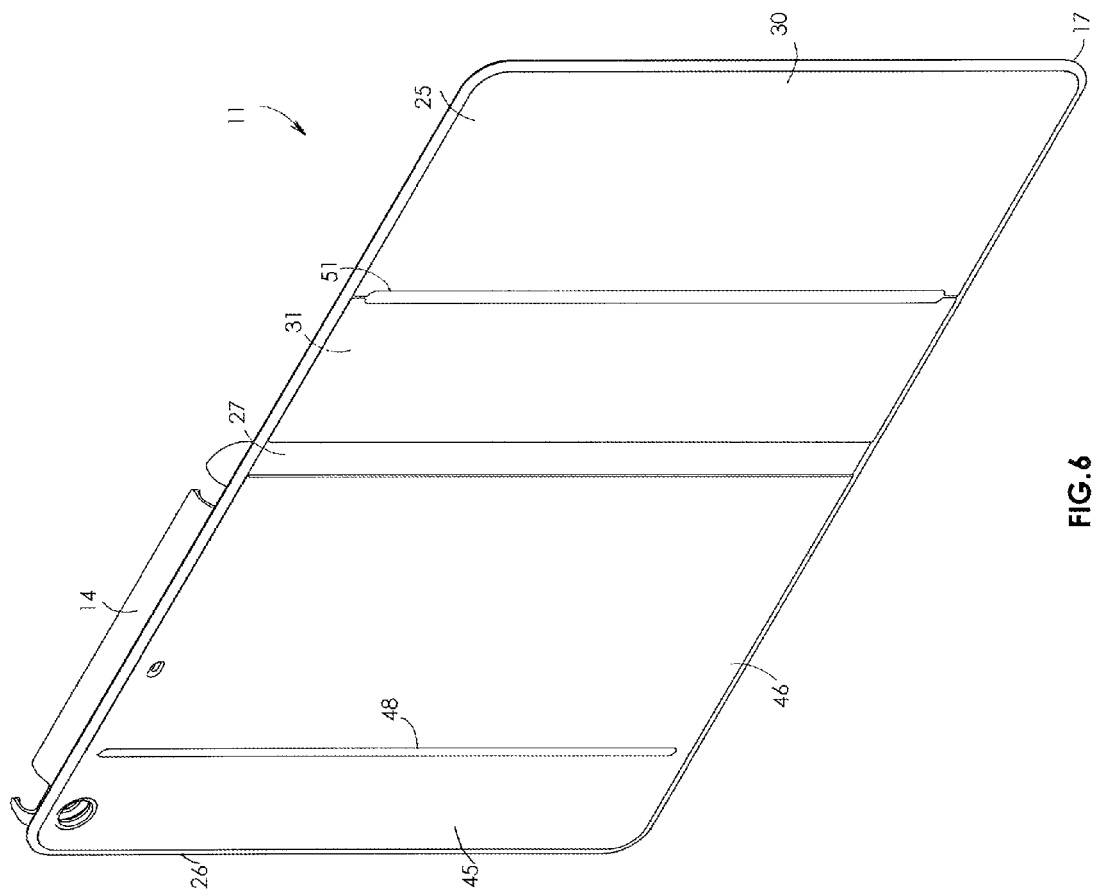
FIG. 6 is a posterior perspective view of the first alternative cradle-case combination or assembly according to the present invention in a case-open configuration.
Figure 7B:
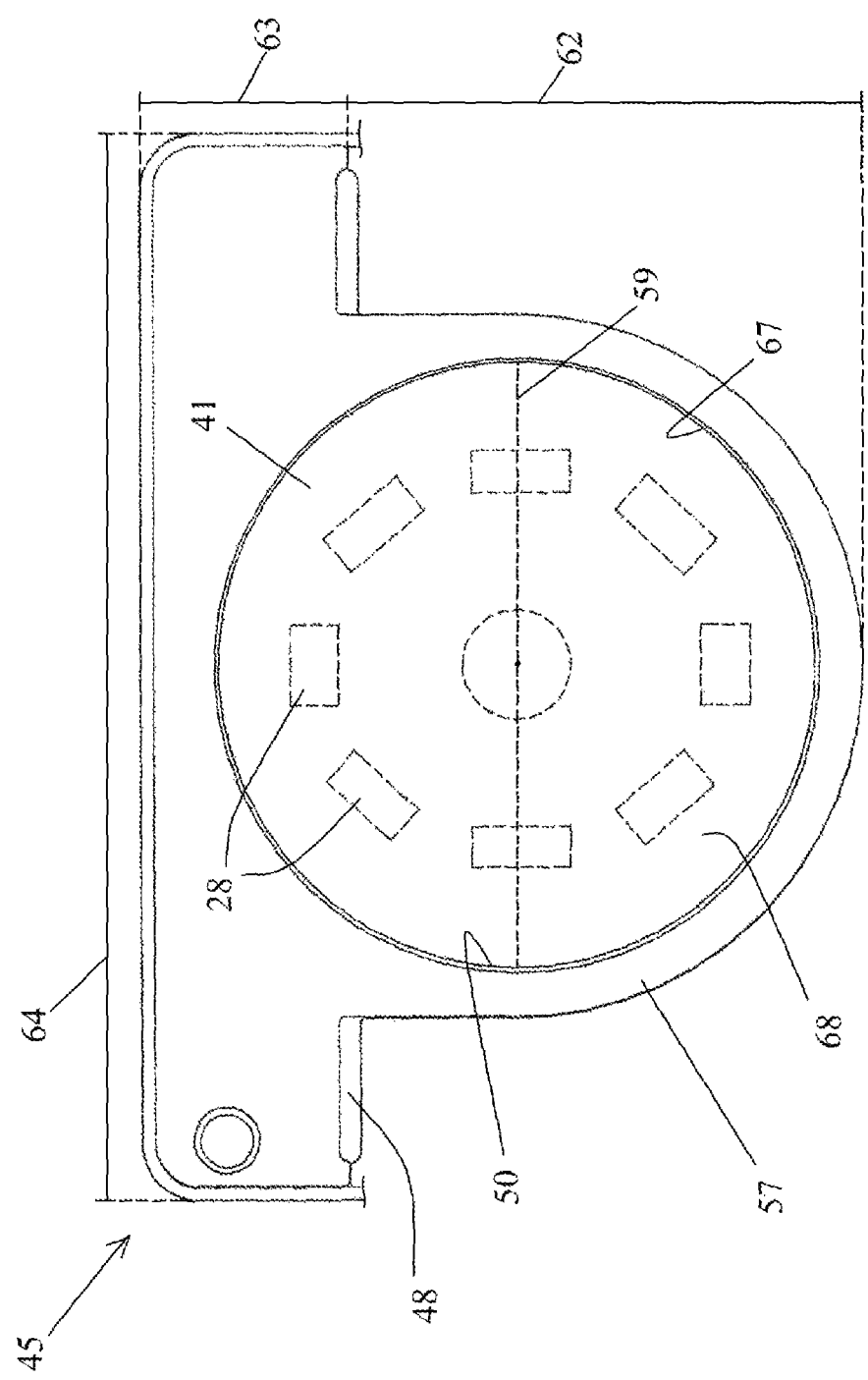
FIG. 7B is an enlarged anterior view of a distal posterior panel construction of the first alternative cradle-case combination or assembly according to the present invention, shown broken away from the case construction otherwise depicted in FIG. 7 for greater illustrative clarity.
Figure 11:
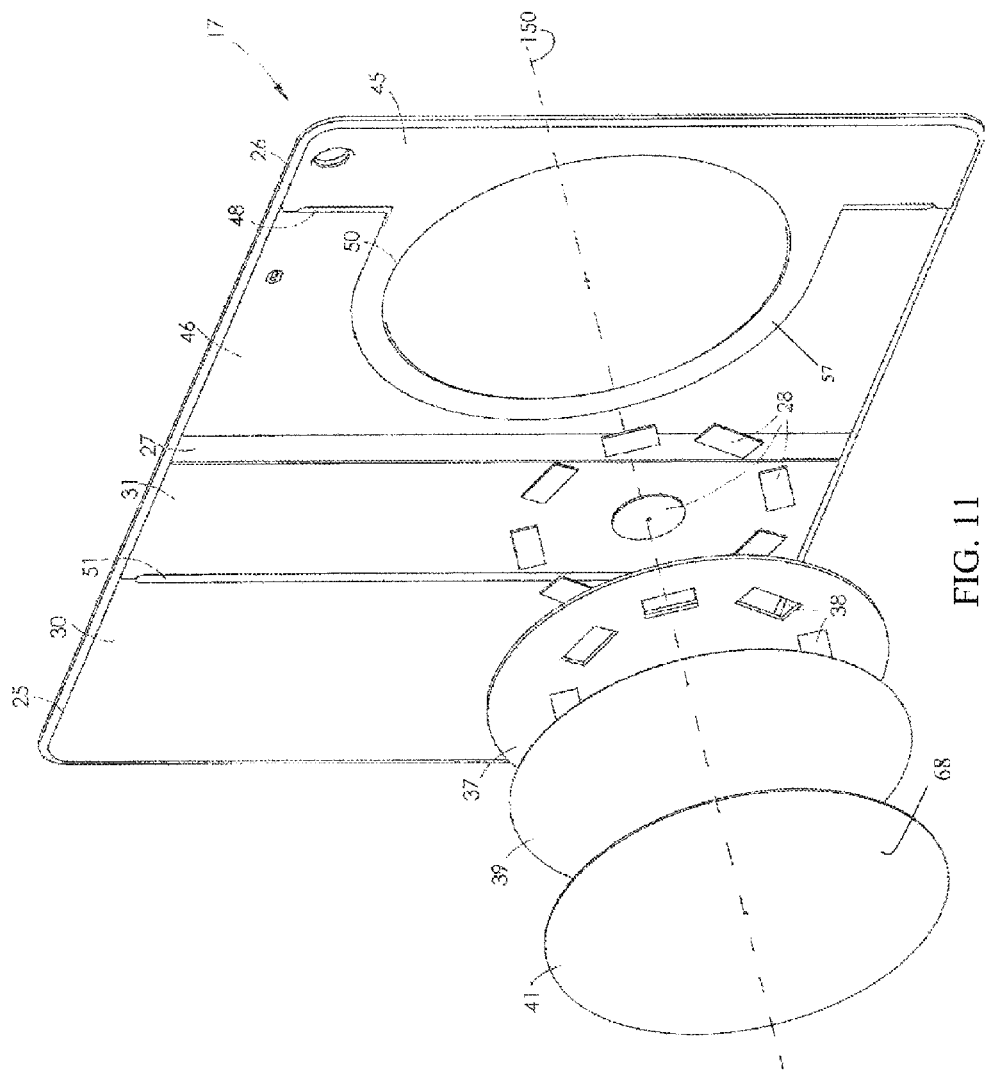
FIG. 11 is an exploded anterior perspective view of the case construction of the first alternative cradle-case combination or assembly according to the present invention showing from front to back a top or outer material layer, a lamination material layer, an apertured panel, a series of magnets, and a female circular formation of a distal posterior panel of the case construction.

Comparatively referencing FIGS. 7 and 7B, it will be seen that the second formation diameter 59 overlies the posterior junction section 48 in a distal-to-proximal or portion-panel-width direction or dimension. The second formation diameter 59 is preferably lesser in magnitude than the posterior portion width 58 such that when the distal posterior panel construction 45 is pivoted relative to the proximal posterior panel portion 46 about the posterior junction section 48, the proximally-depending portion 57 extends obliquely relative to the proximal panel portion 46 when in an open case configuration as perhaps most clearly depicted in FIG. 17 at oblique angle 151.

As indicated, the male first and female second circular formations 49 and 50 are matable and enable rotation of the male first circular formation 49 relative to the female second circular formation 50 about a cradle-to-case axis of rotation 150 for enabling the user to reorient the cradle construction 14 intermediate portrait and landscape orientations relative to the case construction 17 when in the open case configuration.

The first and second series of magnets or magnet arrangements as at 22 and 28 respectively are preferably magnetically attractive for magnetically fastening the posterior cradle-to-case interface portion to the posterior case portion 26. The cylindrical second edge 67 supports the cylindrical first edge 65, and the case-opposing and cradle-opposing surfaces 66 and 68 are planar or smooth for enhancing smooth surface-to-surface rotation relative to one another. The anterior case portion 25 is pivotal relative to the posterior case portion 26 via the anterior-to-posterior junction section for selectively enabling the open case configuration for accessing the anterior device-receiving cradle portion and enabling the closed case configuration for covering the anterior device-receiving cradle portion.

It will be further noted that the case construction 17 comprises a number of other preferred incidental features. In this regard, it will be noted that the proximal posterior panel portion 46 may preferably comprise a portion-receiving section as depicted and referenced at 60 in FIGS. 16 and 18. The portion-receiving section 60 is shaped for receiving the proximally-depending portion 57 when in the closed case configuration. Further, the second formation diameter 59 is preferably centered relative to the posterior portion width 58 as generally depicted in FIG. 7. In this regard, the second formation diameter overlies the posterior junction section 48.

Comparatively referencing FIGS. 7 and 7B, it will be seen that the posterior panel portion 26 preferably comprises a posterior portion length 61 and that the distal panel construction 45 is preferably T-shaped such that the proximally-depending portion 57 forms an upright section 62 of the T-shaped distal posterior panel construction 45 and a distal most panel portion forms a crossbar section 63 of the T-shaped distal posterior panel construction 45. The crossbar section 63 comprises a crossbar section length 64 equal to the posterior portion length 61.

Accordingly, although the inventive cradle-case assembly or combination according to the present invention has been described by reference to a number of embodiments as illustrated and described embodiments 11, 12, and 13, it is intended that the preferred novel combination or assembly reflected in embodiment 11 be made the primary focus of these specifications with certain modifications thereof falling within the broad scope and spirit of the foregoing disclosure, the appended drawings, and perhaps most importantly, the following claims.

I claim:

1. A cradle-case combination for an electronic device, the cradle-case combination comprising:
    a cradle construction, the cradle construction being sized and shaped to removably cradle an electronic device, the cradle construction comprising an anterior device-receiving cradle portion and a posterior cradle-to-case interface portion, the posterior cradle-to-case interface portion comprising a male first circular formation, the male first circular formation comprising a first apertured panel, a series of first magnets received in first apertures formed in the first apertured panel, a first concealing material layer, and a cylindrical first edge, the first concealing material layer concealing the first apertured panel and the series of first magnets such that a case-opposing surface of the first concealing material layer is planar;
    a case construction, the case construction for selectively enabling (a) cradle construction access and (b) cradle construction encasement and comprising an inner case portion, an outer case portion, an anterior case portion, a posterior case portion, and an anterior-to-posterior junction section, the anterior-to-posterior junction section enabling the user to pivot the anterior case portion relative to the posterior case portion, the posterior case portion comprising a distal posterior panel construction, a proximal posterior panel, a posterior junction section, and a posterior portion width, the distal posterior panel construction being pivotal relative to the proximal posterior panel about the posterior junction section, the distal posterior panel construction comprising a proximally-depending portion and a female second circular formation, the female second circular formation comprising a second apertured panel, a series of second magnets received in second apertures formed in the second apertured panel, a second concealing material layer, a cylindrical second edge, and a second formation diameter, the second concealing material layer concealing the second apertured panel and the series of second magnets such that a cradle-opposing surface of the second concealing material layer is planar, the second formation diameter overlying the posterior junction section, the second formation diameter being less than the posterior portion width such that when the distal posterior panel construction is pivoted relative to the proximal posterior panel about the posterior junction section the proximally-depending portion extends obliquely relative to the proximal panel portion;

the male first and the female second circular formations being matable and enabling rotation of the male first circular formation relative to the female second circular formation about a cradle-to-case axis of rotation for enabling the user to reorient the cradle construction intermediate portrait and landscape orientations relative to the case construction when in an open case configuration, the first and second series of magnets being magnetically attractive for magnetically fastening the posterior cradle-to-case interface portion to the posterior case portion, the cylindrical second edge for supporting the cylindrical first edge, the planar case-opposing and cradle-opposing surfaces for enhancing smooth rotation relative to one another, the anterior case portion being pivotal relative to the posterior case portion via the anterior-to-posterior junction section for selectively enabling the open case configuration for accessing the anterior device-receiving cradle portion and enabling a closed case configuration for covering the anterior device-receiving cradle portion.

2. The cradle-case combination of claim 1 wherein the proximal panel portion comprises a portion-receiving section, the portion-receiving section being shaped for receiving the proximally-depending portion when in the closed case configuration.

3. The cradle-case combination of claim 1 wherein the second formation diameter is centered relative to the posterior portion width.

4. The cradle-case combination of claim 3 wherein the posterior panel portion comprises a posterior portion length and the distal posterior panel construction is T-shaped, the proximally-depending portion forming an upright section of the T-shaped distal posterior panel construction and a distal most portion forming a crossbar section of the T-shaped distal posterior panel construction.

5. The cradle-case combination of claim 4 wherein the crossbar section comprises a crossbar section length equal to the posterior portion length.

6. The cradle-case combination of claim 3 wherein the cradle construction comprises a cradle width and a cradle length, the first circular formation comprising a first formation diameter, the first formation diameter being centered relative to the cradle width and cradle length.

7. The cradle-case combination of claim 1 wherein the cradle-to-case axis of rotation extends through the proximal panel portion.

8. A cradle-case combination for an electronic device, the cradle-case combination comprising:

a cradle construction, the cradle construction being sized and shaped to removably cradle an electronic device, the cradle construction comprising an anterior device-receiving cradle portion and a posterior cradle-to-case interface portion, the posterior cradle-to-case interface portion comprising a male first circular formation, the male first circular formation comprising a series of first magnets, a first concealing material layer, and a cylindrical first edge, the first concealing material layer concealing the series of first magnets such that a case-opposing surface of the first concealing material layer is planar; and a case construction, the case construction comprising an inner case portion, an outer case portion, an anterior case portion, a posterior case portion, and an anterior-to-posterior junction section, the anterior-to-posterior junction section enabling the user to pivot the anterior case portion relative to the posterior case portion, the posterior case portion comprising a distal posterior panel construction, a proximal posterior panel, a posterior junction section, and a posterior portion width, the distal posterior panel construction being pivotal relative to the proximal posterior panel about the posterior junction section, the distal posterior panel construction comprising a proximally-depending portion and a female second circular formation, the female second circular formation comprising a series of second magnets, a second concealing material layer, a cylindrical second edge, and a second formation diameter, the second concealing material layer concealing the series of second magnets such that a cradle-opposing surface of the second concealing material layer is planar, the second formation diameter overlying the posterior junction section and being less than the posterior portion width, the proximally-depending portion extending obliquely relative to the proximal panel portion when pivoted into an open case configuration;

the male first circular formation being rotatable relative to the female second circular formation for enabling rotation of the cradle construction relative to the proximally-depending portion about a cradle-to-case axis of rotation for enabling the user to reorient the cradle construction intermediate portrait and landscape orientations relative to the proximally-depending portion when in the open case configuration, the first and second series of magnets being magnetically attractive for magnetically fastening the posterior cradle-to-case interface portion to the posterior case portion, the cylindrical second edge for supporting the cylindrical first edge, the planar case-opposing and cradle-opposing surfaces for enhancing smooth rotation relative to one another, the anterior case portion being pivotal relative to the posterior case portion via the anterior-to-posterior junction section for selectively enabling both the open case configuration and a closed case configuration.

9. The cradle-case combination of claim 8 wherein the male first circular formation is removably matable with the female second circular formation for enhancing the user's ability to manually reorient the cradle construction intermediate portrait and landscape orientations relative to the proximally-depending portion.

10. The cradle-case combination of claim 8 wherein the proximal panel portion comprises a portion-receiving section, the portion-receiving section being shaped for receiving the proximally-depending portion when in the closed case configuration.

11. The cradle-case combination of claim 8 wherein the second formation diameter is centered relative to the posterior portion width.

12. The cradle-case combination of claim 11 wherein the posterior panel portion comprises a posterior portion length and the distal posterior panel construction is T-shaped, the proximally-depending portion forming an upright section of the T-shaped distal posterior panel construction and a distal most portion forming a crossbar section of the T-shaped distal posterior panel construction.

13. The cradle-case combination of claim 12 wherein the crossbar section comprises a crossbar section length equal to the posterior portion length.

14. The cradle-case combination of claim 8 wherein the cradle construction comprises a cradle width and a cradle length, the first circular formation comprising a first formation diameter, the first formation diameter being centered relative to the cradle width and cradle length.

15. The cradle-case combination of claim 8 wherein the cradle-to-case axis of rotation extends through the proximal panel portion.

16. A cradle-case combination for an electronic device, the cradle-case combination comprising:
  a device-holding mechanism, the device-holding mechanism comprising a posterior case interface portion, the posterior case interface portion comprising a male first circular formation, the male first circular formation comprising a first magnet arrangement, a first concealing material layer, and a cylindrical first edge, the first concealing material layer concealing the first magnet arrangement such that a case-opposing surface of the first concealing material layer is planar; and
  a case assembly, the case assembly comprising an inner case portion, an outer case portion, an anterior case portion, a posterior case portion, and an anterior-to-posterior junction section, the anterior-to-posterior junction section enabling the user to pivot the anterior case portion relative to the posterior case portion, the posterior case portion comprising a distal posterior panel construction, a proximal posterior panel, a posterior junction section, and a posterior portion width, the distal posterior panel construction being pivotal relative to the proximal posterior panel about the posterior junction section and comprising a proximally-depending portion and a female second circular formation, the female second circular formation comprising a second magnet arrangement, a second concealing material layer, a cylindrical second edge, and a second formation diameter, the second concealing material layer concealing the second magnet arrangement such that a cradle-opposing surface of the second concealing material layer is planar, the second formation diameter overlying the posterior junction section and being less than the posterior portion width;
  the male first circular formation being rotatable relative to the female second circular formation for enabling rotation of the device-holding mechanism relative to the proximally-depending portion for enabling the user to reorient the device-holding mechanism relative to the proximally-depending portion, the first and second magnet arrangements being magnetically attractive for magnetically fastening the posterior cradle-to-case interface portion to the posterior case portion, the cylindrical second edge for supporting the cylindrical first edge, the planar case-opposing and cradle-opposing surfaces for enhancing smooth rotation relative to one another, the anterior case portion being pivotal relative to the posterior case portion via the anterior-to-posterior junction section for selectively enabling both open and closed case configurations.

17. The cradle-case combination of claim 16 wherein the male first circular formation is removably matable with the female second circular formation for enhancing the user's ability to manually reorient the device-holding mechanism relative to the proximally-depending portion.

* * * * *